(12) United States Patent
Shimizume et al.

(10) Patent No.: US 8,458,542 B2
(45) Date of Patent: Jun. 4, 2013

(54) ANALOG SCAN CIRCUIT, ANALOG FLIP-FLOP, AND DATA PROCESSING APPARATUS

(75) Inventors: Kazutoshi Shimizume, Tokyo (JP); Ikuro Hata, Tokyo (JP); Akira Ishizuka, Tokyo (JP)

(73) Assignee: Sony Corporation, Tokyo (JP)

( * ) Notice: Subject to any disclaimer, the term of this patent is extended or adjusted under 35 U.S.C. 154(b) by 250 days.

(21) Appl. No.: 12/808,074

(22) PCT Filed: Dec. 11, 2008

(86) PCT No.: PCT/JP2008/072475
§ 371 (c)(1),
(2), (4) Date: Jun. 14, 2010

(87) PCT Pub. No.: WO2009/081743
PCT Pub. Date: Jul. 2, 2009

(65) Prior Publication Data
US 2010/0289549 A1 Nov. 18, 2010

(30) Foreign Application Priority Data

Dec. 21, 2007 (JP) ................................. 2007-330562
Oct. 14, 2008 (JP) ................................. 2008-265623

(51) Int. Cl.
*G01R 31/28* (2006.01)
(52) U.S. Cl.
USPC ......................................... 714/731; 702/117
(58) Field of Classification Search
USPC .......................................... 714/731; 702/117
See application file for complete search history.

(56) References Cited

U.S. PATENT DOCUMENTS

| 4,058,717 A | * | 11/1977 | Engeler .......................... 708/818 |
| 5,623,300 A | | 4/1997 | Itoh et al. |
| 5,872,908 A | * | 2/1999 | Whetsel .......................... 714/30 |

(Continued)

FOREIGN PATENT DOCUMENTS

| EP | 0 657 815 | 6/1995 |
| JP | 61-92078 | 5/1986 |

(Continued)

OTHER PUBLICATIONS

Office Action issued May 29, 2012, in Japanese Patent Application No. 2007-330562.

(Continued)

*Primary Examiner* — Esaw Abraham
(74) *Attorney, Agent, or Firm* — Oblon, Spivak, McClelland, Maier & Neustadt, L.L.P.

(57) ABSTRACT

Observability and controllability in a test of an analog LSI are increased. Analog signals input from input terminals IN1 to IN3 are supplied to diffusion layer regions 221, 223 and 225 via transistors 301 to 303, and are accumulated as electric charge. A clock signal is applied to signal lines 121 and 122 alternately connected to gate electrodes 211 to 216, thus allowing the accumulated electric charge to be transferred to the right direction. Electric charge/voltage conversion amplifiers 411 to 413 are connected to the diffusion layer regions 221, 223 and 225, and the accumulated electric charge is converted into voltage and is output to output terminals VOUT1 to VOUT3 as analog signals. A scan-in terminal Sin is connected to a diffusion layer region 220, and a scan-out terminal Sout is connected to the diffusion layer region 225 via an electric charge/voltage conversion amplifier 401.

21 Claims, 38 Drawing Sheets

U.S. PATENT DOCUMENTS

| | | | |
|---|---|---|---|
| 5,974,578 A * | 10/1999 | Mizokawa et al. | 714/727 |
| 6,687,868 B1 | 2/2004 | Yasuo et al. | |
| 6,988,232 B2 * | 1/2006 | Ricchetti et al. | 714/736 |
| 7,096,386 B2 * | 8/2006 | Ozawa | 714/30 |
| 7,159,159 B2 * | 1/2007 | Sunter | 714/724 |
| 7,185,244 B2 * | 2/2007 | Kojima et al. | 714/718 |
| 7,574,637 B2 * | 8/2009 | Ricchetti et al. | 714/724 |

FOREIGN PATENT DOCUMENTS

| | | |
|---|---|---|
| JP | 61 92078 | 5/1986 |
| JP | 5 307367 | 11/1993 |
| JP | 6-61471 A | 3/1994 |
| JP | 10 104321 | 4/1998 |
| TW | 413 981 | 12/2000 |

OTHER PUBLICATIONS

Office Action issued Jul. 31, 2012, in Japanese Patent Application No. 2007-330562.

Extended European Search Report dated Mar. 21, 2013 in corresponding European application No. 09820553.7.

Extended European Search Report dated Mar. 20, 2013 in corresponding European application No. 08864980.1.

Control and Observation of Analog Nodes in Mixed-Signal Boards, MATOS, et al., International Test Conference, 1993, IEEE, Paper 15.3, pp. 323-331.

\* cited by examiner

FIG. 34
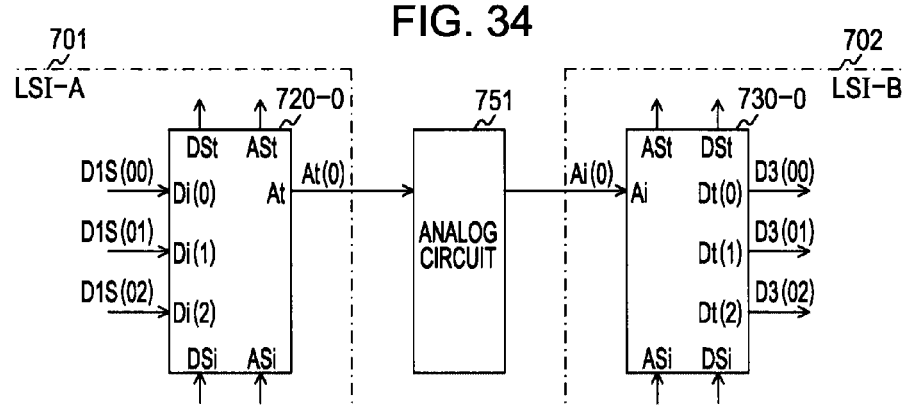
(a)
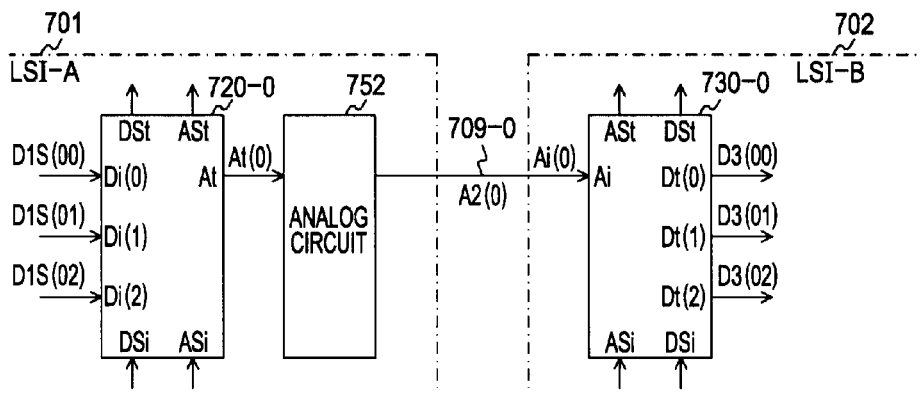
(b)
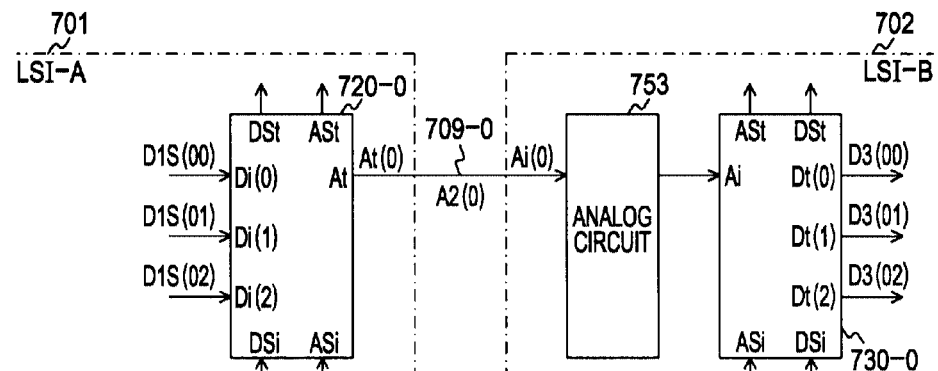
(c)

ANALOG SCAN CIRCUIT, ANALOG FLIP-FLOP, AND DATA PROCESSING APPARATUS

TECHNICAL FIELD

The present invention relates to a data processing apparatus. More specifically, the present invention relates to an analog scan circuit that holds an instantaneous value of analog data in the circuit as an analog value or supplies a held analog value as analog data in the circuit, and an analog flip-flop that performs synchronization of analog data.

BACKGROUND ART

Significant technological innovation in methods of testing current digital LSIs has been made, and the capability to automatically generate test circuits for testing the chips thereof or test patterns, which are sequences of signals for performing testing, has been achieved. That is, digital LSIs are configured to handle processing of binary signals of "0"s and "1"s, and automation has been carried out using techniques such as scan path testing since digital LSIs are easier to test than analog LSIs and it is possible to simplify fault models by limiting the testing to single stuck-at faults.

Here, the term scan path testing is a technique including providing a path (scan path) in which flip-flops are serially connected and causing the flip-flops to hold arbitrary values through this scan path or reading values held in the flip-flops through the scan path to examine the state of the circuit. In this scan path testing, all the flip-flops that are usually used are connected in series in a test mode so that arbitrary data can be set in all the flip-flops from outside (improvement in controllability). Then, next, the mode is switched to a normal mode, in which the data of the flip-flops, which has been set from outside, is added to internal combinational gates of the LSI, and thereafter one clock is added, thus allowing the outputs of these gates to be captured by the same flip-flop. Finally, the scan-out operation is performed in the test mode again (improvement in observability), and a signal of an internal gate is output to outside the LSI so that it is determined whether the gate output is normal or not. This operation is repeated until the desired fault coverage is achieved. In this manner, examples in which scan path testing is used for the testing of digital LSIs are widely known (see, for example, Japanese Patent No. 2550521 (FIG. 5)).

In contrast to this, since analog LSIs handle consecutive analog values, the complexity of processing increases. Even at the present time, sufficient failure detection algorithms are not available, and automation is delayed. In analog signal processing, in general, no flip-flops are used, and an alternating current or direct current analog signal is added to an LSI. For example, amplifiers, filters, and the like can be comparatively easily controlled by directly adding signals of various levels or frequencies to the LSI. That is, in many of circuits in analog LSIs, the potentials of nodes etc., are unambiguously determined and, in many cases, controllability is high. On the other hand, for example, if it is envisaged that a filter exists inside the LSI, since a desired signal is comparatively easily added to the input of the filter in the manner described above, the output thereof is input to the subsequent signal processing circuit. In this case, it is necessary to provide a special built-in test circuit to observe the output of the filter. That is, it is general that analog LSIs have low observability.

Accordingly, it is useful in terms of improving observability to understand internal signals or potentials in analog LSIs. In addition, it is useful for test efficiency to further increase controllability.

The present invention has been made in view of such a situation, and an object thereof is to increase observability and controllability in a test of an analog LSI and further to achieve overall synchronization.

DISCLOSURE OF INVENTION

The present invention has been made in order to solve the above problems, and a first aspect thereof provides an analog scan circuit characterized by including a plurality of analog value holding means each for holding an analog value; input means for inputting the analog values so as to cause at least one of the plurality of analog value holding means to hold the analog value; transfer means for transferring the analog values held in the plurality of analog value holding means between the plurality of analog value holding means; and output means for reading and outputting at least one of the analog values held in the plurality of analog value holding means. Thus, the effect of inputting an analog signal from an analog circuit or the like or causing the analog signal to be output to the analog circuit or the like is provided.

In addition, in this first aspect, the transfer means may perform the transfer in accordance with a shift synchronization signal. For example, a two-phase clock signal can be used as a shift synchronization signal.

In addition, in this first aspect, the input means may cause at least one of the plurality of analog value holding means to hold the analog value in accordance with the shift synchronization signal. For example, an analog signal from an LSI tester can be held via a scan-in terminal.

In addition, in this first aspect, the output means may read the analog values from the plurality of analog value holding means in accordance with the shift synchronization signal. For example, an analog signal can be output to an LSI tester via a scan-out terminal.

In addition, in this first aspect, the input means may cause a plurality of analog values to be simultaneously held in corresponding analog value holding means among the plurality of analog value holding means in accordance with a common input control signal. For example, an analog signal from an analog circuit or the like can be held via an input terminal in time with a load clock signal.

In addition, in this first aspect, the input means may cause a plurality of analog values to be held in corresponding analog value holding means among the plurality of analog value holding means in accordance with individual input control signals each corresponding to one of the plurality of analog values. For example, an analog signal from an analog circuit or the like can be held via an input terminal in time with an individual load control signal.

In addition, in this first aspect, the output means may simultaneously read the analog values from the plurality of analog value holding means in accordance with a common output control signal. For example, an analog signal can be output to an analog circuit or the like via an output terminal in time with a write clock signal.

In addition, in this first aspect, the output means may read, in accordance with individual output control signals each corresponding to one of a plurality of analog values, the analog values from the plurality of analog value holding means. For example, an analog signal can be output to an analog circuit or the like via an output terminal in time with an individual write control signal.

In addition, in this first aspect, the plurality of analog value holding means may hold the analog values by accumulating electric charge in a diffusion layer region formed on a semiconductor substrate. For example, a BBD (Bucket Bridge Device) can be used as an electric charge transfer element.

In addition, in this first aspect, the plurality of analog value holding means may hold the analog values by accumulating electric charge in a depletion layer region generated on a semiconductor substrate. For example, a CCD (Charge Coupled Device) can be used as an electric charge transfer element.

In addition, a second aspect of the present invention provides a data processing apparatus characterized by including an output circuit that outputs analog data, and an analog scan circuit that receives the analog data, the analog scan circuit including a plurality of analog value holding means each for holding an analog value; input means for inputting an instantaneous value of the analog data so as to cause at least one of the plurality of analog value holding means to hold the instantaneous value as the analog value; transfer means for transferring the analog values held in the plurality of analog value holding means between the plurality of analog value holding means; and output means for reading and outputting at least one of the analog values held in the plurality of analog value holding means. Thus, the effect of capturing an analog signal from an output circuit so that the analog signal can be brought into an observable state is provided.

In addition, a third aspect of the present invention provides a data processing apparatus characterized by including an analog scan circuit that supplies analog data, and an input circuit that receives and inputs the analog data, the analog scan circuit including a plurality of analog value holding means each for holding an analog value; input means for inputting the analog values so as to cause at least one of the plurality of analog value holding means to hold the analog value; transfer means for transferring the analog values held in the plurality of analog value holding means between the plurality of analog value holding means; and output means for reading at least one of the analog values held in the plurality of analog value holding means, and outputting the read at least one of the analog values as the analog data. Thus, the effect of setting an arbitrary analog value in an input circuit so as to control the analog value is provided.

In addition, a fourth aspect of the present invention provides a data processing apparatus characterized by including an output circuit that outputs first analog data, an analog scan circuit that receives the first analog data and that supplies second analog data, and an input circuit that receives and inputs the second analog data, the analog scan circuit including a plurality of analog value holding means each for holding an analog value; input means for inputting an instantaneous value of the first analog data so as to cause at least one of the plurality of analog value holding means to hold the instantaneous value as the analog value; transfer means for transferring the analog values held in the plurality of analog value holding means between the plurality of analog value holding means; and output means for reading at least one of the analog values held in the plurality of analog value holding means, and outputting the read at least one of the analog values as the second analog data. Thus, the effect of capturing an analog signal from an output circuit so that the analog signal can be brought into an observable state and setting this analog signal in an input circuit is provided.

In addition, a fifth aspect of the present invention provides an analog flip-flop including input analog value holding means for holding an input analog value; and output analog value holding means for transferring the input analog value held in the input analog value holding means on the basis of a transfer trigger signal, and holding the input analog value as an output analog value. Thus, the timings of holding output analog values in individual analog flip-flops are synchronized by controlling a transfer trigger signal.

In addition, in this fifth aspect, the input analog value may indicate a value among m values (where m is an integer of n or more) including n discrete values (where n is an integer of 3 or more). Thus, within a range of the accuracy that makes it possible to recognize m discrete values, deformation of a waveform as analog data, addition of noise, etc., are permitted, and shaping of the waveform, reproduction, etc., are permitted.

In addition, in this fifth aspect, the input analog value holding means may include input means for inputting the input analog value on the basis of an input trigger signal. Thus, like a master-slave type digital flip-flop, control is caused by two trigger signals (for example, positive and negative trigger signals or the like of the same signal).

In addition, in this fifth aspect, the input means may include first input means for inputting a first analog value as the input analog value on the basis of a first trigger signal, and second input means for inputting a second analog value as the input analog value on the basis of a second trigger signal. Thus, an input analog value is selectively input and held on the basis of the control of the application of an input trigger signal.

In addition, in this fifth aspect, one of the first and second trigger signals may be an input trigger signal for instructing a scan operation. Thus, output analog values of adjacent analog flip-flops are connected as corresponding (first or second) input analog values, thus allowing an implementation of a flip-flop having a scan function capable of normal input using the other input trigger signal.

In addition, in this fifth aspect, the analog flip-flop may further include output means for outputting the output analog value held in the output analog value holding means on the basis of an output trigger signal. Thus, the output timing is controlled on the basis of the control of an output trigger signal.

In addition, in this fifth aspect, at least one of the input analog value holding means and the output analog value holding means may hold an analog value by accumulating electric charge in a diffusion layer region formed on a semiconductor substrate. For example, a BBD (Bucket Brigade Device/Bucket Bridge Device) can be used as an electric charge transfer element.

In addition, in this fifth aspect, at least one of the input analog value holding means and the output analog value holding means may hold an analog value by accumulating electric charge in a depletion layer region generated on a semiconductor substrate. For example, a CCD (Charge Coupled Device) can be used as an electric charge transfer element.

In addition, a sixth aspect of the present invention provide a data processing apparatus including a plurality of analog flip-flops each capable of receiving, holding, and outputting arbitrary analog data indicating an arbitrary analog value, and control means for controlling an operation timing of the plurality of analog flip-flops, each of the plurality of analog flip-flops including input analog value holding means for holding an input analog value, and output analog value holding means for receiving the input analog value held by the input analog value holding means on the basis of a transfer trigger signal, and holding the input analog value as an output analog value, the control means including transfer trigger signal supply means for supplying the same transfer trigger signal to the plurality of analog flip-flops. Thus, a transfer trigger signal is controlled, thereby allowing the timings of holding output analog values in a plurality of individual analog flip-flops to be synchronized.

According to the present invention, the superior advantages that it is possible to increase observability and controllability in a test of an analog LSI and further to achieve overall synchronization can be achieved. Note that in the present invention, it is assumed that an analog LSI is configured to include a digital/analog mixed LSI in which an analog circuit and a digital circuit are mixed.

BRIEF DESCRIPTION OF DRAWINGS

FIG. 34 is a diagram illustrating example modifications of inter-LSI transfer using an analog scan circuit in the embodiment of the present invention.

BEST MODE FOR CARRYING OUT THE INVENTION

Next, an embodiment of the present invention will be explained in detail with reference to the drawings.

Figure 1:
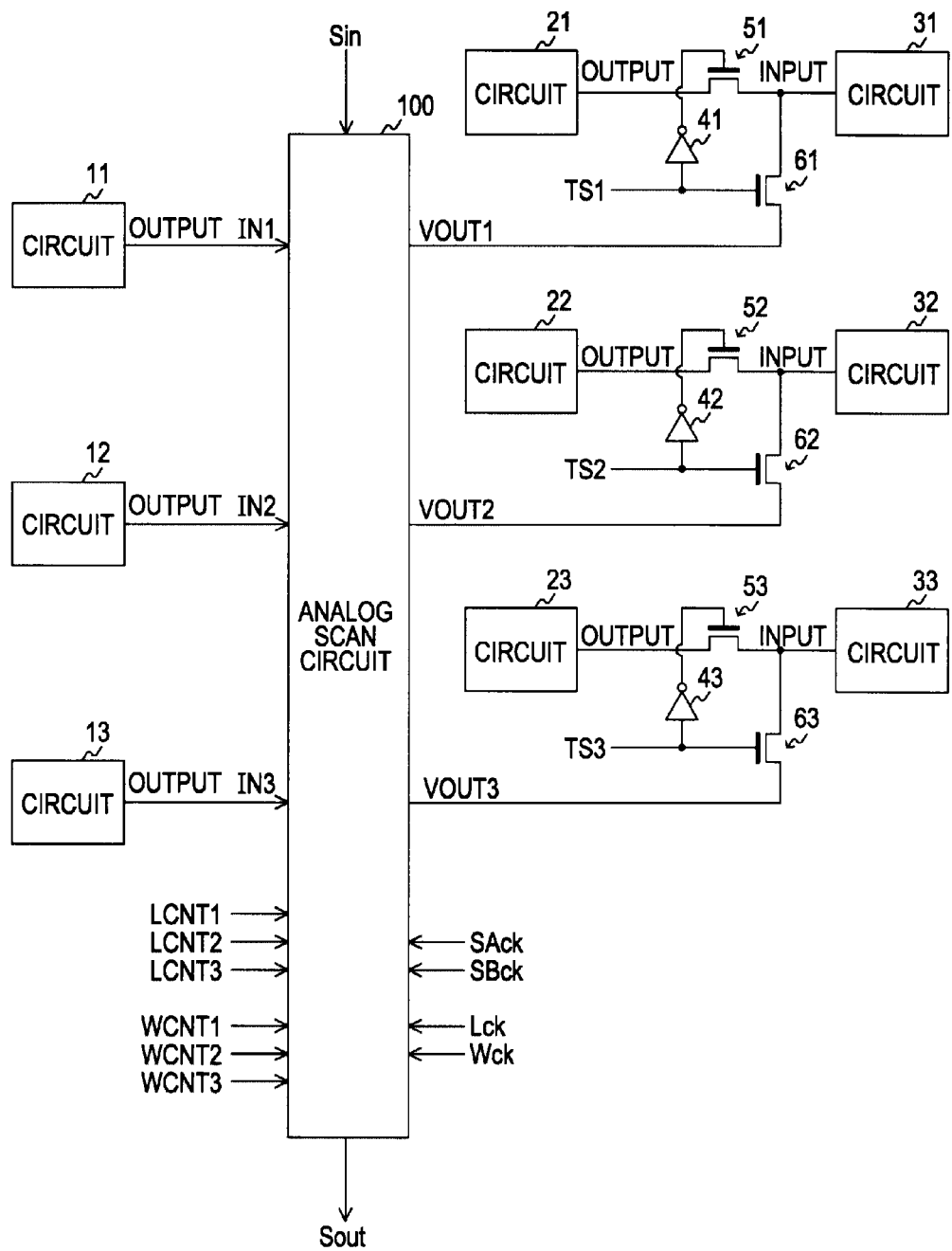
FIG. 1 is a diagram illustrating an example relationship between an analog scan circuit 100 in an embodiment of the present invention and circuits to be tested.

FIG. 1 is a diagram illustrating an example relationship between an analog scan circuit 100 in an embodiment of the present invention and circuits to be tested. Circuits 11 to 13 are circuits to be observed on the occasion of a test. Circuits 31 to 33 are circuits to be controlled on the occasion of the test. Note that, here, for convenience of explanation, it is envisaged that three circuits to be observed and three circuits to be controlled exist; however, this is not to be taken in a limiting sense.

An analog scan circuit 100 has functions for sampling internal signal voltages of the circuits 11 to 13, which have been input to the input terminals IN1 to IN3, to hold the resulting signal voltages as analog values, and, in addition, supplying analog values from the output terminals VOUT1 to VOUT3 to the circuits 31 to 33 to set the analog values as internal signal voltages of the respective circuits. In addition, the analog scan circuit 100 includes a scan-in terminal Sin and a scan-out terminal Sout, and has functions for holding test data input to the scan-in terminal Sin from a tester (not illustrated) as an analog value and, in addition, outputting test data from the scan-out terminal Sout to the tester.

Two sets of transistors 51 to 53 and 61 to 63 are respectively connected to input terminals of the circuits 31 to 33, and one set of transistors are conducting so that signals of either the output terminals of the circuits 21 to 23 or the output terminals VOUT1 to VOUT3 of the analog scan circuit 100 can be input. Which transistor is brought into conduction is controlled by signals of the test terminals TS1 to TS3. Signals whose polarities are inverted by inverters 41 to 43 are applied to the gate terminals of the sets of transistors 51 to 53 and 61 to 63, and both sets of transistors are controlled so as to be turned into different states.

For example, in a case where the circuit 31 is tested, the test terminal TS1 is set to "1", and the transistor 61 is turned into an on state while the transistor 51 is turned into an off state. Thus, the signal of the VOUT1 of the analog scan circuit 100 is input to the circuit 31. On the other hand, in the case of a normal operation in which the circuit 31 is not tested, the test terminal TS1 is set to "0", and the transistor 61 is turned into an off state while the transistor 51 is turned into an on state. Thus, the signal from the circuit 21 in the preceding stage is input to the circuit 31.

The analog scan circuit 100 includes a plurality of cells that hold analog values, and is designed to be capable of shifting and transferring the held analog values from cell to cell. In order to control the this transfer timing, the analog scan circuit 100 is provided with clock terminals SAck and SBck for shift transfer. In addition, the analog scan circuit 100 is provided with a clock terminal Lck for newly holding (loading or sampling) analog values in the cells, and a clock terminal Wck for outputting (writing) held analog values. The analog value held in each cell is a pulse amplitude modulation (PAM) signal of an analog signal. That is, it undergoes quantization (sampling) in the time direction while amplitude is based on an analog value.

In addition, the analog scan circuit 100 is provided with load control terminals LCNT1 to LCNT3 and write control terminals WCNT1 to WCNT3. The load control terminals LCNT1 to LCNT3 correspond to the input terminals IN1 to IN3, and are terminals for individually controlling them. In addition, the write control terminals WCNT1 to WCNT3 correspond to the output terminals VOUT1 to VOUT3, and are terminals for individually controlling them. Specific content of the control of them will be described below.

Figure 2:
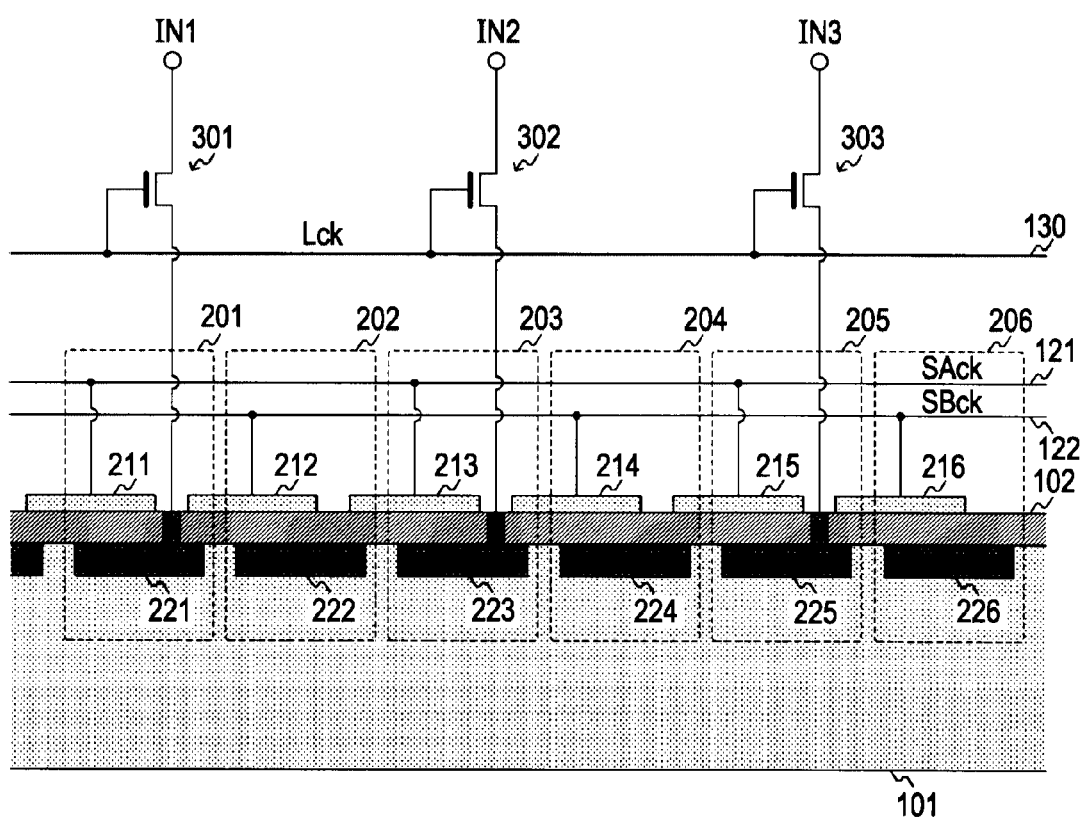
FIG. 2 is a conceptual diagram illustrating a first exemplary embodiment of the analog scan circuit 100 in the embodiment of the present invention.
Figure 3:
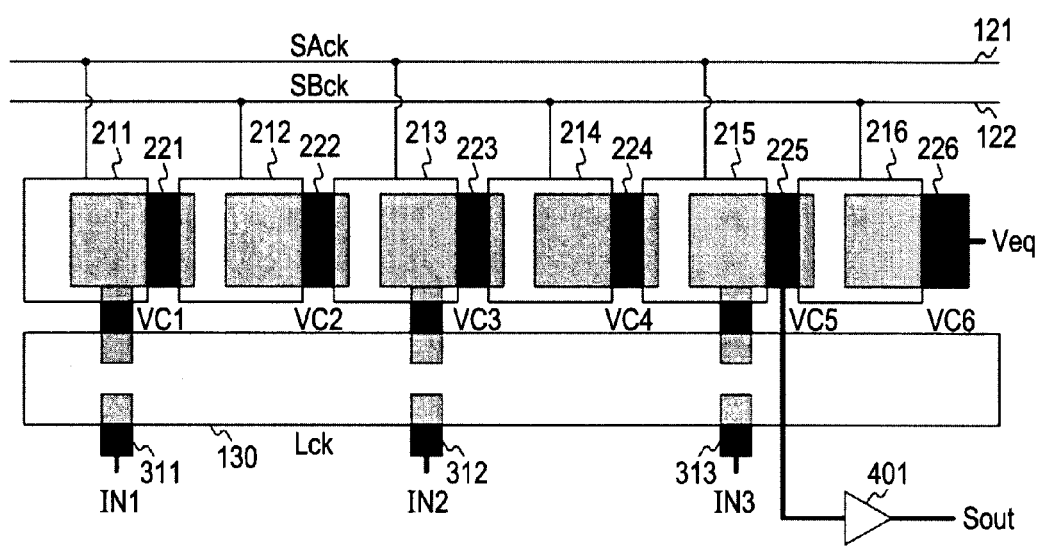
FIG. 3 is a layout diagram illustrating the first exemplary embodiment of the analog scan circuit 100 in the embodiment of the present invention.

FIG. 2 is a conceptual diagram illustrating a first exemplary embodiment of the analog scan circuit 100 in the embodiment of the present invention. In addition, FIG. 3 is a layout diagram illustrating the first exemplary embodiment of the analog scan circuit 100 in the embodiment of the present invention.

The analog scan circuit 100 is formed on, for example, a P-type silicon substrate 101. An insulating film 102 is formed on a surface of the silicon substrate 101 using an oxidation process. Underneath the insulating film 102, N-type diffusion layer regions 221 to 226 are formed. In addition, gate electrodes 211 to 216 are formed on the top of the insulating film 102 at positions corresponding to those of the diffusion layer regions 221 to 226. As illustrated in the figures, each of the gate electrodes 211 to 216 extends above one of an adjacent pair in the diffusion layer regions 221 to 226.

Electric charge can be respectively accumulated in the capacitance between the gate electrodes 211 to 216 and the diffusion layer regions 221 to 226. Each of clock signal lines 121 and 122 is connected to every other of the gate electrodes 211 to 216. The clock signal SAck is supplied to the clock signal line 121, and the clock signal SBck is supplied to the clock signal line 122. The clock signals SAck and SBck are controlled, thus allowing the accumulated electric charge to be transferred from leftward to rightward.

This analog scan circuit 100 is designed to be based on a BBD (Bucket Brigade Device/Bucket Bridge Device), and can be divided into cells 201 to 206 as units in which electric charge is accumulated. Note that, here, six cells 201 to 206 are illustrated for convenience of explanation; however, this is not to be taken in a limiting sense. The cell structure of a BBD is described in, for example, Japanese Examined Patent Application Publication No. 47-27573.

Output signals from other circuits can be input to the diffusion layer regions 221 to 226. In this first exemplary embodiment, a transistor 301 is connected to the diffusion layer region 221, a transistor 302 is connected to the diffusion layer region 223, and a transistor 303 is connected to the diffusion layer region 225. The input terminal IN1 (311) is connected to one end of the transistor 301, the input terminal IN2 (312) is connected to one end of the transistor 302, and the input terminal IN3 (313) is connected to one end of the transistor 303.

In addition, a load control signal line 130 is connected to the gates of the transistors 301 to 303. A load control signal Lck is supplied to this clock signal line 130. Thus, if the clock signal Lck is in an H (High) state, the transistors 301 to 303 are turned into an on state, and the analog signals of the input terminals IN1 to IN3 are supplied to the diffusion layer regions 221, 223 and 225. The analog signals supplied in this manner allow electric charge to be charged in the respective capacitance between the gate electrodes 211, 213 and 215 and the diffusion layer regions 221, 223 and 225. Then, when the clock signal Lck is turned into an L (Low) state, the transistors 301 to 303 are turned into an off state, and the charging of the electric charge is stopped.

In this first exemplary embodiment, an electric charge/voltage conversion amplifier (QV amplifier) 401 is connected to the diffusion layer region 225, and a scan-out signal Sout is output to the scan-out terminal via the electric charge/voltage conversion amplifier 401. This electric charge/voltage conversion amplifier 401 is an amplifier that converts accumulated electric charge into voltage. In addition, an equalization initial voltage Veq is supplied to the diffusion layer region 226. Both the clock signals SAck and SBck are set to an H state, thereby making the potentials of the diffusion layer regions 221 to 226 match the equalization initial voltage Veq, and movable electric charge that has been held in the respective capacitance between the gate electrodes 211 to 216 and the diffusion layer regions 221 to 226 becomes equal to the initial value (Qeq). This equalization is a process performed to avoid degradation in accuracy which may be caused by, if accumulated electric charge exists in a cell located midway during data shifting, addition of the accumulated electric charge to electric charge produced from a signal. Note that since equalization is automatically performed by a scan operation, it is not necessary to perform equalization once again after the second scan.

Figure 4:
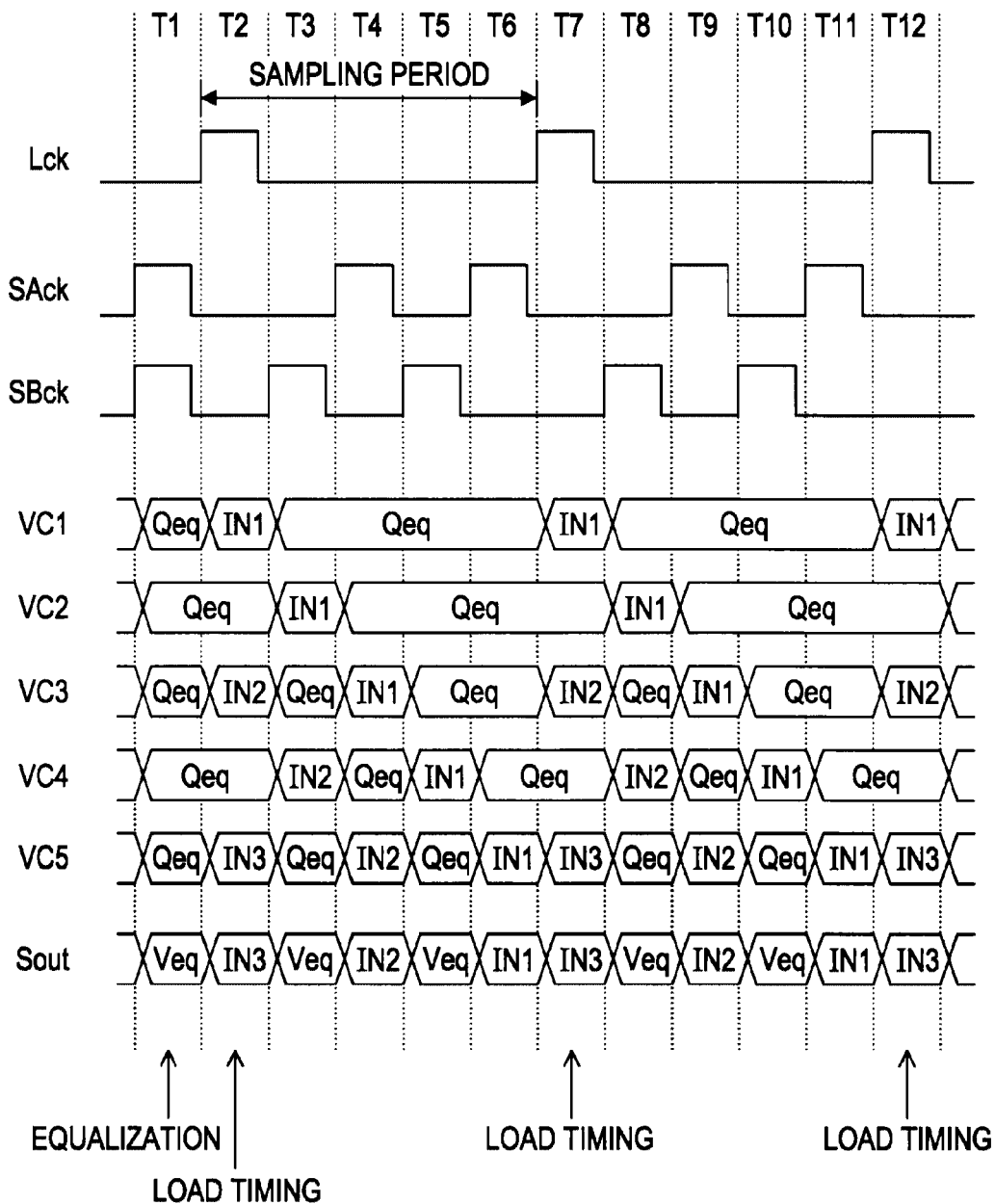
FIG. 4 is a timing chart of the first exemplary embodiment of the analog scan circuit 100 in the embodiment of the present invention

FIG. 4 is a timing chart of the first exemplary embodiment of the analog scan circuit 100 in the embodiment of the present invention.

At time T1, both the clock signals SAck and SBck are brought into an H state. Thus, the potentials VC1 to VC6 of the diffusion layer regions 221 to 226 are made to match the equalization potential Veq, and the movable electric charge becomes equal to the initial value (Qeq). Accordingly, the scan-out signal Sout at this time becomes equal to the initial voltage (Veq).

At time T2, the clock signal Lck is brought into an H state. Thus, the analog signals of the input terminals IN1 to IN3 are supplied to the diffusion layer regions 221, 223 and 225, and electric charge is respectively accumulated as VC1 to VC3. The scan-out signal Sout at this time becomes equal to the same potential as the potential supplied to the input terminal IN3.

At time T3, the clock signal SAck is brought into an L state and the clock signal SBck is brought into an H state. Thus, the electric charge that has been held in the respective capacitance between the gate electrodes 211, 213 and 215 and the diffusion layer regions 221, 223 and 225 is transferred to the respective capacitance between the gate electrodes 212, 214 and 216 and the diffusion layer regions 222, 224 and 226. Thus, the movable electric charge in the respective capacitance between the gate electrodes 211, 213 and 215 and the diffusion layer regions 221, 223 and 225 becomes equal to the initial value (Qeq).

At time T4, the clock signal SAck is brought into an H state and the clock signal SBck is brought into an L state. Thus, the electric charge that has been held in the respective capacitance between the gate electrodes 212, 214 and 216 and the diffusion layer regions 222, 224 and 226 is transferred to the respective capacitance between the gate electrodes 211, 213 and 215 and the diffusion layer regions 221, 223 and 225. The scan-out signal Sout at this time becomes equal to the same potential as the potential supplied to the input terminal IN2 at time T2.

Similarly, at time T5, the clock signal SAck is brought into an L state and the clock signal SBck is brought into an H state. Subsequently, at time T6, the clock signal SAck is brought into an H state and the clock signal SBck is brought into an L state. Thus, the scan-out signal Sout at time T6 becomes equal to the same potential as the potential supplied to the input terminal IN1 at time T2.

After time T7, the operation performed after time T2 is repeated. Accordingly, when one half the period of the clock signal SAck or SBck is represented by 1 T, the sampling (load) period in this first exemplary embodiment becomes equal to 5 T.

In this manner, in the first exemplary embodiment in the embodiment of the present invention, the clock signal Lck is set to an H state, thus allowing the analog signals of the input terminals IN1 to IN3 to be captured. Thereafter, the clock signals SAck and SBck are alternately set to an H state, thus allowing electric charge to be transferred and output as the scan-out signal Sout.

Figure 5:
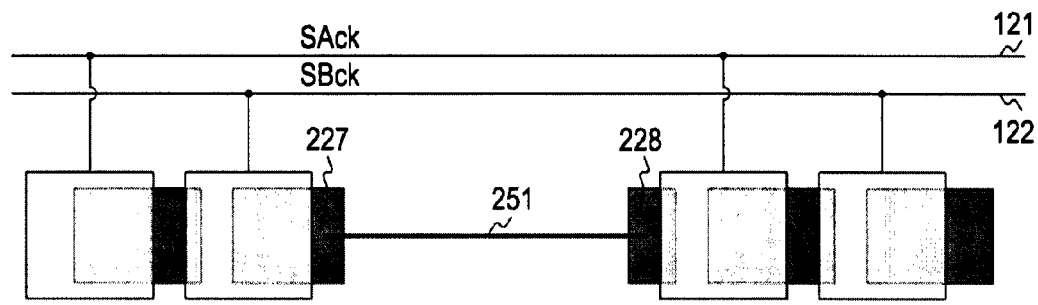
FIG. 5 is a diagram illustrating an example of the distribution and arrangement of BBD cells in the embodiment of the present invention.

Note that since signals to be monitored in an actual LSI are irregularly distributed in the LSI, the collective arrangement of the BBD cells in a portion of the LSI can require wiring from the respective nodes to the BBD cells, resulting in an increase in chip area. Consequently, it is preferable that the BBD cells be divided into portions which are arranged near the respective nodes and that, in addition, a unicursal arrangement is provided so that the total wiring can be the shortest. FIG. 5 is a diagram illustrating an example of the distribution and arrangement of the BBD cells in the embodiment of the present invention. As in this example, the diffusion layer region 227 in one BBD cell and the diffusion layer region 228 in another BBD cell are connected using a signal line 251 which can thus be handled as a continuous scan path even between the distributed BBD cells.

Figure 6:
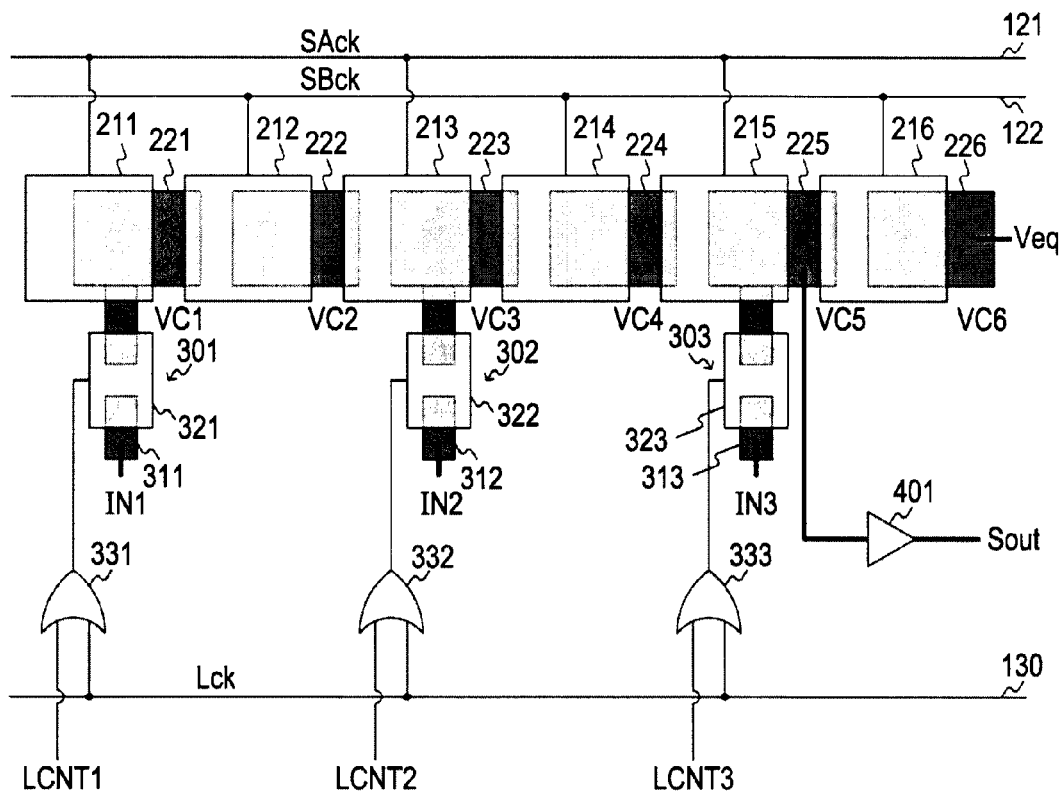
FIG. 6 is a layout diagram illustrating a second exemplary embodiment of the analog scan circuit 100 in the embodiment of the present invention.

FIG. 6 is a layout diagram illustrating a second exemplary embodiment of the analog scan circuit 100 in the embodiment of the present invention. In the first exemplary embodiment, the common load clock signal line 130 is connected to the gates 301 to 303 of the transistors to which the input terminals IN1 to IN3 are connected. In this second exemplary embodiment, however, individual control signal lines are connected to gate electrodes 321 to 323 of transistors to which the input terminals IN1 to IN3 are connected. The outputs of OR gates 331 to 333 are connected to these individual signal lines.

The OR gates 331 to 333 are logic gates that generate the respective logic OR (OR) between control signals LCNT1 to LCNT3 and a load control signal Lck. Thus, even in a case where the load control signal Lck is not in an H state, the control signals LCNT1 to LCNT3 are individually set to an H state, thus allowing the analog signals of the corresponding input terminals IN1 to IN3 to be captured.

Figure 7:
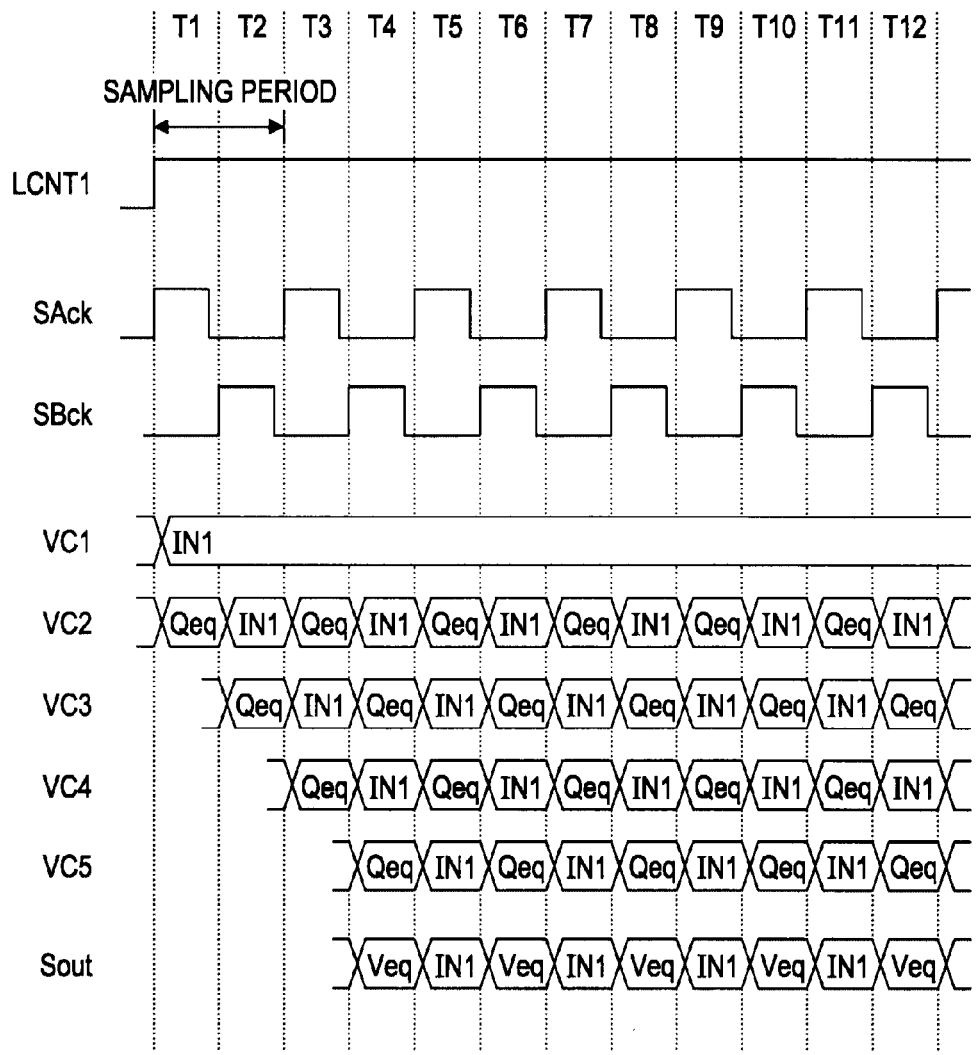
FIG. 7 is a timing chart of the second exemplary embodiment of the analog scan circuit 100 in the embodiment of the present invention.

FIG. 7 is a timing chart of the second exemplary embodiment of the analog scan circuit 100 in the embodiment of the present invention. In this second exemplary embodiment, in order to capture only the analog signal of the input terminal IN1, it is assumed that LCNT1=H, LCNT2=L, LCNT3=L, and Lck=L are steadily set.

When the control signal LCNT1 is turned into an H state at time T1, the analog value of the input terminal IN1 is supplied to the diffusion layer region 221. In addition, the clock signal SAck is brought into an H state and the clock signal SBck is brought into an L state. Thus, the electric charge that has been held in the respective capacitance between the gate electrodes 212 and 214 and the diffusion layer regions 222 and 224 is transferred to the respective capacitance between the gate electrode 213 and 215 and the diffusion layer regions 223 and 225.

At time T2, the clock signal SAck is brought into an L state and the clock signal SBck is brought into an H state. Thus, the electric charge that has been held in the respective capacitance between the gate electrodes 211, 213 and 215 and the diffusion layer regions 221, 223 and 225 is transferred to the respective capacitance between the gate electrodes 212, 214 and 216 and the diffusion layer regions 222, 224 and 226. That is, the analog signal supplied from the input terminal IN1 to the diffusion layer region 221 is also supplied to the diffusion layer region 222, and electric charge is accumulated by the timing at which the clock signal SBck transitions to an L state again.

At time T3, the clock signal SAck is brought into an H state and the clock signal SBck is brought into an L state. Thus, the electric charge that has been held in the respective capacitance between the gate electrodes 212 and 214 and the diffusion layer regions 222 and 224 is transferred to the respective capacitance between the gate electrodes 213 and 215 and the diffusion layer regions 223 and 225. That is, the electric charge accumulated at time T2 between the gate electrode 212 and the diffusion layer region 222 from the input terminal IN1 is transferred between the gate electrode 213 and the diffusion layer region 223.

At time T4, the clock signal SAck is brought into an L state and the clock signal SBck is brought into an H state. Thus, the electric charge that has been held in the respective capacitance between the gate electrodes 211, 213 and 215 and the diffusion layer regions 221, 223 and 225 is transferred to the respective capacitance between the gate electrodes 212, 214 and 216 and the diffusion layer regions 222, 224 and 226. That is, the analog signal supplied from the input terminal IN1 to the diffusion layer region 221 is also supplied to the diffusion layer region 222, and electric charge is accumulated by the timing at which the clock signal SBck transitions to an L state again. In addition, the electric charge accumulated at time T2 between the gate electrode 212 and the diffusion layer region 222 from the input terminal IN1 is transferred between the gate electrode 214 and the diffusion layer region 224.

At time T5, the clock signal SAck is brought into an H state and the clock signal SBck is brought into an L state. Thus, the electric charge that has been held in the respective capacitance between the gate electrodes 212 and 214 and the diffusion layer regions 222 and 224 is transferred to the respective capacitance between the gate electrodes 213 and 215 and the diffusion layer regions 223 and 225. That is, the electric charge accumulated at time T4 between the gate electrode 212 and the diffusion layer region 222 is transferred between the gate electrode 213 and the diffusion layer region 223, and the electric charge accumulated at time T2 between the gate electrode 212 and the diffusion layer region 222 is transferred between the gate electrode 215 and the diffusion layer region 225. Thus, the scan-out signal Sout at time T5 becomes equal to the same potential as the potential supplied to the input terminal IN1 at time T2.

In this second exemplary embodiment, after time T3, the operation performed after time T1 is repeated. Accordingly, when one half the period of the clock signal SAck or SBck is represented by 1 T, the sampling period in this second exemplary embodiment becomes equal to 2 T. That is, in the first exemplary embodiment, since a plurality of input signal are captured in parallel, the sampling period is long whereas as in this second exemplary embodiment, control signals corresponding to the respective input signals are individually provided, thus allowing sampling targets to be narrowed down and allowing a reduction in sampling period.

Figure 8:
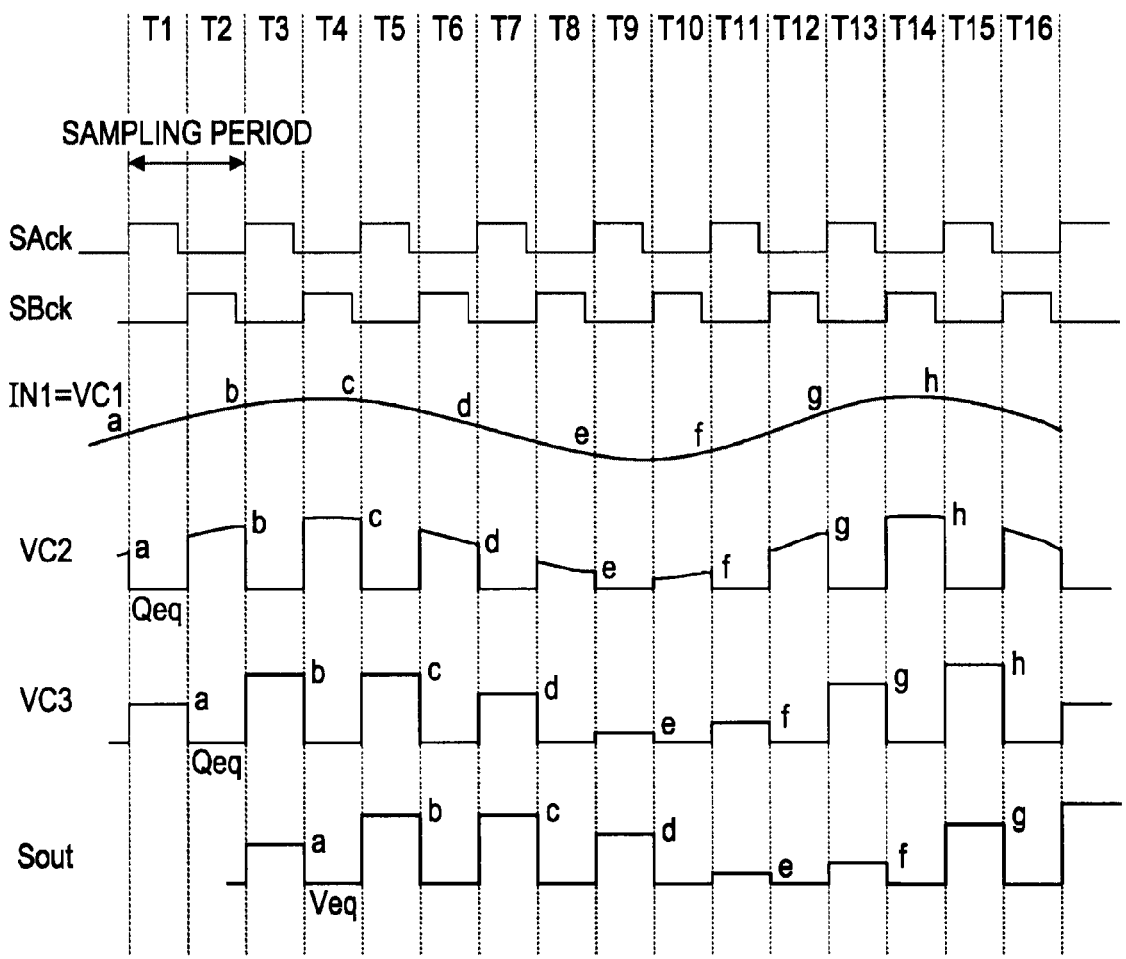
FIG. 8 is a detailed timing chart of the second exemplary embodiment of the analog scan circuit 100 in the embodiment of the present invention.

FIG. 8 is a detailed timing chart of the second exemplary embodiment of the analog scan circuit 100 in the embodiment of the present invention. A specific example in a case where a sine wave is applied to the input terminal IN1 is illustrated.

Since the LCNT1 is always in an H state, the analog signal from the input terminal IN1 is always supplied to the diffusion layer region 221. In addition, for a period during which the clock signal SBck in an H state, the analog signal from the input terminal IN1 is also supplied to the diffusion layer region 222. Thus, electric charge is accumulated between the gate electrode 212 and the diffusion layer region 222. Then, the clock signals SAck and SBck are alternately controlled, thus allowing the accumulated electric charge to be transferred from leftward to rightward.

Figure 9:
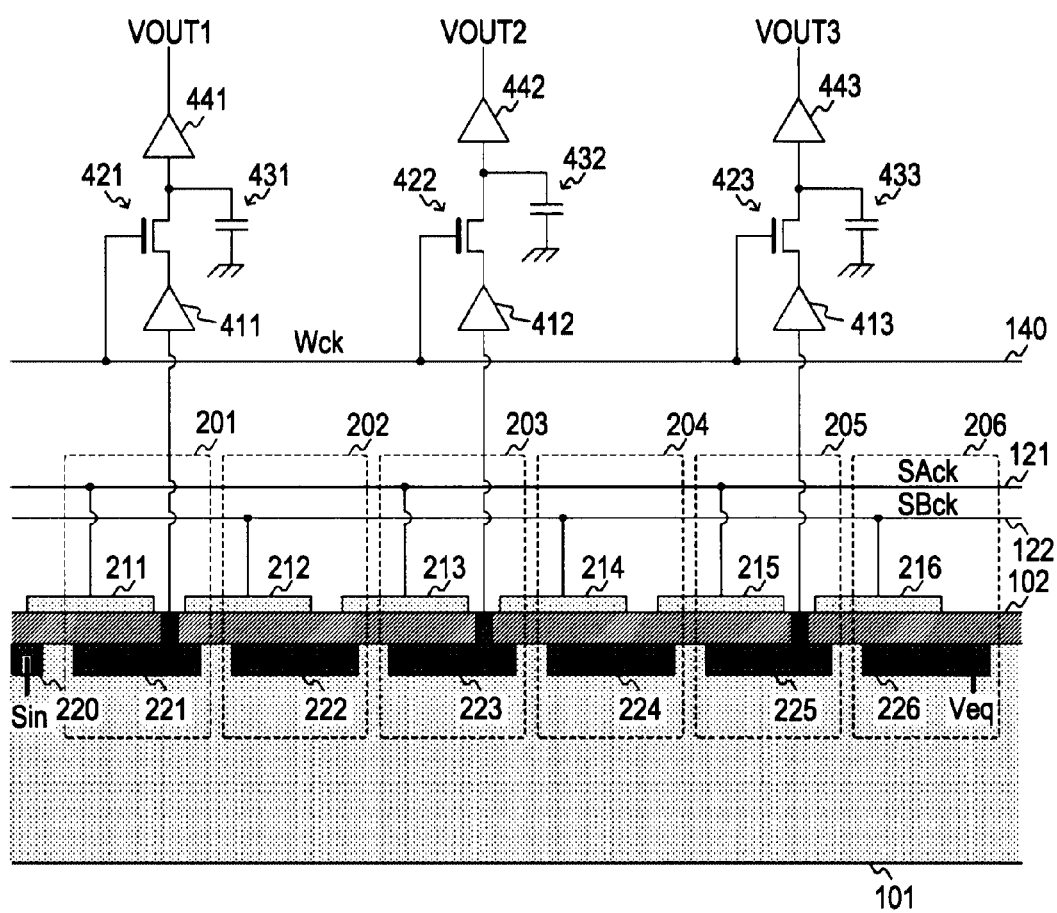
FIG. 9 is a conceptual diagram illustrating a third exemplary embodiment of the analog scan circuit 100 in the embodiment of the present invention.
Figure 10:
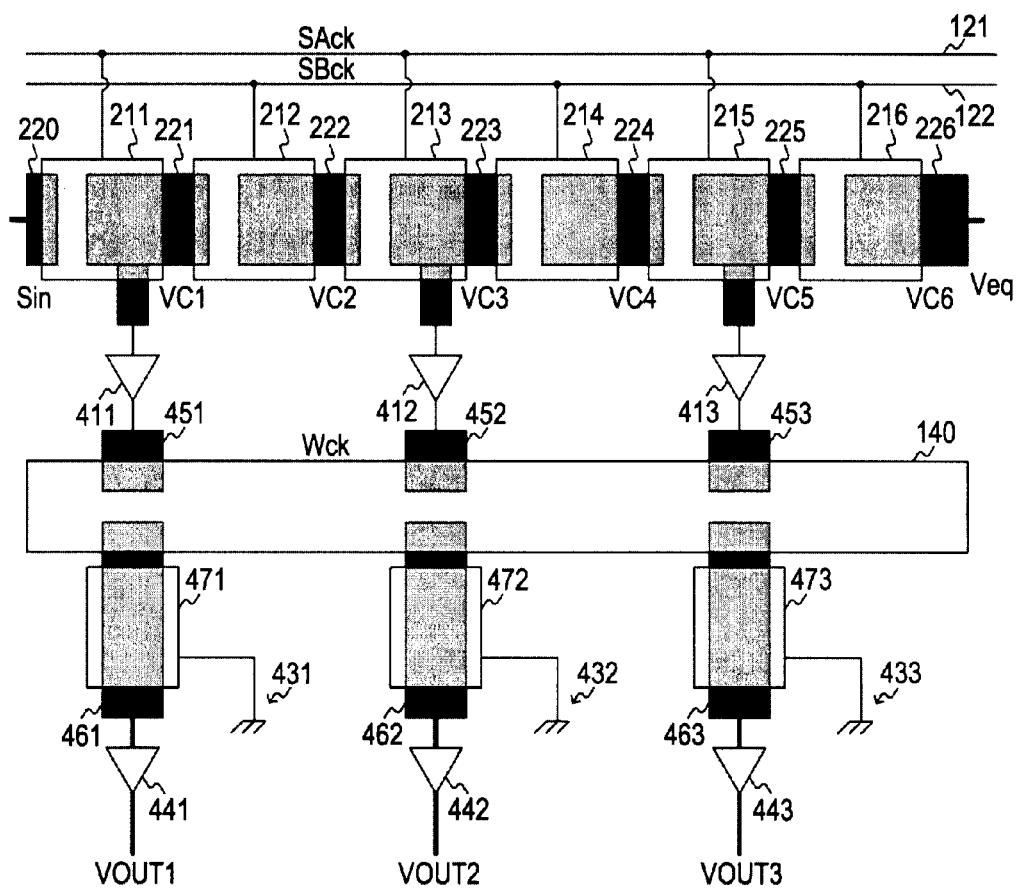
FIG. 10 is a layout diagram illustrating the third exemplary embodiment of the analog scan circuit 100 in the embodiment of the present invention.

FIG. 9 is a conceptual diagram illustrating a third exemplary embodiment of the analog scan circuit 100 in the embodiment of the present invention. In addition, FIG. 10 is a layout diagram illustrating the third exemplary embodiment of the analog scan circuit 100 in the embodiment of the present invention.

In this third exemplary embodiment, the signal from the scan-in terminal Sin is supplied to the diffusion layer region 220. Thus, electric charge is accumulated between the gate electrode 211 and the diffusion layer region 221. Then, the clock signals SAck and SBck are alternately controlled, thus allowing the accumulated electric charge to be transferred from leftward to rightward.

In this third exemplary embodiment, electric charge/voltage conversion amplifiers 411 to 413 are connected to the diffusion layer regions 221, 223 and 225, respectively. As described above, the electric charge/voltage conversion amplifiers 411 to 413 are amplifiers that convert accumulated electric charge into voltage. These amplifiers whose output is voltage does not have high impedance.

The outputs of the electric charge/voltage conversion amplifiers 411 to 413 are added to transistors 421 to 423 from diffusion layer regions 451 to 453. An output clock signal Wck is supplied to the gates of the transistors 421 to 423 via a clock signal line 140. When this clock signal Wck is in an H state, the transistors 421 to 423 are turned into an on state, and capacitors 431 to 433 constituted by diffusion layer regions 461 to 463 and electrodes 471 to 473 are charged. In addition, when the clock signal Wck is in an L state, the transistors 421 to 423 are turned into an off state, and the charged voltage value is held. In this manner, the transistors 421 to 423 and the capacitors 431 to 433 constitute sample and hold circuits. The amplifiers 441 to 443 are connected to the outputs of these respective sample and hold circuits, and the respective outputs are supplied to the output terminals VOUT1 to VOUT3.

Figure 11:
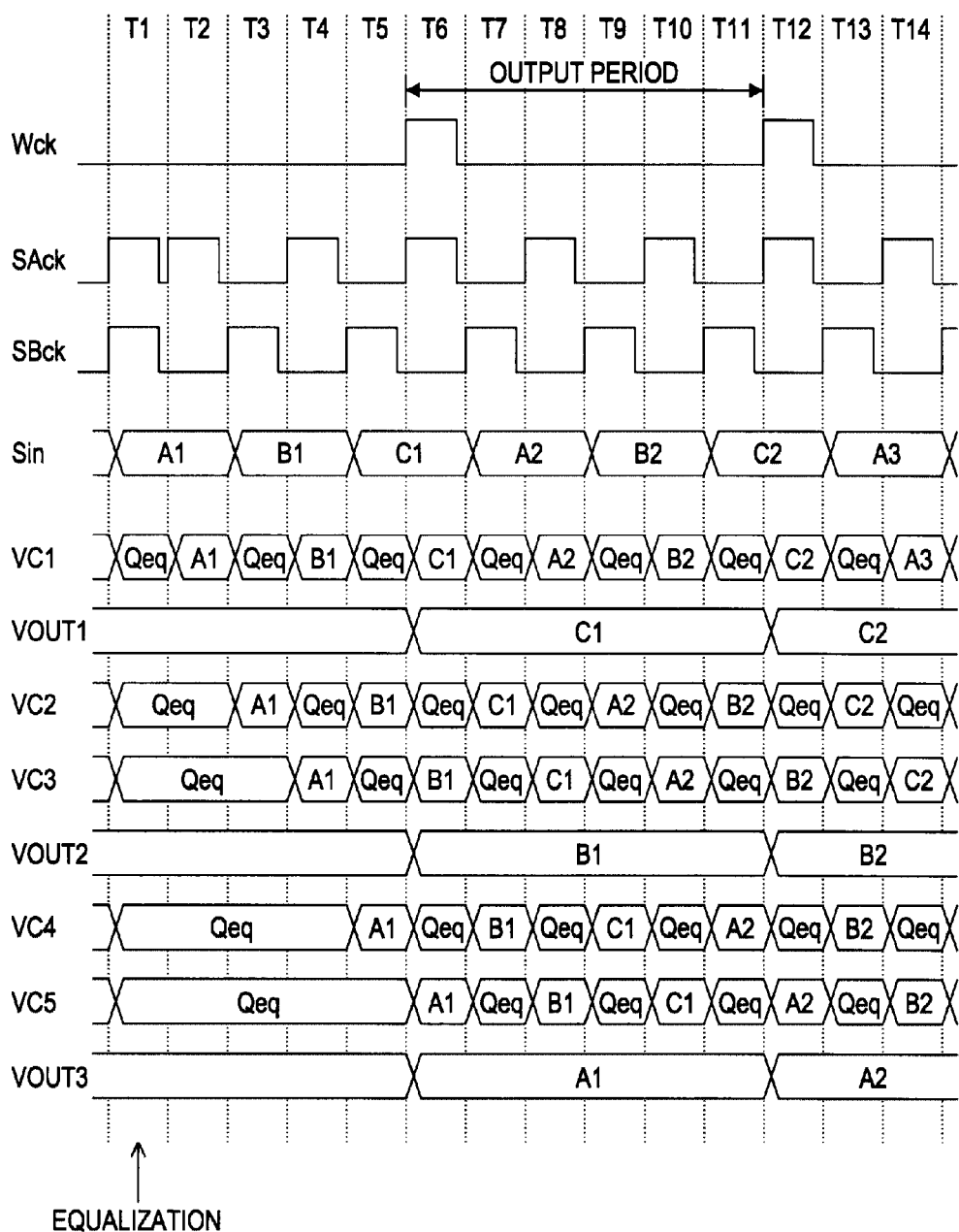
FIG. 11 is a timing chart of the third exemplary embodiment of the analog scan circuit 100 in the embodiment of the present invention.

FIG. 11 is a timing chart of the third exemplary embodiment of the analog scan circuit 100 in the embodiment of the present invention.

At time T1, both the clock signals SAck and SBck are brought into an H state. Thus, the potentials VC1 to VC6 of the diffusion layer regions 221 to 226 are made to match the equalization potential Veq, and the movable electric charge becomes equal to the initial value (Qeq).

At time T2, the clock signal SAck is brought into an H state and the clock signal SBck is brought into an L state. Thus, a signal A1 from the scan-in terminal Sin is supplied to the diffusion layer region 221, and the electric charge of the signal A1 is accumulated in the capacitance between the diffusion layer region 221 and the gate electrode 211 (VC1).

At time T3, the clock signal SAck is brought into an L state and the clock signal SBck is brought into an H state. Thus, the electric charge that has been held in the respective capacitance between the gate electrodes 211, 213 and 215 and the diffusion layer regions 221, 223 and 225 is transferred to the respective capacitance between the gate electrodes 212, 214 and 216 and the diffusion layer regions 222, 224 and 226. That is, at this time T3, the electric charge of the signal A1 accumulated at time T2 between the diffusion layer region 221 and the gate electrode 211 is transferred between the diffusion layer region 222 and the gate electrode 212 (VC2).

At time T4, the clock signal SAck is brought into an H state and the clock signal SBck is brought into an L state. Thus, a signal B1 from the scan-in terminal Sin is supplied to the diffusion layer region 221, and the electric charge of the signal B1 is accumulated in the capacitance between the diffusion layer region 221 and the gate electrode 211. In addition, the electric charge that has been held in the respective capacitance between the gate electrodes 212 and 214 and the diffusion layer regions 222 and 224 is transferred to the respective capacitance between the gate electrodes 213 and 215 and the diffusion layer regions 223 and 225. That is, at this time T4, the electric charge of the signal A1 accumulated at time T2 between the diffusion layer region 221 and the gate electrode 211 is transferred between the diffusion layer region 223 and the gate electrode 213 (VC3).

At time T5, the clock signal SAck is brought into an L state and the clock signal SBck is brought into an H state. Thus, the electric charge that has been held in the respective capacitance between the gate electrodes 211, 213 and 215 and the diffusion layer regions 221, 223 and 225 is transferred to the respective capacitance between the gate electrodes 212, 214 and 216 and the diffusion layer regions 222, 224 and 226. That is, at this time T5, the electric charge of the signal A1 accumulated at time T2 between the diffusion layer region 221 and the gate electrode 211 is also transferred between the diffusion layer region 224 and the gate electrode 214 (VC4), and, simultaneously, the electric charge of the signal B1 accumulated at time T4 between the diffusion layer region 221 and the gate electrode 211 is transferred between the diffusion layer region 222 and the gate electrode 212 (VC2).

At time T6, the clock signal SAck is brought into an H state and the clock signal SBck is brought into an L state. Thus, a signal C1 from the scan-in terminal Sin is supplied to the diffusion layer region 221, and the electric charge of the signal C1 is accumulated in the capacitance between the diffusion layer region 221 and the gate electrode 211. In addition, the electric charge that has been held in the respective capacitance between the gate electrodes 212 and 214 and the diffusion layer regions 222 and 224 is transferred to the respective capacitance between the gate electrodes 213 and 215 and the diffusion layer regions 223 and 225. That is, at this time T6, the electric charge of the signal A1 accumulated at time T2 between the diffusion layer region 221 and the gate electrode 211 is transferred between the diffusion layer region 225 and the gate electrode 215 (VC5), and, simultaneously, the electric charge of the signal B1 accumulated at time T4 between the diffusion layer region 221 and the gate electrode 211 is transferred between the diffusion layer region 223 and the gate electrode 213 (VC3).

In addition, at this time T6, the write clock signal Wck is brought into an H state. Thus, the analog values C1, B1, and A1 are supplied to the output terminals VOUT1 to VOUT3, respectively. The values of these output terminals VOUT1 to VOUT3 are maintained at the same values using the sample and hold circuits immediately before time T12 at which the clock signal Wck is next brought into an H state.

After time T7, the operation is repeated in a similar way. In this case, when one half the period of the clock signal SAck or SBck is represented by 1 T, the output period in this third exemplary embodiment becomes equal to 6 T.

Figure 12:
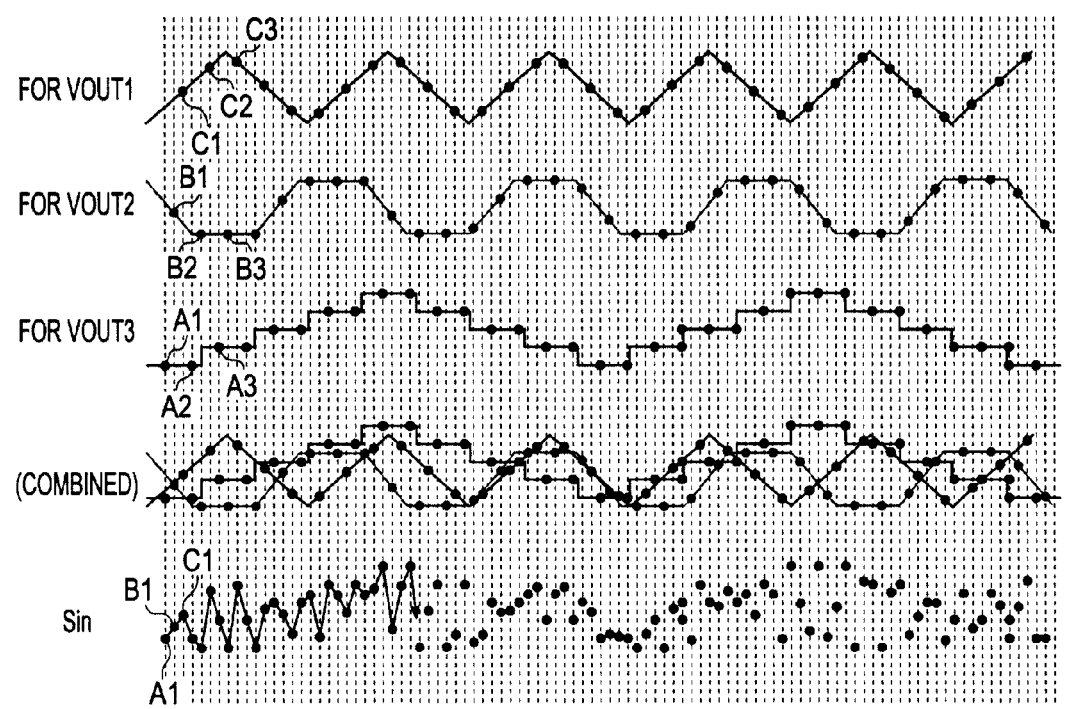
FIG. 12 is an example of signals from a scan-in terminal Sin for the third exemplary embodiment of the analog scan circuit 100 in the embodiment of the present invention.

FIG. 12 is an example of signals from the scan-in terminal Sin for the third exemplary embodiment of the analog scan circuit 100 in the embodiment of the present invention. A signal for VOUT1, a signal for VOUT2, and a signal for VOUT3 are signals to be output from the output terminals VOUT1 to VOUT3, respectively. The signal for VOUT1 becomes a sequence of signals such as C1, C2, and C3 in the order sampled. The signal for VOUT2 becomes a sequence of signals such as B1, B2, and B3 in the order sampled. The signal for VOUT3 becomes a sequence of signals such as A1, A2, and A3 in the order sampled.

A scan-in signal Sin is configured by combining the signal for VOUT1, the signal for VOUT2, and the signal for VOUT3, and is rearranged into a sequence of signals such as A1, B1, C1, A2, B2, C2, A3, B3, and C3. The scan-in signal Sin generated in this manner becomes a PAM signal that changes at the respective points as in the same figure.

Figure 13:
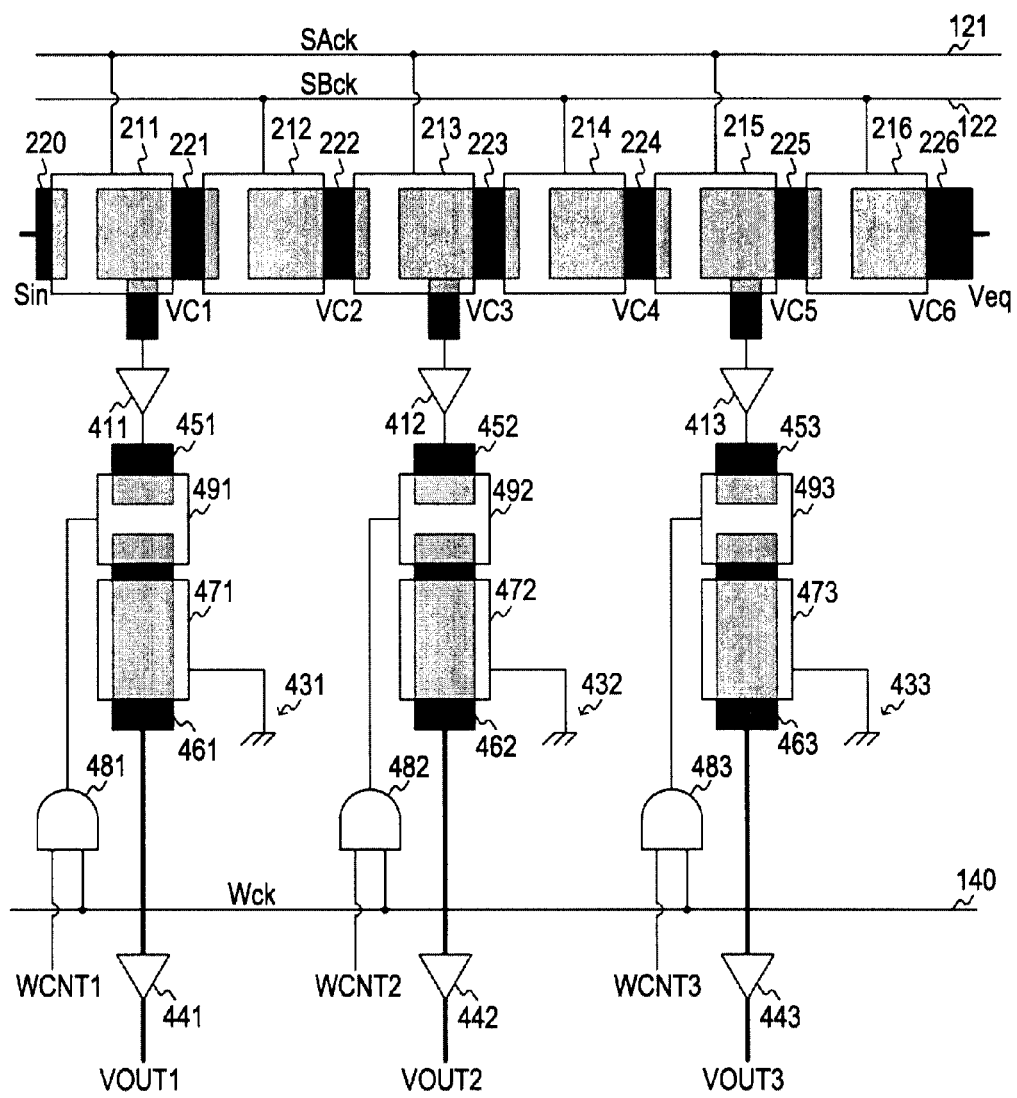
FIG. 13 is a layout diagram illustrating a fourth exemplary embodiment of the analog scan circuit 100 in the embodiment of the present invention.

FIG. 13 is a layout diagram illustrating a fourth exemplary embodiment of the analog scan circuit 100 in the embodiment of the present invention. In the third exemplary embodiment, the common write clock signal line 140 is connected to the gates of the transistors to which the output terminals VOUT1 to VOUT3 are connected. In this fourth exemplary embodiment, however, individual control signal lines are connected to gate electrodes 491 to 493 of transistors to which the output terminals VOUT1 to VOUT3 are connected. The outputs of AND gates 481 to 483 are connected to these individual signal lines.

The AND gates 481 to 483 are logic gates that generate the respective logic AND (AND) between write control signals WCNT1 to WCNT3 and the write clock signal Wck. Thus, the control signals WCNT1 to WCNT3 are individually set to an H state, thus allowing analog signals to be output to the corresponding output terminals VOUT1 to VOUT3 at the timing at which the write clock signal Wck is turned into an H state.

Figure 14:
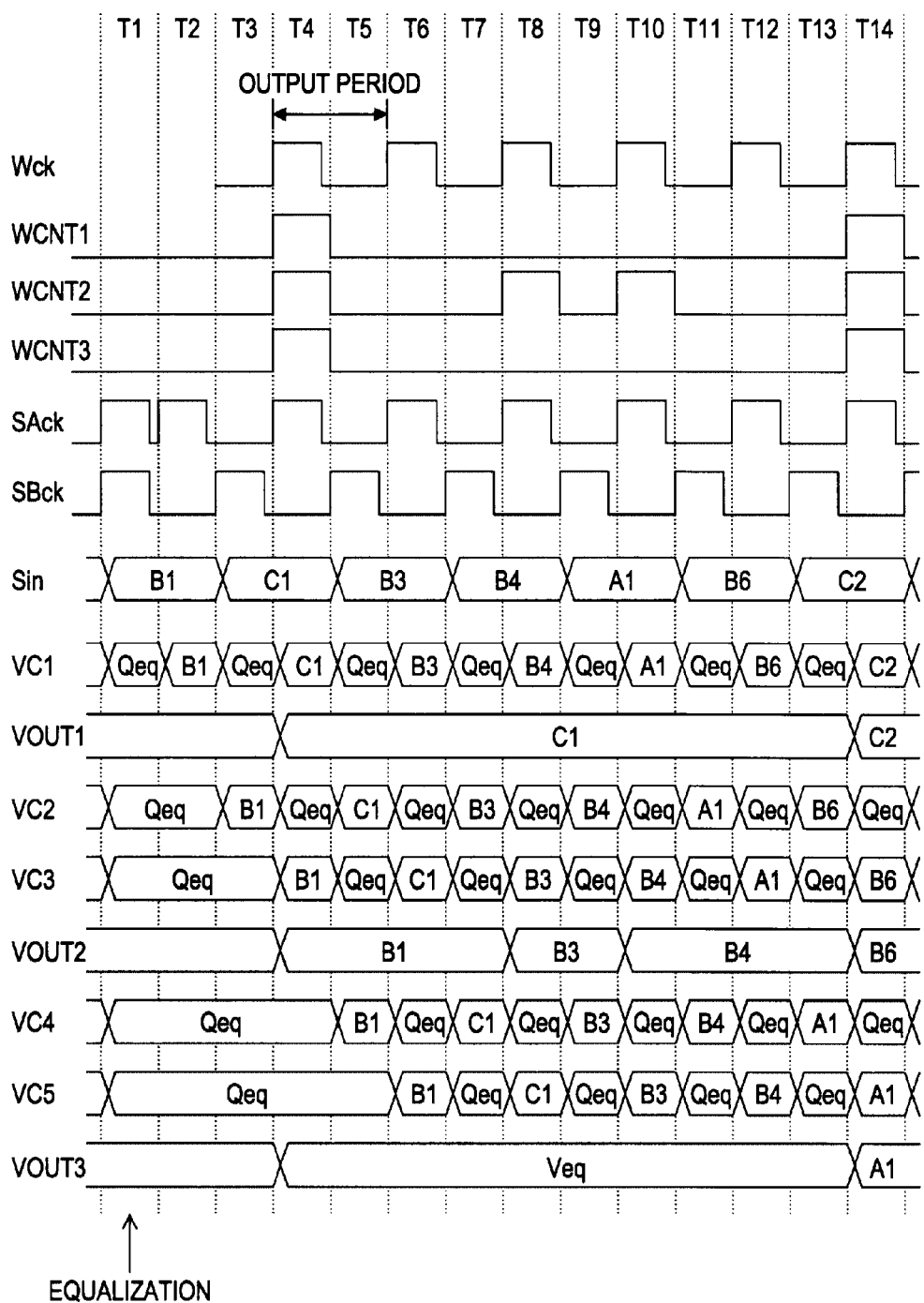
FIG. 14 is a timing chart of the fourth exemplary embodiment of the analog scan circuit 100 in the embodiment of the present invention.

FIG. 14 is a timing chart of the fourth exemplary embodiment of the analog scan circuit 100 in the embodiment of the present invention. In this fourth exemplary embodiment, the control signals WCNT1 to WCNT3 are individually set to an H state, thus allowing analog signals to be output to the output terminals VOUT1 to VOUT3.

In this example, the scan-in signal Sin exhibits individual analog values B1 at time T1, C1 at time T3, B3 at time T5, B4 at time T7, A1 at time T9, B6 at time T11, and C2 at time T13. This scan-in signal Sin is supplied between the gate electrode 211 and the diffusion layer region 221 at the timing at which the clock signal SAck is turned into an H state, and electric charge is charged. Then, the clock signals SAck and SBck are controlled, thus allowing the accumulated electric charge to be transferred from leftward to rightward.

At time T4, on the occasion that the clock signal Wck is turned into an H state, all the output terminals VOUT1 to VOUT3 are brought into to an H state. Thus, the analog value C1 is output to the output terminal VOUT1, the analog value B1 is output to the output terminal VOUT2, and the analog value "0" is output to the output terminal VOUT3.

At time T8, on the occasion that the clock signal Wck is turned into an H state, only the output terminal VOUT2 is brought into an H state. Thus, the analog value B3 is output to the output terminal VOUT2, and the outputs of the other output terminals VOUT1 and VOUT3 do not change.

Similarly, at time T10, on the occasion that the clock signal Wck is turned into an H state, only the output terminal VOUT2 is brought into an H state. Thus, the analog value B4 is output to the output terminal VOUT2, and the outputs of the other output terminals VOUT1 and VOUT3 do not change.

In addition, at time T14, on the occasion that the clock signal Wck is turned into an H state, all the output terminals VOUT1 to VOUT3 are brought into an H state. Thus, the analog value C2 is output to the output terminal VOUT1, the analog value B6 is output to the output terminal VOUT2, and the analog value A1 is output to the output terminal VOUT3. In this case, when one half the period of the clock signal SAck or SBck is represented by 1 T, the output period in this fourth exemplary embodiment becomes equal to 2 T.

Figure 15:
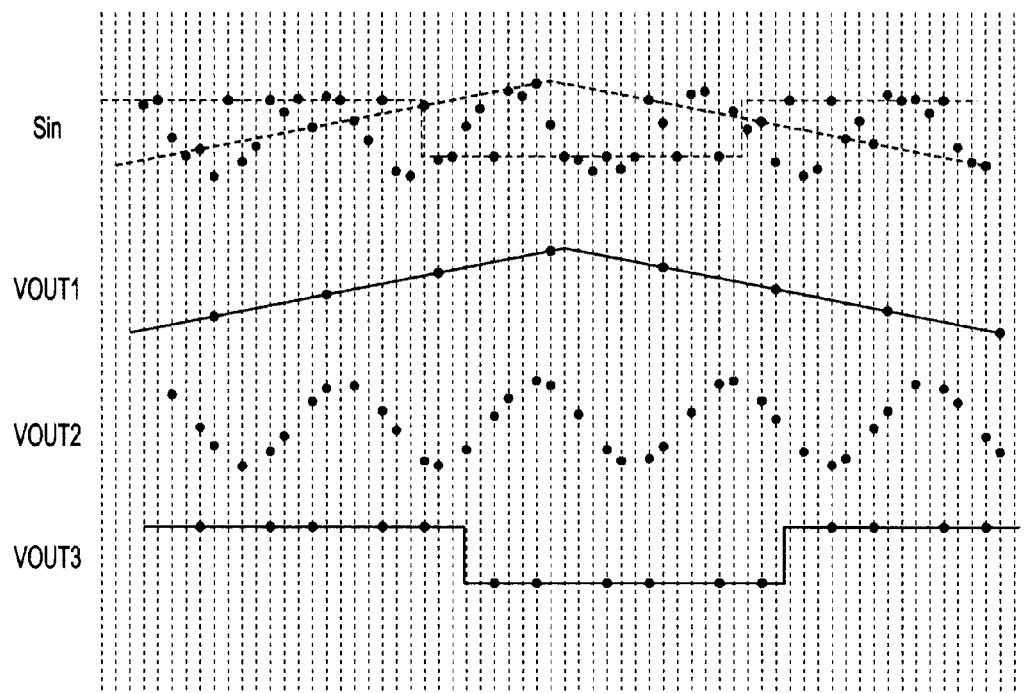
FIG. 15 is an example of signals from a scan-in terminal Sin for the fourth exemplary embodiment of the analog scan circuit 100 in the embodiment of the present invention.

FIG. 15 is an example of signals from the scan-in terminal Sin for the fourth exemplary embodiment of the analog scan circuit 100 in the embodiment of the present invention.

The scan-in signal Sin contains the respective signals to be output to the output terminals VOUT1 to VOUT3. Here, the signal to be output to the output terminal VOUT1 is a triangular wave that slowly changes, the signal to be output to the output terminal VOUT2 is a high-frequency sine wave, and the signal to be output to the output terminal VOUT3 is a slightly-high-frequency binary signal.

In a case where such signals are envisaged, it is possible to efficiently utilize each cell by reducing the length of the output period for a high-frequency signal and increasing the length of the output period for a low-frequency signal. According to the fourth exemplary embodiment described above, since it is possible to individually control output terminals, it is possible to determine the output intervals in accordance with the nature of the signals.

Figure 16:
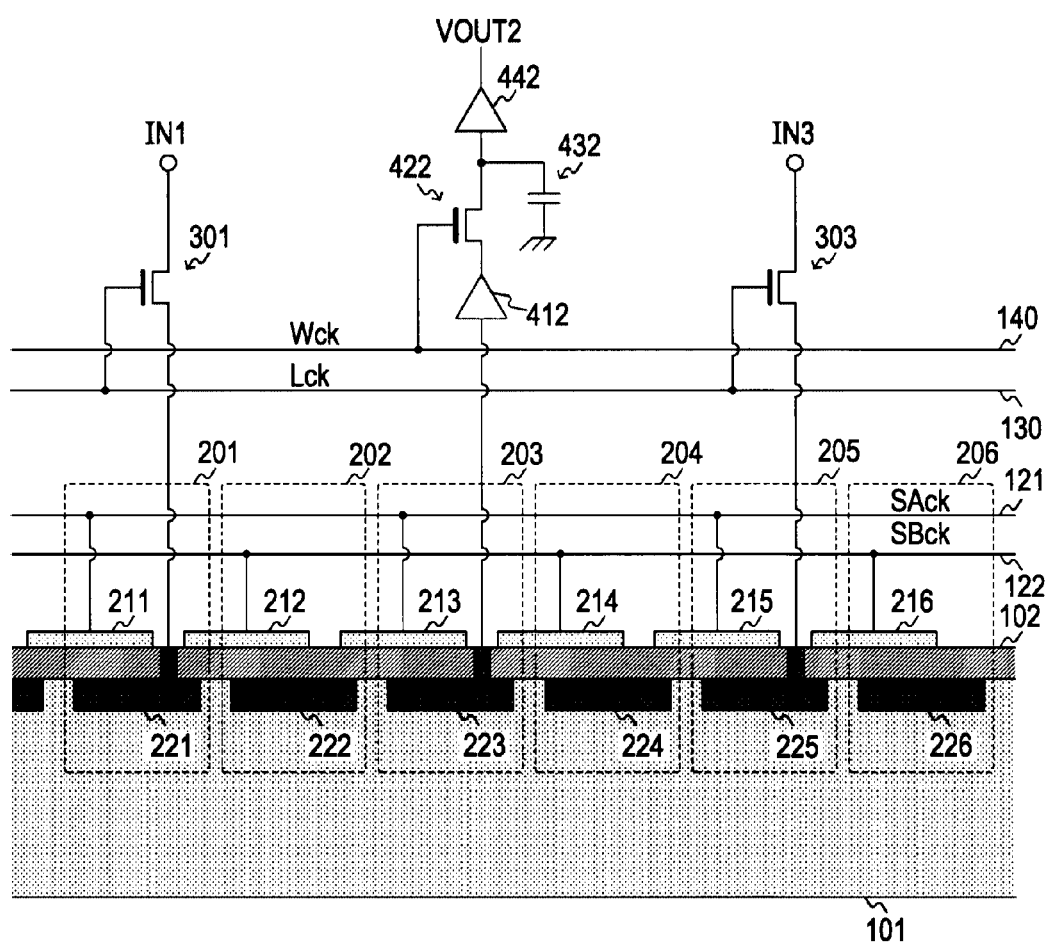
FIG. 16 is a conceptual diagram illustrating a fifth exemplary embodiment of the analog scan circuit 100 in the embodiment of the present invention.
Figure 17:
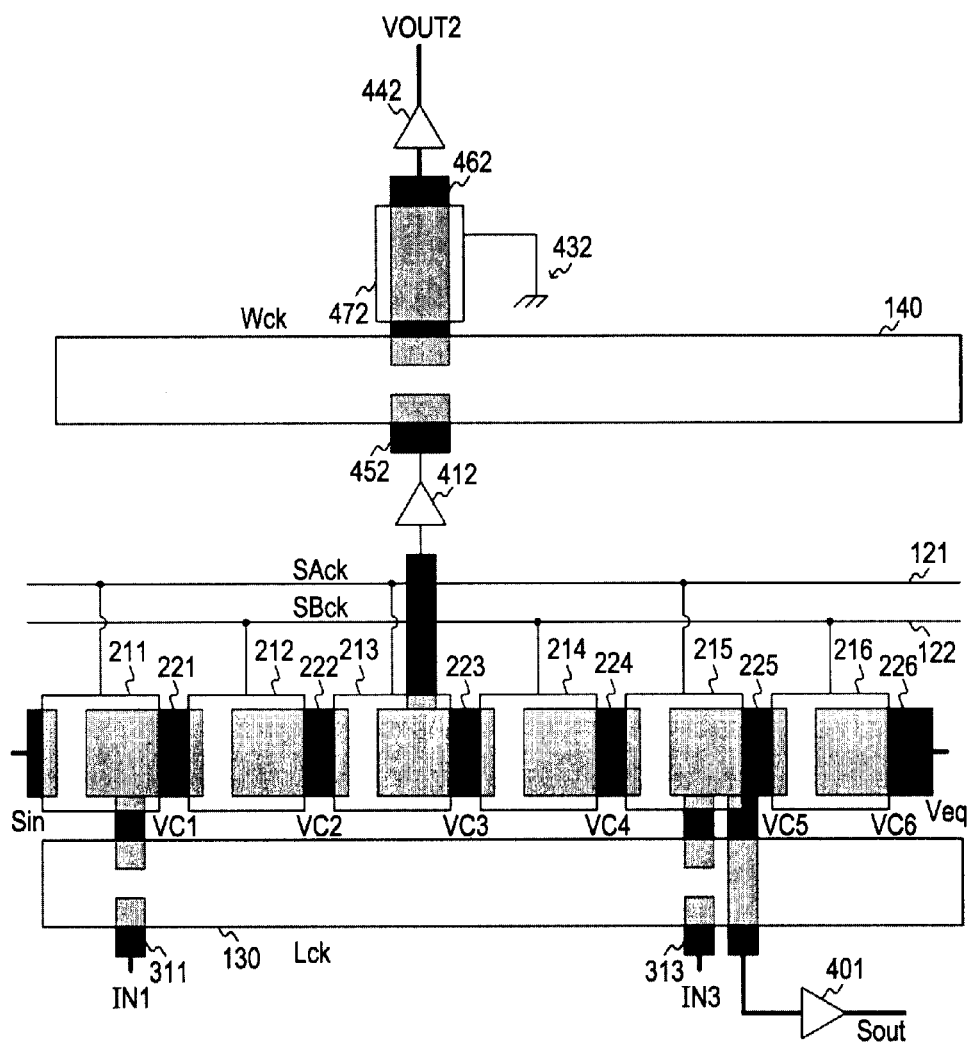
FIG. 17 is a layout diagram illustrating the fifth exemplary embodiment of the analog scan circuit 100 in the embodiment of the present invention.

FIG. 16 is a conceptual diagram illustrating a fifth exemplary embodiment of the analog scan circuit 100 in the embodiment of the present invention. In addition, FIG. 17 is a layout diagram illustrating the fifth exemplary embodiment of the analog scan circuit 100 in the embodiment of the present invention. In this fifth exemplary embodiment, the transistor 301 is connected to the diffusion layer region 221, an electric charge/voltage conversion amplifier 412 is connected to the diffusion layer region 223, and the transistor 303 is connected to the diffusion layer region 225. In addition, an electric charge/voltage conversion amplifier 401 is connected to the diffusion layer region 225, and the output of this electric charge/voltage conversion amplifier 401 is supplied to the scan-out terminal Sout.

The input terminal IN1 is connected to one end of the transistor 301, and the input terminal IN3 is connected to one end of the transistor 303. A load clock signal line 130 is connected to the gates of the transistors 301 and 303. A load control signal Lck is supplied to this clock signal line 130. Thus, if the clock signal Lck is in an H state, the transistors 301 and 303 are turned into an on state, and the analog signals of the input terminals IN1 and IN3 are supplied to the diffusion layer region 221 and 225. The analog signals supplied in this manner allow electric charge to be charged in the respective capacitance between the gate electrodes 211 and 215 and the diffusion layer regions 221 and 225. Then, when the clock signal Lck is turned into an L state, the transistors 301 and 303 are turned into an off state, and the charging of the electric charge is stopped.

The output of the electric charge/voltage conversion amplifier 412 is added to a transistor 422 from a diffusion layer region 452. The output clock signal Wck is supplied to the gate of the transistor 422 via the clock signal line 140. When this clock signal Wck is in an H state, the transistor 422 is turned into an on state, and a capacitor 432 constituted by a diffusion layer region 462 and an electrode 472 is charged. In addition, when the clock signal Wck is in an L state, the transistor 422 is turned into an off state, and the charged voltage value is held. In this manner, the transistor 422 and the capacitor 432 constitute a sample and hold circuit. An amplifier 442 is connected to the output of this sample and hold circuit, and the output thereof is supplied to the output terminal VOUT2.

That is, this fifth exemplary embodiment is designed to simultaneously implement the first exemplary embodiment illustrated in FIG. 3 and the third exemplary embodiment illustrated in FIG. 10. Accordingly, the operation thereof is a combination of both operations.

Figure 18:
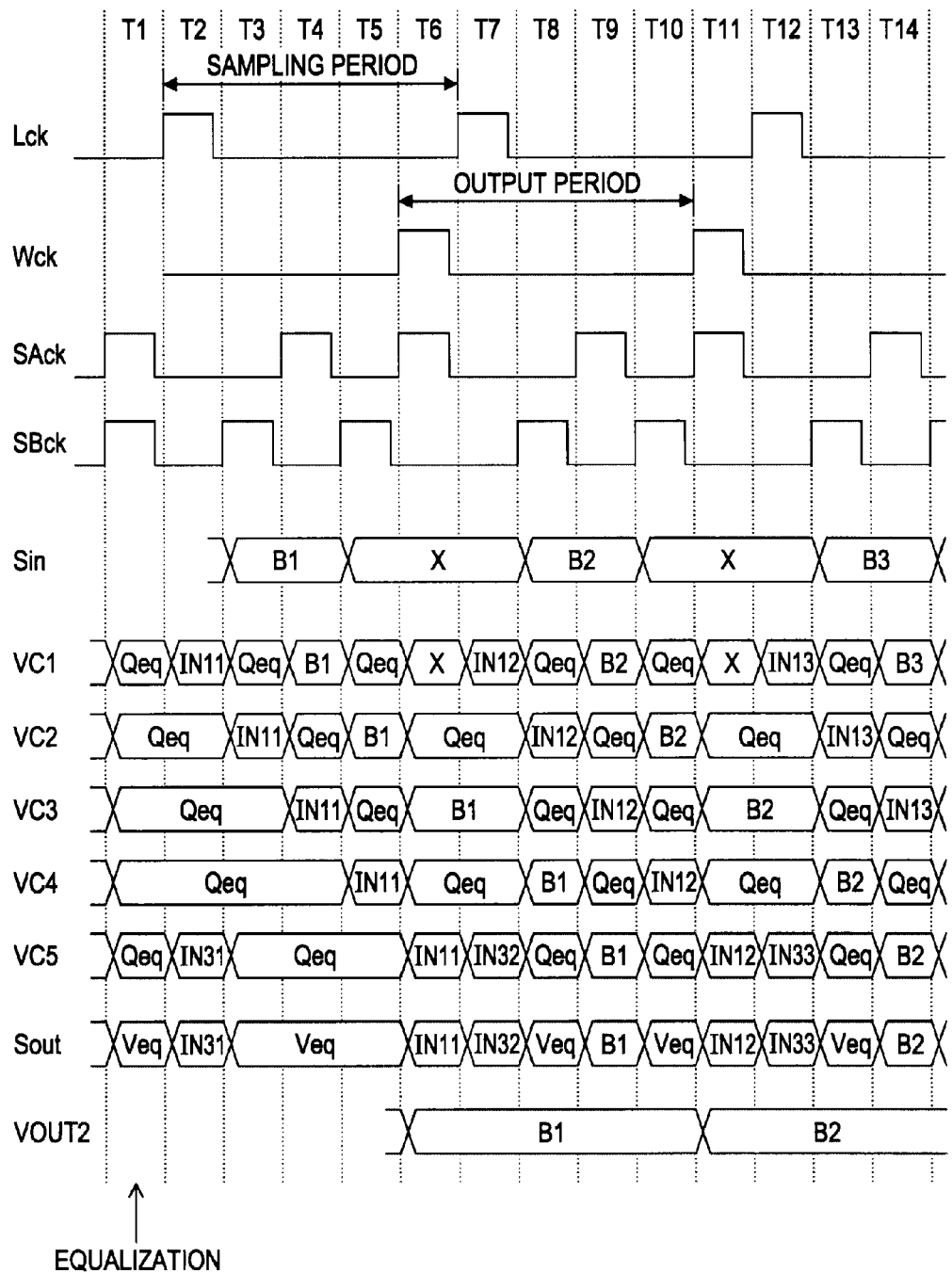
FIG. 18 is a timing chart of the fifth exemplary embodiment of the analog scan circuit 100 in the embodiment of the present invention.

FIG. 18 is a timing chart of the fifth exemplary embodiment of the analog scan circuit 100 in the embodiment of the present invention. In this fifth exemplary embodiment, at the timing at which the clock signal Lck is turned into an H state, analog signals are supplied from the input terminals IN1 and IN3, and electric charge is respectively charged between the gate electrodes 211 and 215 and the diffusion layer regions 221 and 225. In addition, at the timing at which the clock signal SAck is turned into an H state, an analog signal is supplied from the scan-in terminal Sin, and electric charge is charged between the gate electrode 211 and the diffusion layer region 221. Then, the clock signals SAck and SBck are controlled, thus allowing the accumulated electric charge to be transferred from leftward to rightward.

In addition, at the timing at which the clock signal Wck is turned into an H state, the potential equivalent to the electric charge that has been charged between the gate electrode 213 and the diffusion layer region 223 is output to the output terminal VOUT2.

In this fifth exemplary embodiment, when one half the period of the clock signal SAck or SBck is represented by 1 T, both the sampling period and the output period become equal to 5 T.

Note that since the BBD in the embodiment of the present invention transfers an analog signal using electric charge transfer, in some cases, the electric charge may leak midway and the amount of electric charge may attenuate. This signal is a known single input from outside via the scan-in terminal Sin, and the amount of change in electric charge can be corrected using a read voltage. For example, since both the signal B1 of the scan-out terminal Sout at time T9 and the signal B2 at time T14 are known, voltage adjustment can be implemented by correction based on both signals. In addition, also in a case where the analog scan circuit 100 has failure, the output of this scan-out terminal Sout can be used in order to test the analog scan circuit 100 itself.

Figure 19:
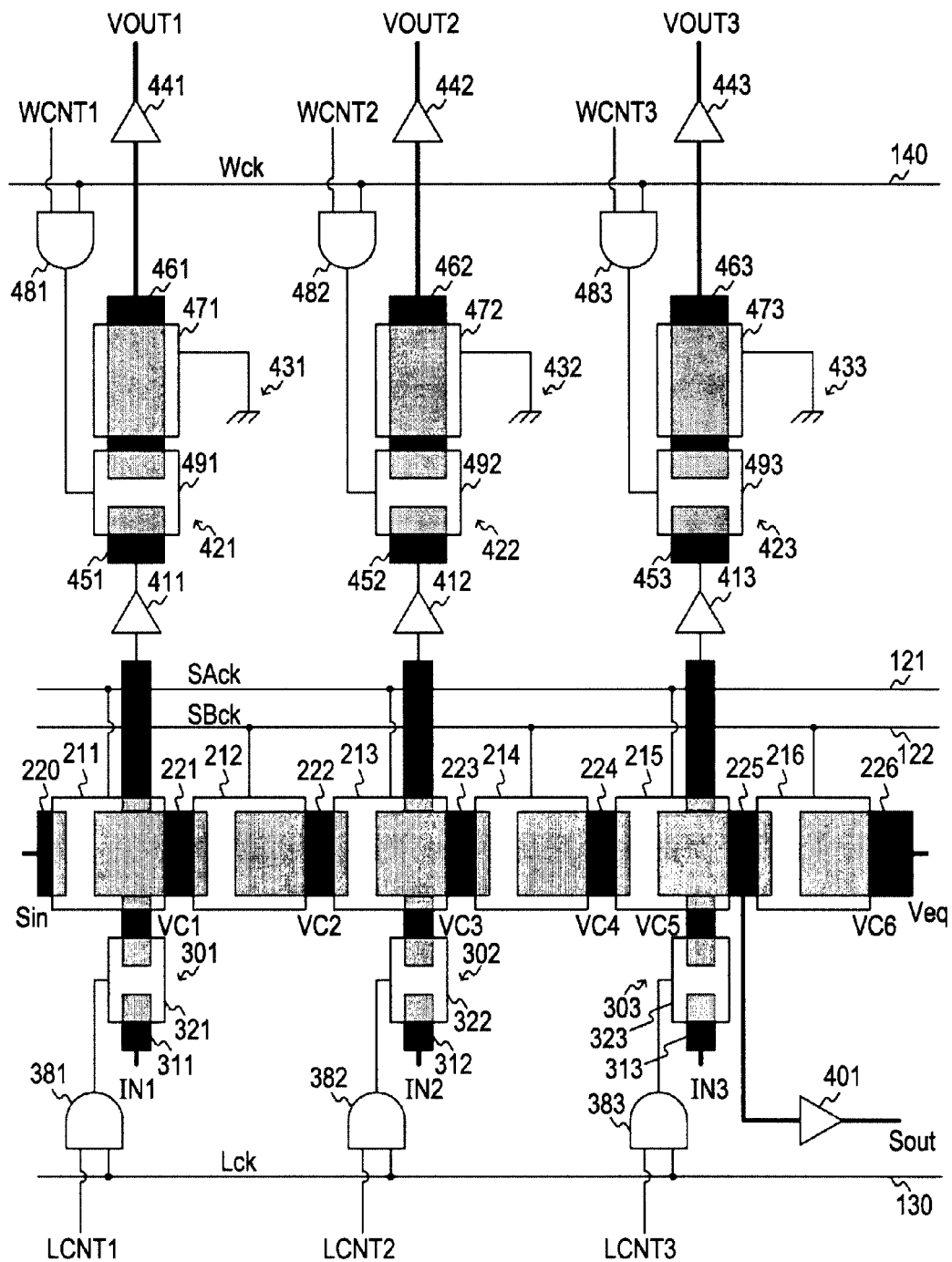
FIG. 19 is a layout diagram illustrating a sixth exemplary embodiment of the analog scan circuit 100 in the embodiment of the present invention.

FIG. 19 is a layout diagram illustrating a sixth exemplary embodiment of the analog scan circuit 100 in the embodiment of the present invention. In this sixth exemplary embodiment, the transistors 301 to 303 and the electric charge/voltage conversion amplifiers 411 to 413 are connected to the diffusion layer regions 221, 223 and 225, respectively.

That is, this sixth exemplary embodiment is designed to simultaneously implement the second exemplary embodiment illustrated in FIG. 6 and the fourth exemplary embodiment illustrated in FIG. 13. Accordingly, the operation thereof is a combination of both operations. In this regard, in the second exemplary embodiment illustrated in FIG. 6, the OR between the clock signal Lck and the control signals LCNT1 to LCNT3 is generated whereas in this sixth exemplary embodiment, the AND therebetween is generated by AND gates 381 to 383. The basic operation is similar and, for example, in order to select only the IN1 and not to select the other IN2 and IN3, the clock signal Lck and the control signal LCNT1 may be set to an H state and the control signals LCNT2 and LCNT3 may be set to an L state.

Note that in this sixth exemplary embodiment, both input and output are connected to the same cell as general form; however, only either one can operate in the same cell at the same timing.

Figure 20:
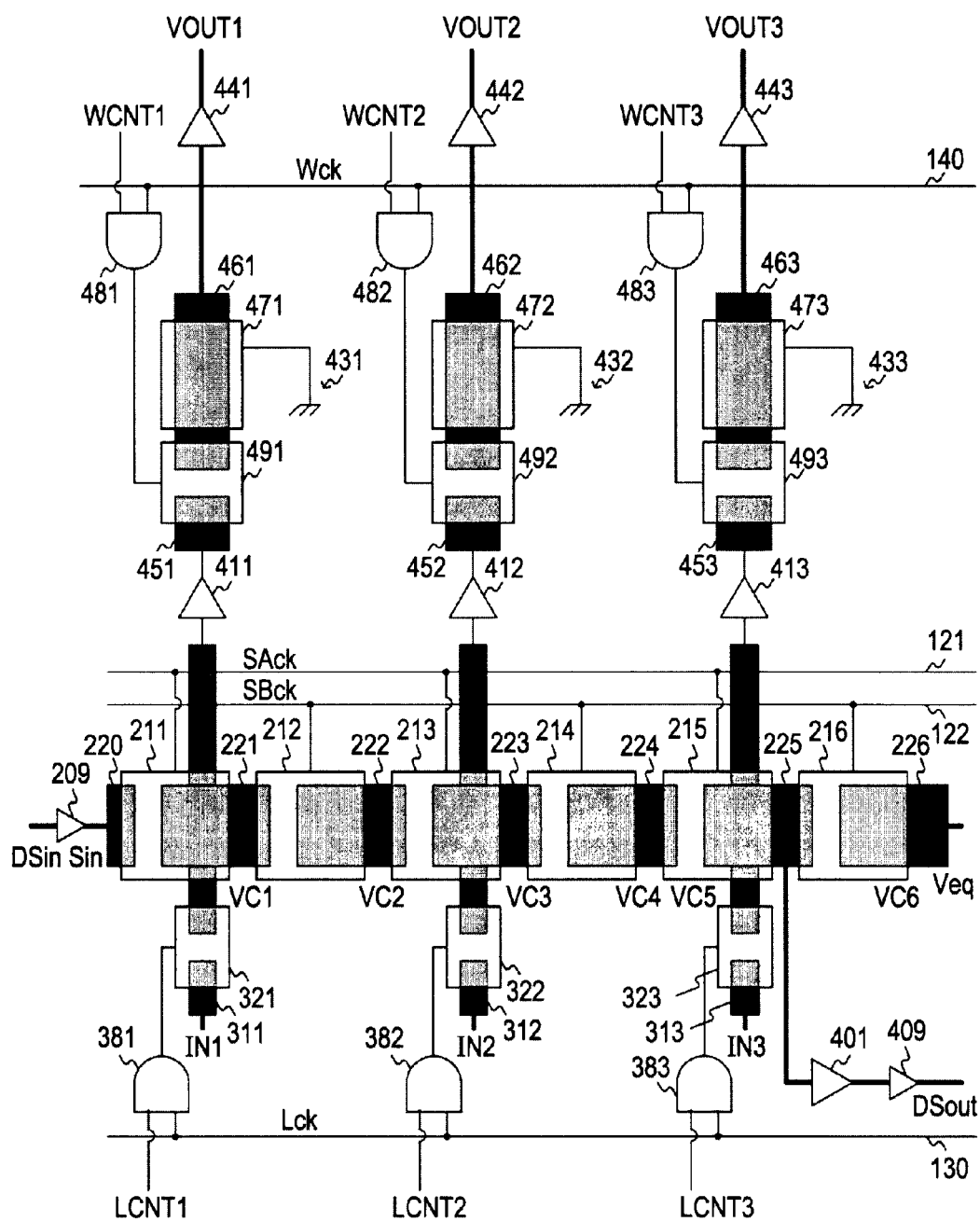
FIG. 20 is a layout diagram illustrating a seventh exemplary embodiment of the analog scan circuit 100 in the embodiment of the present invention.

FIG. 20 is a layout diagram illustrating a seventh exemplary embodiment of the analog scan circuit 100 in the embodiment of the present invention. This seventh exemplary embodiment is different from the sixth exemplary embodiment in that a D/A (Digital to Analog) converter 209 is connected to the scan-in terminal and that an A/D (Analog to Digital) converter 409 is connected to the scan-out terminal. Thus, it is made possible to input a digital signal from an LSI tester via the D/A converter 209 and, in addition, to output a digital signal to the LSI tester via the A/D converter 409.

In the case of measuring an analog LSI, it is general to apply a voltage based on an analog value from an LSI tester and to read the voltage based on the analog value. However, generally, the LSI tester quickly generates an analog signal, and is not so suitable for measurement. On the other hand, a digital signal could be quickly generated and measured by the LSI tester. In particular, in a case where internal signals are read from an LSI, rearranged, and subjected to filtering or signal processing, it is more easy to process the signals in a case where the signals are captured as digital data. Therefore, in this seventh exemplary embodiment, the D/A converter 209 and the A/D converter 409 are additionally provided.

The D/A converter 209 and the A/D converter 409 are appropriately used as necessary, and may be provided inside the LSI or outside the LSI. In a case where they are provided inside the LSI, which is called BIST (Built-In Self-Test), there is a merit in terms of conversion speed or noise resistance while there is also a demerit of increasing the chip area. On the other hand, in a case where they are provided outside the LSI, which is called BOST (Built-Out Self-Test), there are opposite advantages and disadvantages to those of BIST. The present invention can be applied to either case. The provision of the D/A converter 209 and the A/D converter 409 makes it possible to handle analog signals in a manner similar to that of digital data. In addition, this makes it possible to increase compatibility with, in particular, a digital/analog mixed LSI.

Note that in the foregoing exemplary embodiments, examples in which the analog value transfer function is implemented by a BBD have been explained; however, the present invention is not to be limited thereto, and it may be implemented by, for example, a CCD (Charge Coupled Device).

Figure 21:
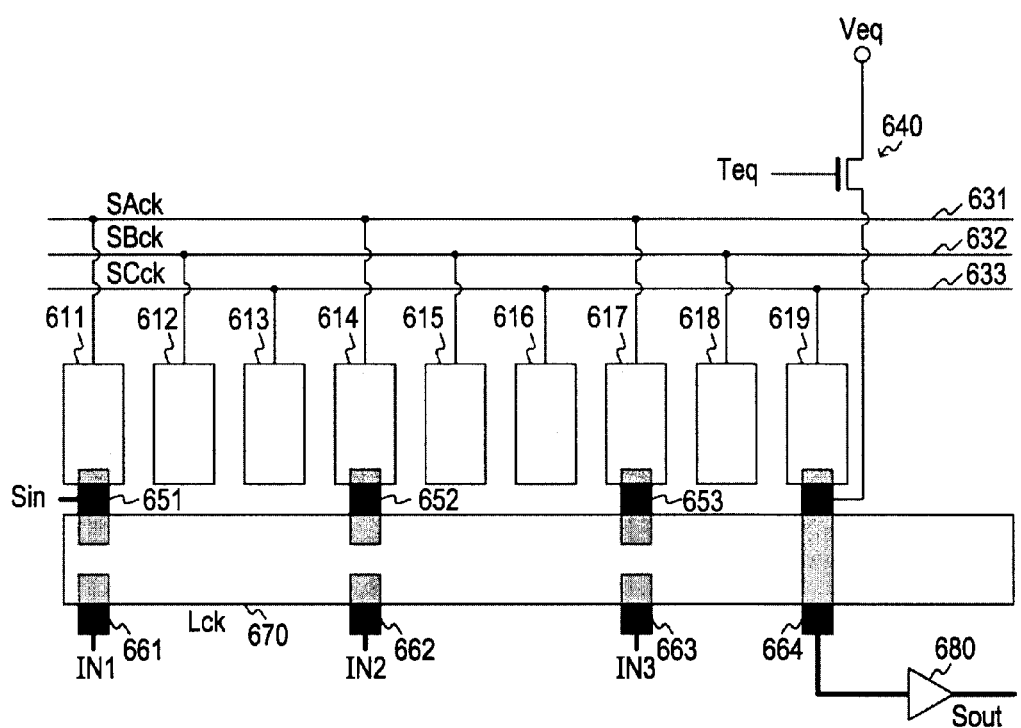
FIG. 21 is a layout diagram illustrating an eighth exemplary embodiment of the analog scan circuit 100 in the embodiment of the present invention.

FIG. 21 is a layout diagram illustrating an eighth exemplary embodiment of the analog scan circuit 100 in the embodiment of the present invention. This eighth exemplary embodiment is an example in which the analog value transfer function is implemented by a CCD. The CCD is configured by arranging two layers of polysilicon electrodes on the top of an oxide film on the top of a silicon substrate. In this CCD, adjacent depletion layers are coupled by applying voltage to electrodes, and the electric charge of adjacent capacitances is transferred by punch-through.

In this eighth exemplary embodiment, a CCD based on three-phase clock is envisaged, and each of electrodes 611 to 619 is connected to one of three clock signal lines 631 to 633. In addition, similarly to the first exemplary embodiment in FIG. 3, transistors whose gates are connected to a load clock signal line 670 are connected to the electrodes 611, 614 and 617. Input terminals IN1 to IN3 are connected to the other ends of the transistors. Note that the transistors are formed by pairs of diffusion layer regions 651 to 653 and 661 to 663 equivalent to the sources and drains and the clock signal line 670 equivalent to the gates.

In addition, an electric charge/voltage conversion amplifier 680 and a transistor 640 are connected to the electrode 619 via the diffusion layer region 664. With the electric charge/voltage conversion amplifier 680, a scan-out signal Sout is output to the scan-out terminal via the diffusion layer region 664. In addition, an equalization terminal Veq is connected to the other end of the transistor 640, and an equalization drive terminal Teq is connected to the gate. The equalization drive terminal Teq is set to an H state, thus allowing equalization to be performed through the diffusion layer region 664.

When the clock signal line 670 is brought into an H state, the analog signals from the input terminals IN1 to IN3 are supplied to electric charge accumulation regions (depletion layers) disposed underneath the electrodes 611, 614 and 617, and electric charge is accumulated. Then, three-phase clock signals SAck, SBck and SCck are set to an H state in sequence through the clock signal lines 631 to 633, thus allowing electric charge to be transferred from left to right. The transferred electric charge is sequentially input to the electric charge/voltage conversion amplifier 680, converted into voltage, and output to the scan-out terminal as a scan-out signal Sout.

In this manner, a CCD has a different electric charge transfer mechanism from a BBD, but the basic operation thereof is similar to that of the BBD. Note that in the eighth exemplary embodiment, a CCD based on three-phase clock is envisaged; however, CCDs based on multiphase clock such as two-phase or four-phase other than that above can be applied. For the structure of CCDs based on two-phase and four-phase clock, for example, Kazuya Yonemoto, "CCD/CMOS no imeji sensa no kiso to oyo (Basics and Application of CCD/CMOS Image Sensors)", (CQ Publishing Co., Ltd.) can be referred to.

Next, a specific application example of an embodiment of the present invention will be explained.

Figure 22:
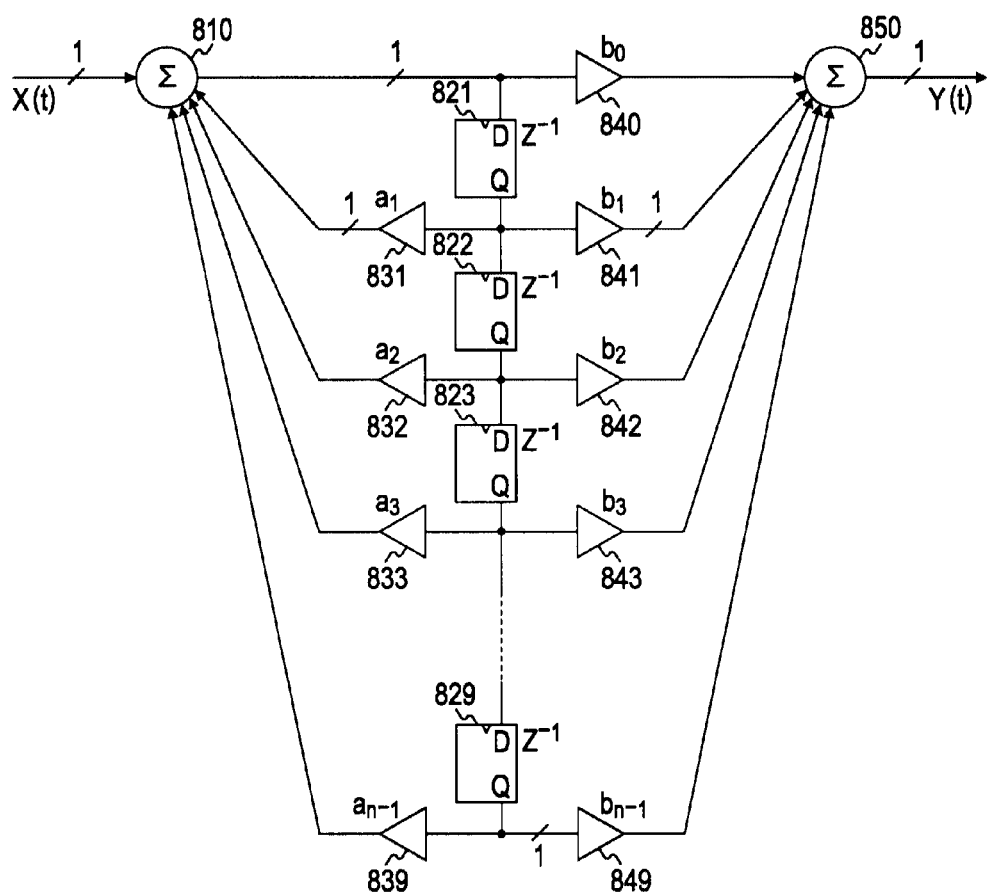
FIG. 22 is a diagram illustrating an example configuration of an IIR filter that uses an analog scan circuit in an embodiment of the present invention.

FIG. 22 is a diagram illustrating an example configuration of an IIR filter that uses an analog scan circuit in an embodiment of the present invention. The IIR (Infinite Impulse Response) filter is a filter (infinite impulse response filter) that provides a sequence of continuous impulse responses of a system over an infinite period of time. In many cases, the IIR filter is implemented as a digital filter and, in this case, each element is configured using a digital circuit. In contrast to this, in the embodiment of the present invention, each element is implemented by an analog circuit as follows.

An IIR filter in an embodiment of the present invention includes analog adders 810 and 850, analog multipliers 831 to 849, and analog synchronization circuits 821 to 829. The analog adder 810 is an adder that adds an input analog signal X(t) and the outputs of the analog multipliers 831 to 839. The analog adder 850 is an adder that adds the outputs of the analog multipliers 840 to 849. The analog multipliers 831 to 839 are multipliers that multiply the outputs of the analog synchronization circuits 821 to 829 by constants $a_1$ to $a_{n-1}$, respectively. The analog multipliers 840 to 849 are multipliers that multiply the outputs of the analog adder 810 and the analog synchronization circuits 821 to 829 by constants $b_0$ to $b_{n-1}$, respectively. The analog synchronization circuits 821 to 829 are delay devices each of which delays the output of the analog adder 810 by one sampling time. These analog synchronization circuits 821 to 829 can be implemented by analog scan circuits in an embodiment of the present invention.

That is, in the IIR filter in the embodiment of the present invention, the analog synchronization circuits 821 to 829 are implemented by analog scan circuits, thus enabling analog signals to be handled over the entire filter. Thus, the IIR filter can have fewer constituent elements than a conventional digital filter, and can reduce power consumption and cost. In addition, since it is possible to use a digital filter design technique, unlike a conventional analog filter, no adjustment of filter frequency characteristics is required, and it is possible to determine the frequency characteristics without dependence on LCR components.

Note that, here, an example configuration of an IIR filter that uses an analog scan circuit in an embodiment of the present invention has been explained; however, an analog scan circuit of the present invention can also be applied to an FIR filter in a similar manner. The FIR (Finite Impulse Response) filter is a filter (finite impulse response filter) that allows a sequence of impulse responses of a system to converge to 0 for a finite period of time.

Figure 23:
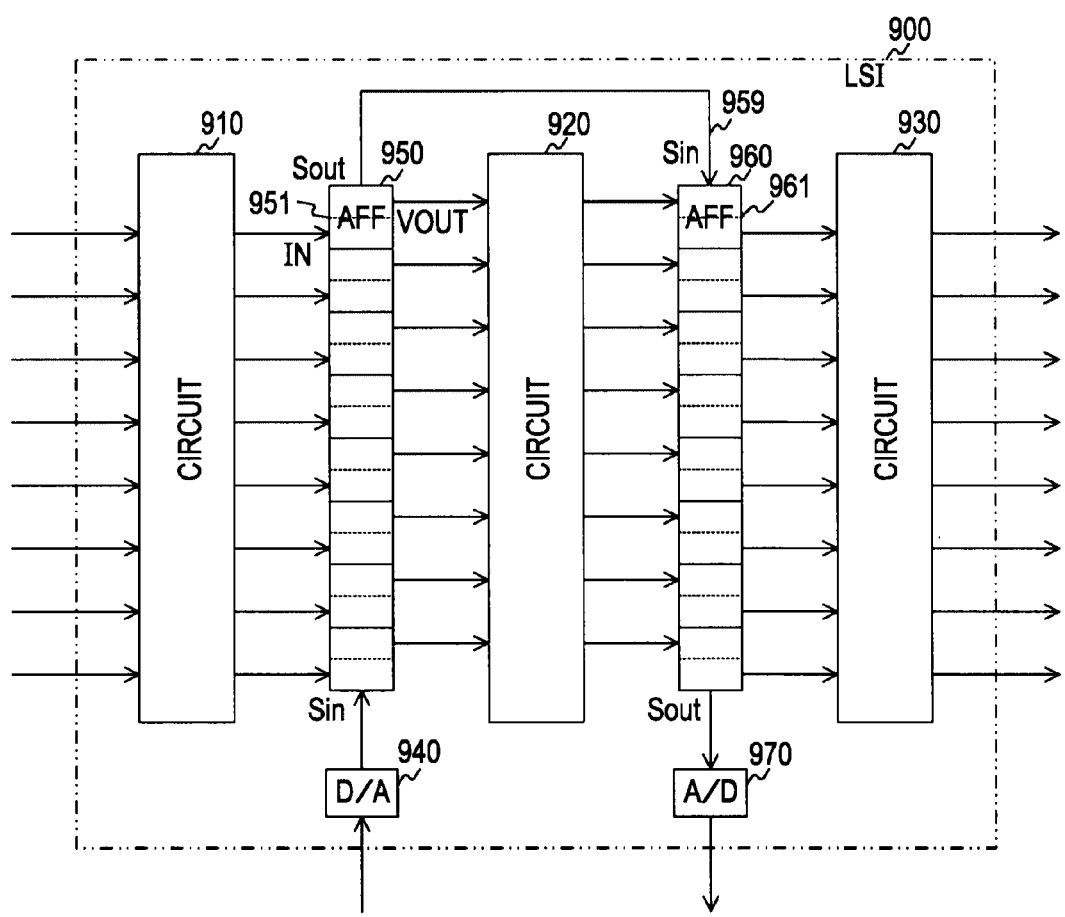
FIG. 23 is a diagram illustrating an example in a case where an analog scan circuit of an embodiment of the present invention is used for synchronization control of analog circuits.

FIG. 23 is a diagram illustrating an example in a case where an analog scan circuit of an embodiment of the present invention is used for synchronization control of analog circuits. In this example, an analog scan circuit 950 is inserted between circuits 910 and 920 in an LSI 900, and an analog scan circuit 960 is inserted between the circuit 920 and a circuit 930. The analog scan circuits 950 and 960 can include a plurality of 1-bit analog flip-flops (AFF) 951 and a plurality of 1-bit analog flip-flops (AFF) 961, respectively. Thus, the outputs of the circuit 910 are temporarily synchronized in the analog scan circuit 950, and are thereafter input to the circuit 920. Similarly, the outputs of the circuit 920 are temporarily synchronized in the analog scan circuit 960, and are thereafter input to the circuit 930.

The analog scan circuits 950 and 960 are connected using a scan chain 959, and form an integrated scan path. In addition, a D/A converter 940 is connected to a scan-in terminal of the analog scan circuit 950, and an A/D converter 970 is connected to a scan-out terminal of the analog scan circuit 960. Thus, an interface with an LSI tester, which is based on digital signals, is formed. That is, it is possible to read analog signals output from the circuit 910 or 920 at an arbitrary synchronized timing and, in addition, to set analog signals to be input to the circuit 920 or 930. The values held in the analog scan circuits 950 and 960 are analog values, and thus scan paths of analog signals can be implemented.

Note that these scan paths can be utilized even after the LSI is incorporated as an apparatus as well as during the investigation of the LSI alone. After the LSI is incorporated as an apparatus, the scan paths can be utilized for, for example, regular maintenance, log dump collection for analysis for failure, the execution of step and dump for investigation or the like in such cases (embedding a desired value at a desired location and collecting output data or the like of respective portions after an arbitrary clock, or dumping log) or a test program, or the like.

Figure 24:
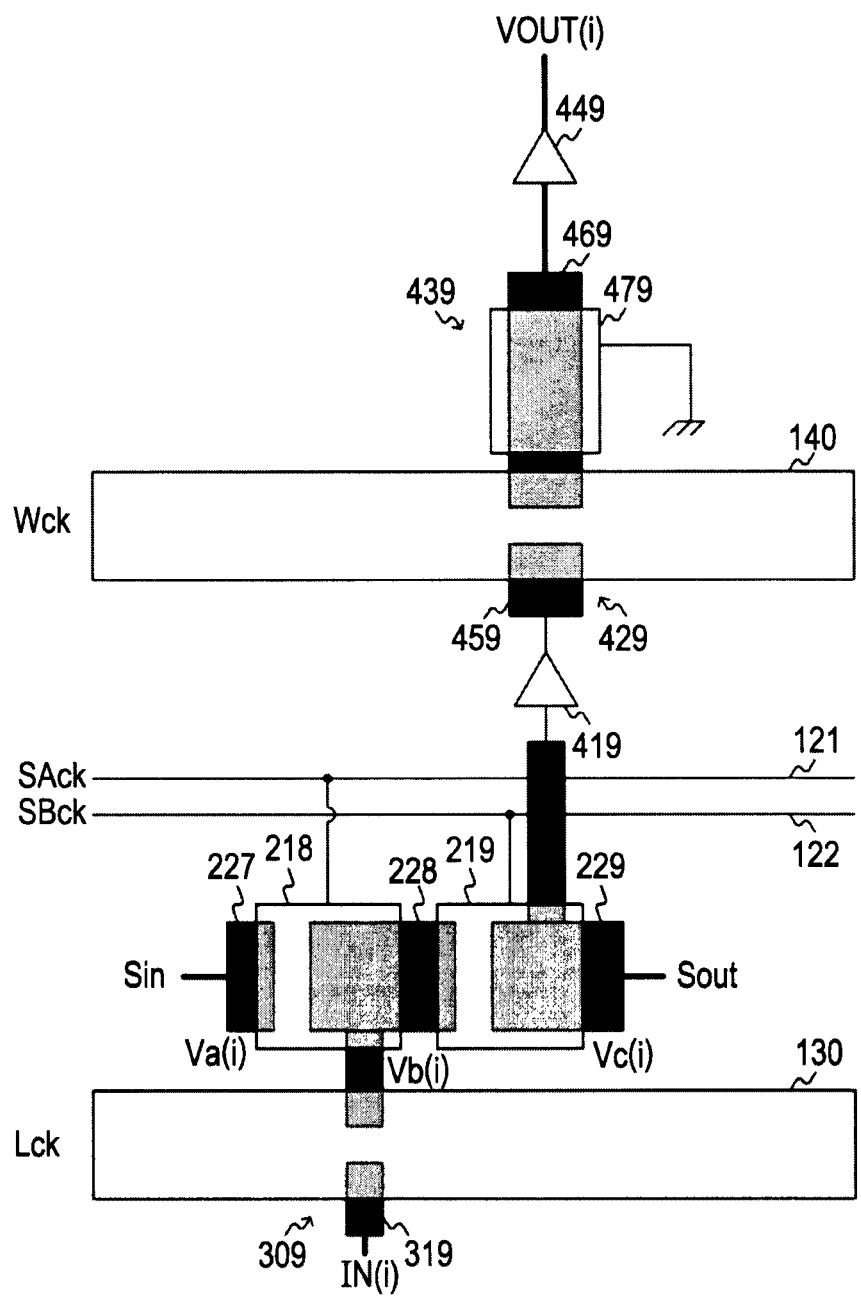
FIG. 24 is a layout diagram in a case where an analog scan circuit of an embodiment of the present invention is used for synchronization control of analog circuits.

FIG. 24 is a layout diagram in a case where an analog scan circuit of an embodiment of the present invention is used for synchronization control of analog circuits. Here, gate electrodes 218 and 219 and diffusion layer regions 228 and 229 are illustrated as one of analog flip-flops (AFF) (the unit equivalent to a single analog signal). A SAck is supplied to the gate electrode 218 using a clock signal line 121, and a SBck is supplied to the gate electrode 219 using a clock signal line 122. In addition, a signal from a shift-in terminal Sin is supplied to a diffusion layer region 227 disposed underneath the gate electrode 218. Then, a shift-out signal is output from the diffusion layer region 229 via the shift-out terminal Sout. In this configuration, an operation that is conceptually similar to that of a 1-bit master-slave type flip-flop having a scan function in a digital circuit is performed. In this case, it is considered that the potential Vb(i) of the diffusion layer region 228 and the potential Vc(i) of the diffusion layer region 229 correspond to the output of a master-side latch and the output of a slave-side latch, respectively. Note that this analog flip-flop duly constitutes a portion of a scan path.

A transistor 309 whose gate is connected to a signal line 130 is connected to the diffusion layer region 228. An input terminal IN(i) is connected to the other end of this transistor 309. An electric charge/voltage conversion amplifier 419 is connected to the diffusion layer region 229. A transistor 429 whose gate is connected to a signal line 140 is connected to this electric charge/voltage conversion amplifier 419. A capacitor 439 and an amplifier 449 are connected to the other end of this transistor 429. The transistor 429 and the capacitor 439 constitute a sample and hold circuit.

Note that the gate electrode 218 and the diffusion layer region 228 are examples of input analog value holding means described in the claims. In addition, the gate electrode 219 and the diffusion layer region 229 are examples of output analog value holding means described in the claims. In addition, the transistor 309 is an example of input means or first or second input means described in the claims. In addition, the gate electrode 218 and the diffusion layer region 227 are examples of input means or first or second input means described in the claims. In addition, the transistor 429 is an example of output means described in the claims.

Figure 25:
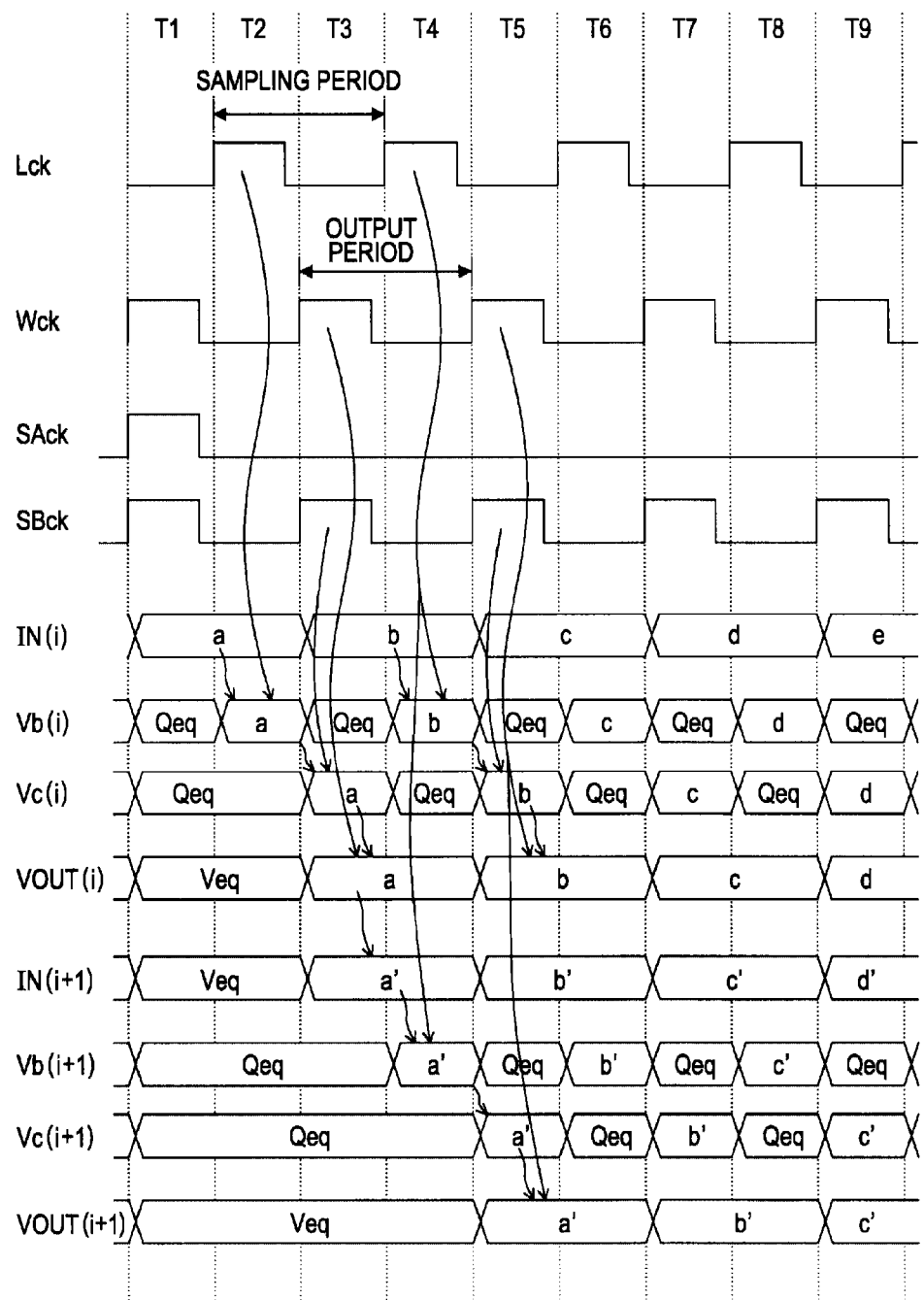
FIG. 25 is a timing chart in a case where an analog scan circuit in an embodiment of the present invention is used for synchronization control of analog circuits.

FIG. 25 is a timing chart in a case where an analog scan circuit in an embodiment of the present invention is used for synchronization control of analog circuits. The subscript "(i)" is added to the analog flip-flop in the i-th stage, and the subscript "(i+1)" is added to the analog flip-flop in the (i+1)-th stage.

At time T1, both the clock signals SAck and SBck are brought into an H state. Thus, the movable electric charge in the diffusion layer regions 228 and 229 (Vb(i), Vc(i), Vb(i+1), Vc(i+1)) becomes equal to the initial value (Qeq).

At time T2, the clock signal Lck is brought into an H state. Thus, an analog signal "a" input to the input terminal IN(i) is supplied between the gate electrode 218 and the diffusion layer region 228, and electric charge is accumulated (Vb(i)).

At time T3, the clock signal SBck is brought into an H state. Thus, the electric charge "a" held between the gate electrode 218 and the diffusion layer region 228 is transferred between the gate electrode 219 and the diffusion layer region 229 (Vc(i)). In addition, at this time, the write clock signal Wck is brought into an H state. Thus, the potential equivalent to the electric charge "a" transferred between the gate electrode 219 and the diffusion layer region 229 is output to the output terminal VOUT(i).

On the basis of the signal potential output from the output terminal VOUT(i) of the analog flip-flop in the i-th stage (for example, the analog scan circuit 950 in FIG. 23), the circuit in the subsequent stage (for example, the circuit 920 in FIG. 23) operates. In FIG. 25, the apostrophe sign is added to signals generated in this circuit in the subsequent stage. For example, the signal "a" output from the output terminal VOUT(i) at time T3 is processed by the circuit in the subsequent stage, and is input to the input terminal IN(i+1) of the analog flip-flop in the (i+1)-th stage as a signal "a'".

At time T4, the clock signal Lck is brought into an H state. Thus, a signal "b" input to the IN(i) in the i-th stage is supplied to the Vb(i), and electric charge is accumulated. Similarly, the signal "a'" input to the IN(i+1) in the (i+1)-th stage is supplied to the Vb(i+1), and electric charge is accumulated.

In addition, at time T5, the clock signal SBck is brought into an H state. Thus, the electric charge "b" accumulated in the Vb(i) is transferred to the Vc(i), and the electric charge "a'" accumulated in the Vb(i+1) is transferred to the Vc(i+1). In addition, at this time, the write clock signal Wck is brought into an H state. Thus, the potential equivalent to the electric charge "b" transferred to the Vc(i) is output to the output terminal VOUT(i), and the potential equivalent to the electric charge "a'" transferred to the Vc(i+1) is output to the output terminal VOUT(i+1).

Subsequently to this, the operation is repeated in a similar way. In this case, when one half the period of the clock signal SBck is represented by 1 T, both the sampling period and the output period become equal to 2 T. That is, the clock signals Lck and Wck are shifted by half the period and applied, thus allowing an analog scan circuit to receive analog signals from the analog circuit in the preceding stage, temporarily synchronize them, and supply the analog signals to the resulting analog circuit in the subsequent stage.

Figure 26:
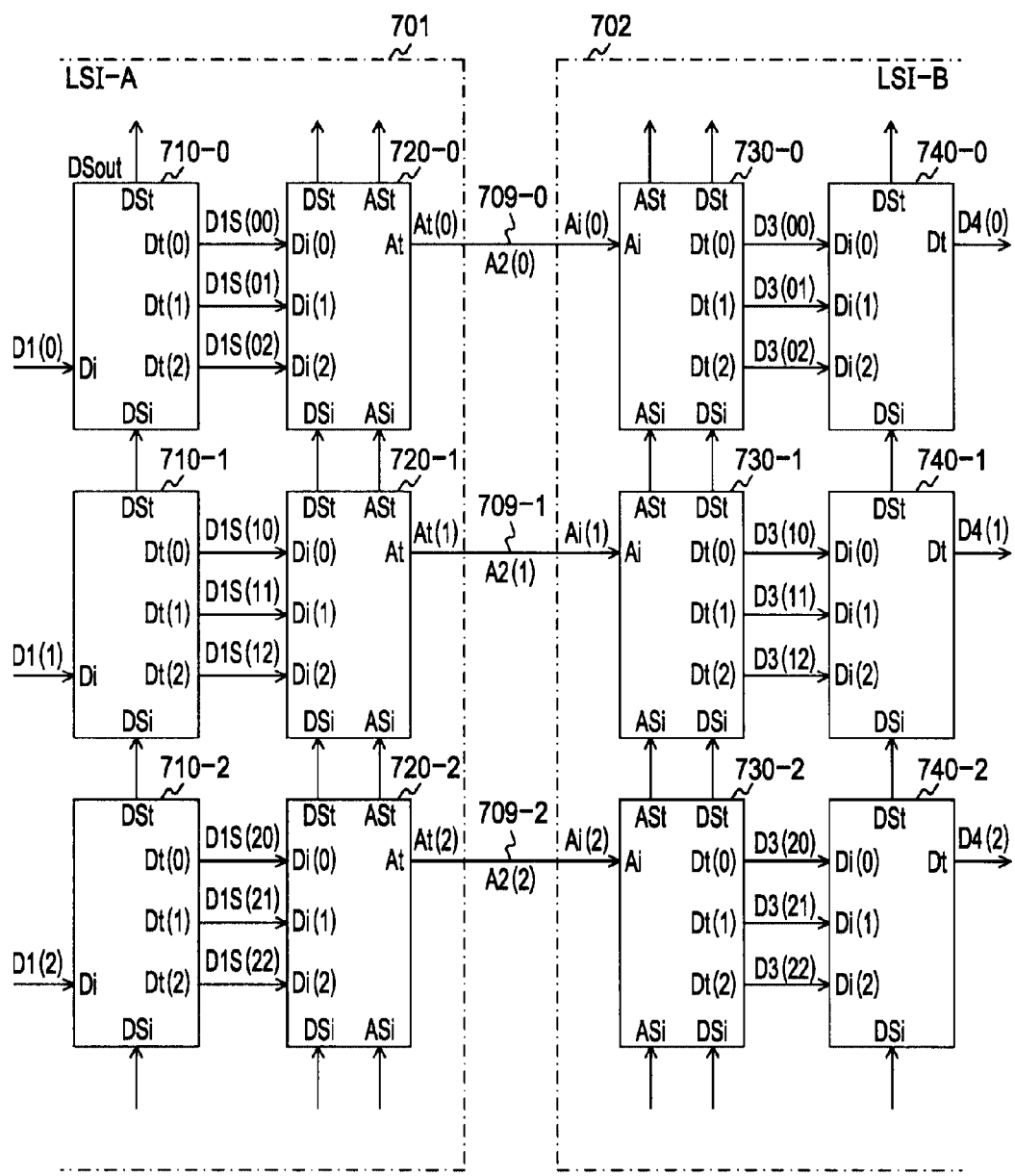
FIG. 26 is a diagram illustrating an example of inter-LSI transfer using an analog scan circuit in an embodiment of the present invention.

FIG. 26 is a diagram illustrating an example of inter-LSI transfer using an analog scan circuit in an embodiment of the present invention. Here, an example configuration in a case where an analog signal is transferred from an LSI-A 701 to an LSI-B 702 will be explained.

The LSI-A 701 includes shift circuits 710-0 to 710-2 that perform a shift operation upon receipt of a digital signal, and analog conversion circuits 720-0 to 720-2 that convert from digital signal to analog signal. It is envisaged that this LSI-A 701 is connected to the LSI-B 702 using three analog signal lines 709-0 to 709-2 and is provided with three circuits for each. However, this is not to be taken in a limiting sense. Each of the shift circuits 710-0 to 710-2 is referred to as a shift circuit 710. In addition, each of the analog conversion circuits 720-0 to 720-2 is referred to as an analog conversion circuit 720.

The LSI-B 702 includes digital conversion circuits 730-0 to 730-2 that convert analog signals to digital signals, and selection circuits 740-0 to 740-2 each of which sequentially selects one of a plurality of digital signals. It is also envisaged that this LSI-B 702 is connected to the LSI-A 701 using the three analog signal lines 709-0 to 709-2 and is provided with three circuits for each. However, this is not to be taken in a limiting sense. Each of the digital conversion circuits 730-0 to 730-2 is referred to as a digital conversion circuit 730. In addition, each of the selection circuits 740-0 to 740-2 is referred to as a selection circuit 740.

Figure 27:
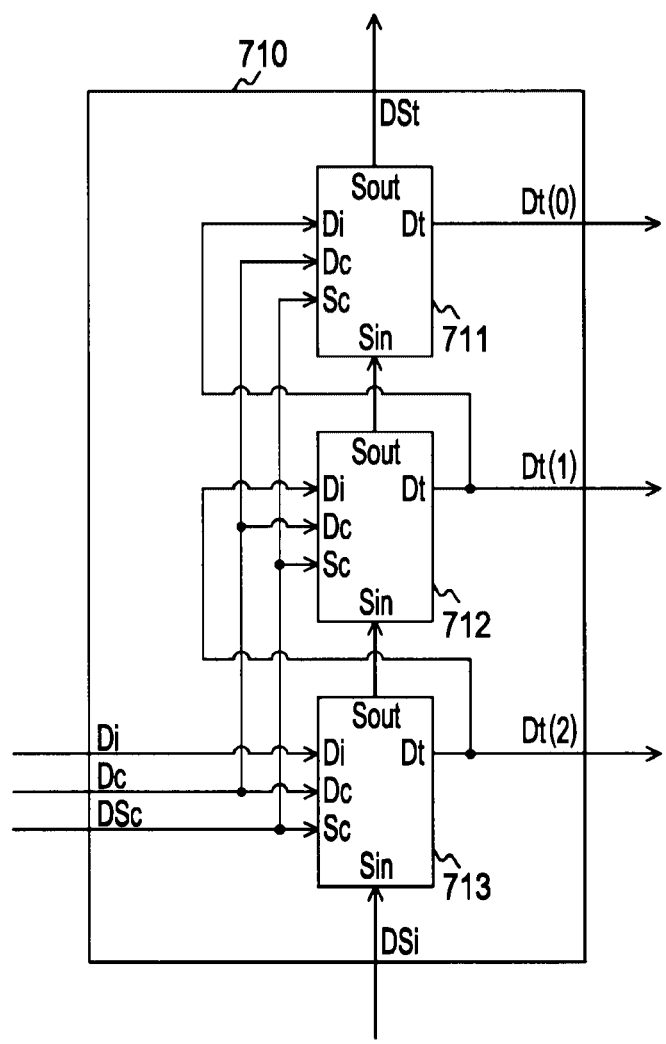
FIG. 27 is a diagram illustrating an example configuration of a shift circuit 710 in the embodiment of the present invention.

FIG. 27 is a diagram illustrating an example configuration of the shift circuit 710 in the embodiment of the present invention. This shift circuit 710 includes flip-flop circuits 711 to 713, and has a configuration in which they are connected in series. The flip-flop circuits 711 to 713 are circuits that hold and output input digital signals.

A data input terminal Di of the shift circuit 710 is connected to a data input terminal Di of the flip-flop circuit 713 in the first stage. A data output terminal Dt of the flip-flop circuit 713 in the first stage is connected to a data input terminal Di of the flip-flop circuit 712 in the second stage. A data output terminal Dt of the flip-flop circuit 712 in the second stage is connected to a data input terminal Di of the flip-flop circuit 711 in the third stage. The data output terminals Dt of the flip-flop circuits 711 to 713 are connected to data output terminals Dt(0) to Dt(2) of the shift circuit 710.

A scan input terminal Dsi of the shift circuit 710 is connected to a scan input terminal Sin of the flip-flop circuit 713 in the first stage. A scan output terminal Sout of the flip-flop circuit 713 in the first stage is connected to a scan input terminal Sin of the flip-flop circuit 712 in the second stage. A scan output terminal Sout of the flip-flop circuit 712 in the second stage is connected to a scan input terminal Sin of the flip-flop circuit 711 in the third stage. A scan output terminal Sout of the flip-flop circuit 711 in the third stage is connected to a scan output terminal DSt of the shift circuit 710.

Data clock terminals Dc of the flip-flop circuits 711 to 713 are connected to a data clock terminal Dc of the shift circuit 710. In addition, scan clock terminals Sc of the flip-flop circuits 711 to 713 are connected to a scan clock terminal DSc of the shift circuit 710.

Figure 28:
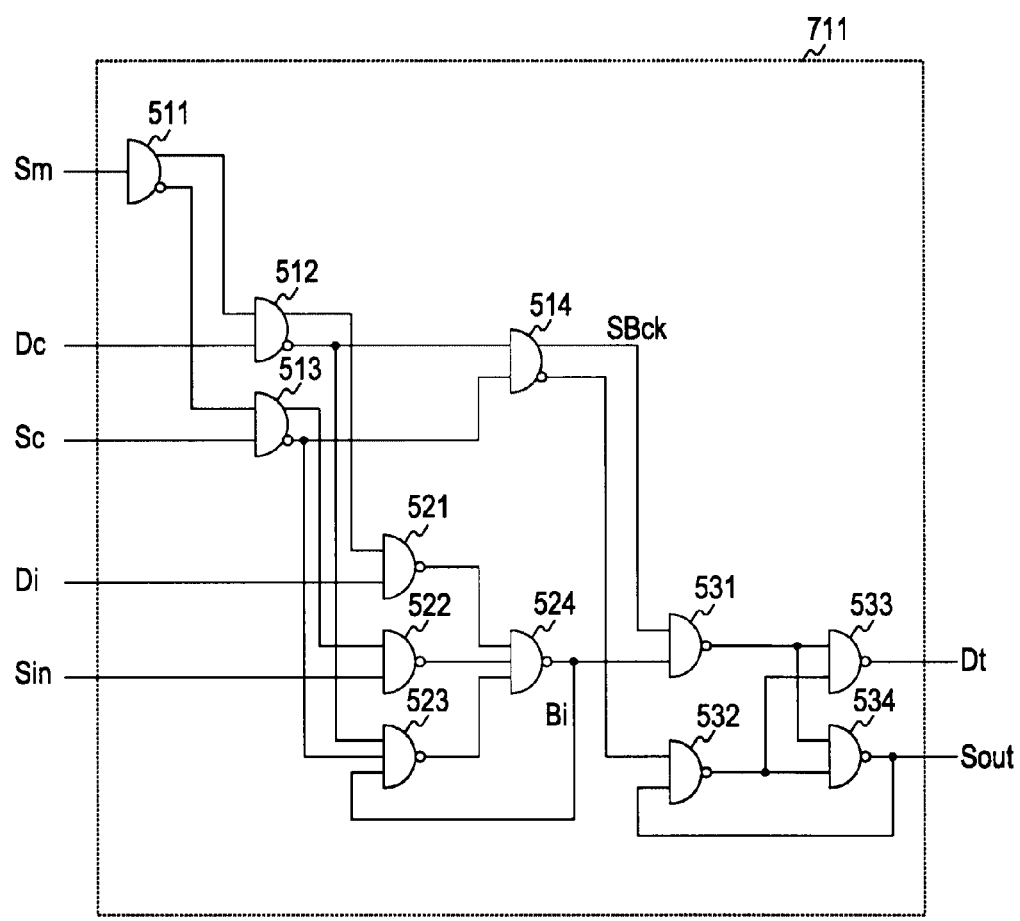
FIG. 28 is a diagram illustrating an example configuration of a flip-flop circuit 711 in the embodiment of the present invention.

FIG. 28 is a diagram illustrating an example configuration of the flip-flop circuit 711 in the embodiment of the present invention. Here, an example configuration of the flip-flop circuit 711 will be explained; however, the other flip-flop circuits 712 and 713 also have similar configurations. The flip-flop circuit 711 includes AND gates 511 to 514, 521 to 524, and 531 to 534.

The AND gates 511 to 514 are designed to generate clock signals on the basis of the inputs from the data clock terminal Dc and the scan clock terminal Sc. If a scan mode terminal Sm is in an H state, a data clock is supplied to the AND gate 521. If the scan mode terminal Sm is in an L state, a scan clock is supplied to the AND gate 522. In addition, the AND gate 514 supplies the inverted signal SBck of the data clock or scan clock to the AND gate 531. That is, the AND gate 514 is an example of transfer trigger signal supply means described in the claims.

The AND gates 521 to 524 are designed to be equivalent to flip-flop master-side latches. If the data clock or the scan clock is in an H state, the data from the data input terminal Di of the scan data from the scan input terminal Sin is captured. If the data clock or the scan clock is in an L state, the output Bi of the AND gate 524 is held.

The AND gates 531 to 534 are designed to be equivalent to flip-flop slave-side latches. The AND gate 531 captures the output Bi of the AND gate 524 for a period during which the clock SBck from the AND gate 514 is in an H state. The AND gate 532 captures the output Sout of the AND gate 534 for a period during which the inverted signal of the clock SBck from the AND gate 514 is in an H state. The output of the AND gate 533 is connected to the data output terminal Dt. The output of the AND gate 534 is connected to the scan output terminal Sout. In this regard, here, the data output terminal Dt and the scan output terminal Sout exhibit the same value.

Figure 29:
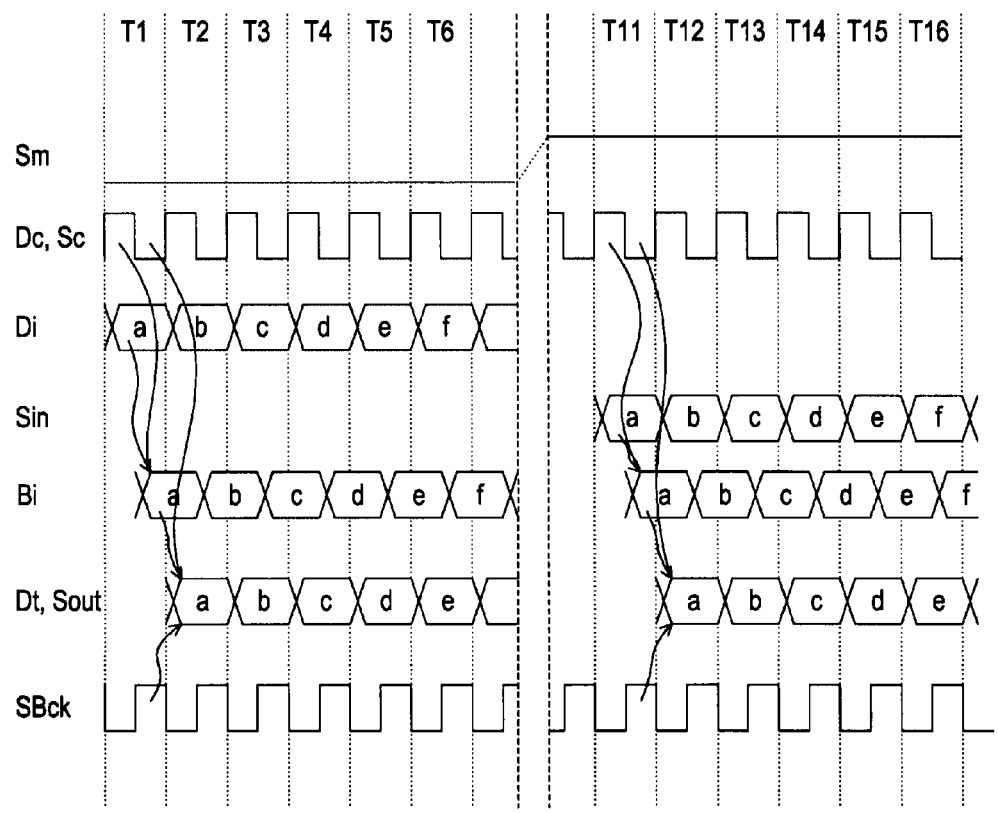
FIG. 29 is a diagram illustrating an example of the operation timing of the flip-flop circuit 711 in the embodiment of the present invention.

FIG. 29 is a diagram illustrating an example of the operation timing of the flip-flop circuit 711 in the embodiment of the present invention.

First, it is envisaged that a period from time T1 to T6 is a period during which the value of the scan mode terminal Sm is in an L state, that is, a normal data shift mode. At this time, the input signal from the data input terminal Di is input in accordance with a clock of the data clock terminal Dc. For example, a signal "a" input at time T1 is captured by the master-side latch in the first half of time T1, and is captured by the slave-side latch in the second half of time T1.

On the other hand, it is envisaged that a period from time T11 to T16 is a period during which the value of the scan mode terminal Sm is in an H state, that is, a scan mode. At this time, the scan input signal from the scan input terminal Sin is input in accordance with a clock of the scan clock terminal DSc. For example, a signal "a" input at time T11 is captured by the master-side latch in the first half of time T11, and is captured by the slave-side latch in the second half of time T11.

Here, the relationship between the input terminals (Di, Sin) and the output terminals (Dt, Sout) in each of the states (Sm, Dc, DSc) of the inputs has been explained using a logic gate representation to help understand it in terms of a logic circuit. In this regard, an actual circuit can be implemented by a logically equivalent circuit that performs the so-called flip-flop operation (a circuit that performs the operation of FIG. 29) such as a tri-state buffer type, TTL, MOS, or other transistor combined circuit. Note that also in the following figures, similarly to FIG. 26 or 27, indications of the scan mode terminal Sm, the data clock terminal Dc, the scan clock terminal Sc, etc., are omitted to avoid confusion. In addition, the scan mode terminal Sm, the data clock terminal Dc, the scan clock terminal Sc, etc., may not necessarily be distributed within an LSI on a one-input-to-one-block basis, and the distribution that allows a logically equivalent operation can be applied in a similar manner.

Figure 30:
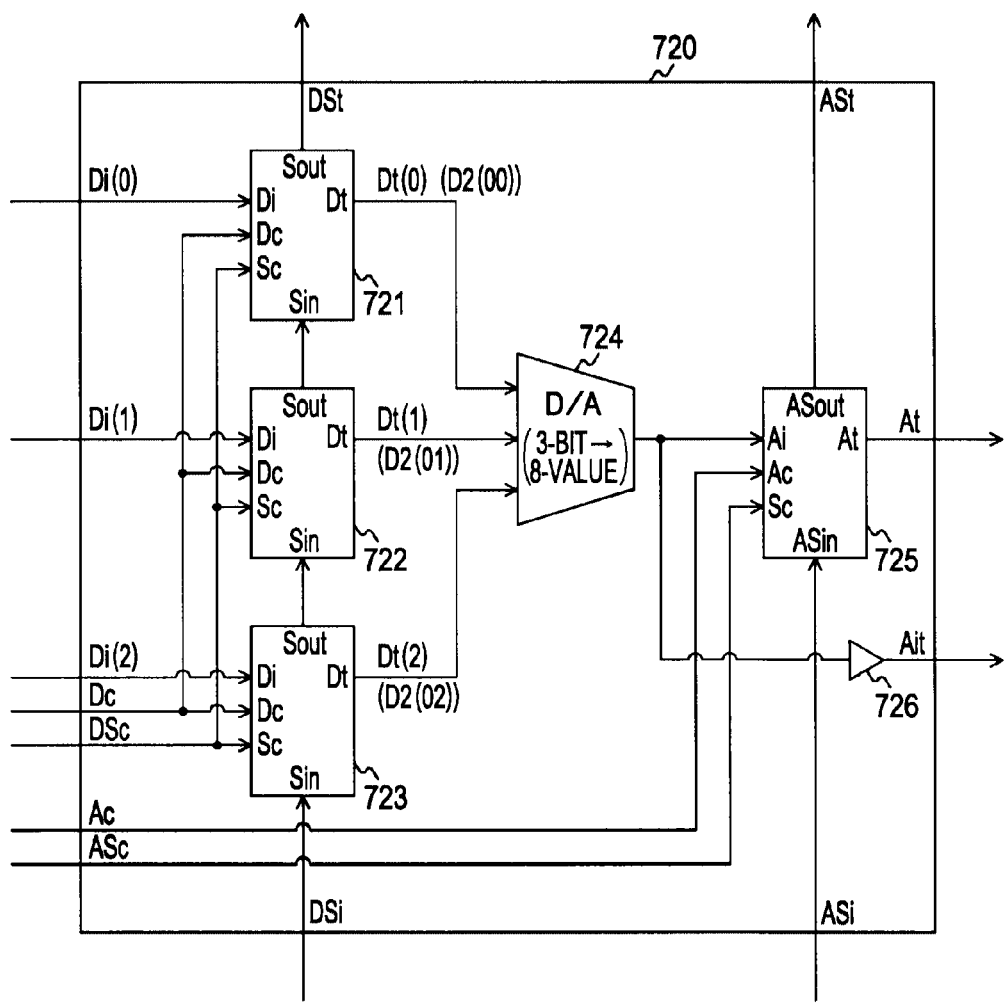
FIG. 30 is a diagram illustrating an example configuration of an analog conversion circuit 720 in the embodiment of the present invention.

FIG. 30 is a diagram illustrating an example configuration of the analog conversion circuit 720 in the embodiment of the present invention. This analog conversion circuit 720 includes flip-flop circuits 721 to 723, a D/A (Digital to Analog) conversion circuit 724, and an analog flip-flop 725.

The flip-flop circuits 721 to 723 are circuits that hold and output input digital signals, and are designed to include a configuration similar to that of the flip-flop circuit 711 explained with reference to FIG. 28. A data input terminal Di(0) of the analog conversion circuit 720 is connected to a data input terminal Di of the flip-flop circuit 721. A data input terminal Di(1) of the analog conversion circuit 720 is connected to a data input terminal Di of the flip-flop circuit 722. A data input terminal Di(2) of the analog conversion circuit 720 is connected to a data input terminal Di of the flip-flop circuit 723. Note that the data output terminals Dt(0) to Dt(2) of the shift circuit 710 are connected to the data input terminals Di(0) to Di(2) of the analog conversion circuit 720 using signal lines D1S(00) to D1S(02), respectively.

A scan input terminal DSi of the analog conversion circuit 720 is connected to a scan input terminal Sin of the flip-flop circuit 723 in the first stage. A scan output terminal Sout of the flip-flop circuit 723 in the first stage is connected to a scan input terminal Sin of the flip-flop circuit 722 in the second stage. A scan output terminal Sout of the flip-flop circuit 722 in the second stage is connected to a scan input terminal Sin of the flip-flop circuit 721 in the third stage. A scan output terminal Sout of the flip-flop circuit 721 in the third stage is connected to a scan output terminal DSt of the analog conversion circuit 720.

Data clock terminals Dc of the flip-flop circuits 721 to 723 are connected to a data clock terminal Dc of the analog conversion circuit 720. In addition, scan clock terminal Sc of the flip-flop circuits 721 to 723 are connected to a scan clock terminal DSc of the analog conversion circuit 720.

Note that the signals from respective data output terminals Dt of the flip-flop circuits 721 to 723 are supplied to the D/A conversion circuit 724 via signal lines Dt(0) to Dt(2). The data of these signal lines Dt(0) to Dt(2) are referred to as D2(0) to D2(2) in a timing chart described below.

The D/A conversion circuit 724 is designed to convert a total of three bits from each of the data output terminals Dt of the flip-flop circuits 721 to 723 into an 8-value analog signal and to output the analog signals as a single signal line. The output of this D/A conversion circuit 724 is supplied to the analog flip-flop 725 and is also supplied to an analog signal observation terminal Ait via an amplifier 726.

The analog flip-flop 725 is a flip-flop that holds an analog value supplied to from the D/A conversion circuit 724. The basic configuration is similar to that explained with reference to FIG. 24. A data input terminal Ai of the analog flip-flop 725 is connected to an output terminal of the D/A conversion circuit 724. A data output terminal At of the analog flip-flop 725 is connected to a data output terminal At of the analog conversion circuit 720. A scan input terminal ASin of the analog flip-flop 725 is connected to a scan input terminal ASi of the analog conversion circuit 720. A scan output terminal ASout of the analog flip-flop 725 is connected to a scan output terminal ASt of the analog conversion circuit 720.

A data clock terminal Ac of the analog flip-flop 725 is connected to an analog data clock terminal Ac of the analog conversion circuit 720. In addition, a scan clock terminal Sc of the analog flip-flop 725 is connected to an analog scan clock terminal ASc of the analog conversion circuit 720. In accordance with a clock of the data clock terminal Ac, the analog flip-flop 725 holds the data signal from the data input terminal Ai and outputs the data signal to the data output terminal At. In addition, in accordance with a clock of the scan clock terminal Sc, the analog flip-flop 725 holds the scan data signal from the scan input terminal ASin and outputs the scan data signal to the scan output terminal ASout.

In the analog flip-flop 725, a clock SBck is generated using a configuration similar to that of the AND gates 511 to 514 of the flip-flop circuit 711 from clocks input from the analog data clock terminal Ac and the analog scan clock terminal ASc. The write clock Wck can employ the same signal as the SBck. In addition, the load clock Lck can employ the inverted signal of the SBck.

The analog signal output from the analog conversion circuit 720 in this way is transferred from the LSI-A 701 to the LSI-B 702.

Figure 31:
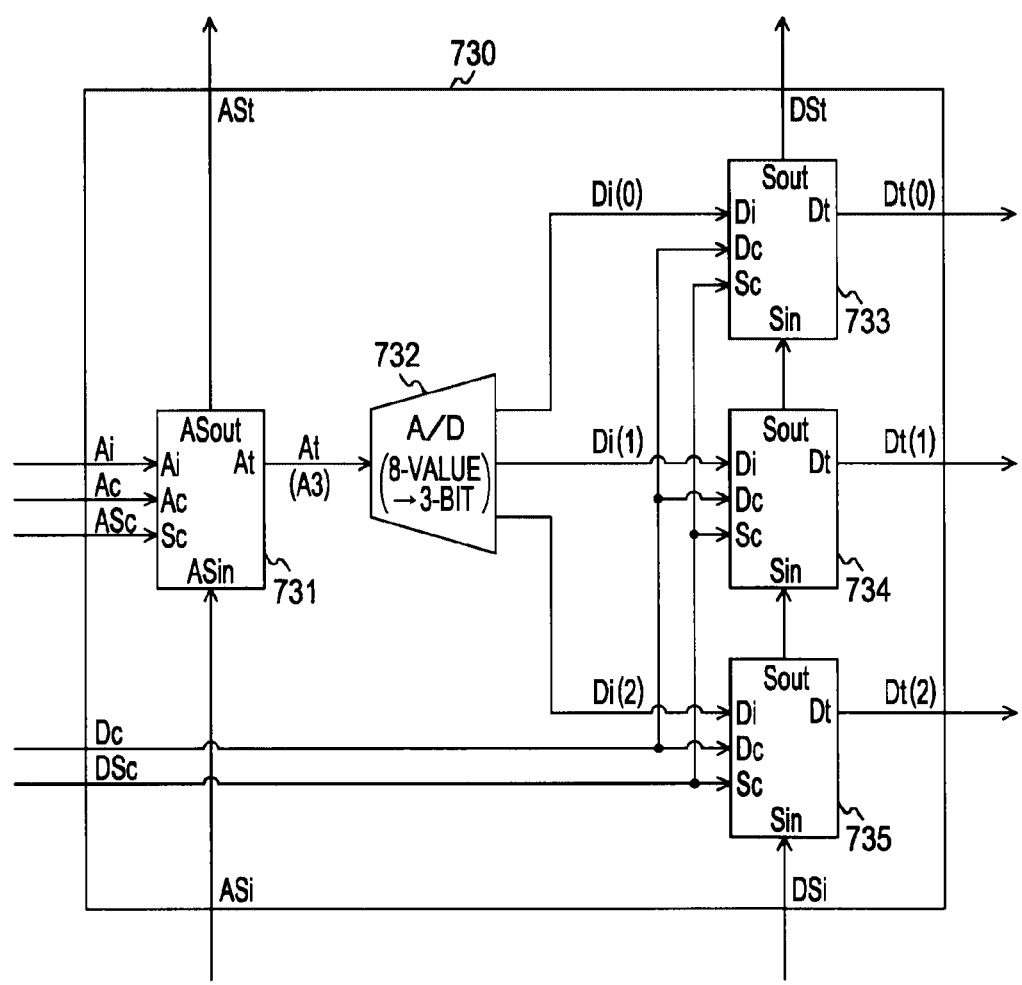
FIG. 31 is a diagram illustrating an example configuration of a digital conversion circuit 730 in the embodiment of the present invention.

FIG. 31 is a diagram illustrating an example configuration of the digital conversion circuit 730 in the embodiment of the present invention. This digital conversion circuit 730 includes an analog flip-flop 731, an A/D (Analog to Digital) conversion circuit 732, and flip-flop circuits 733 to 735.

The analog flip-flop 731 is a flip-flop that holds an analog value supplied from the LSI-A 701. The basic configuration is similar to that of the analog flip-flop 725. A data input terminal Ai of the analog flip-flop 731 is connected to a data input terminal Ai of the digital conversion circuit 730. A data output terminal At of the analog flip-flop 731 is connected to an input terminal of the A/D conversion circuit 732. A scan input terminal ASin of the analog flip-flop 731 is connected to a scan input terminal ASi of the digital conversion circuit 730. A scan output terminal ASout of the analog flip-flop 731 is connected to a scan output terminal ASt of the digital conversion circuit 730.

A data clock terminal Ac of the analog flip-flop 731 is connected to an analog data clock terminal Ac of the digital conversion circuit 730. In addition, a scan clock terminal Sc of the analog flip-flop 731 is connected to an analog scan clock terminal ASc of the digital conversion circuit 730. In accordance with a clock of the data clock terminal Ac, the analog flip-flop 731 holds the data signal from the data input terminal Ai and outputs the data signal to the data output terminal At. The data output from the data output terminal of this analog flip-flop 731 is referred to as A3 in the timing chart described below. In addition, in accordance with a clock of the scan clock terminal Sc, the analog flip-flop 731 holds the scan data signal from the scan input terminal ASin and outputs the scan data signal to the scan output terminal ASout.

The A/D conversion circuit 732 is designed to quantize the analog signal output from the analog flip-flop 731 to convert the result into a 3-bit digital signal. Output terminals Di(0) to Di(2) of this A/D conversion circuit 732 are supplied to the flip-flop circuits 733 to 735, respectively, one by one.

The flip-flop circuits 733 to 735 are circuits that hold and output input digital signals, and are designed to include a configuration similar to that of the flip-flop circuit 711 explained with reference to FIG. 28. The output terminal Di(0) of the A/D conversion circuit 732 is connected to a data input terminal Di of the flip-flop circuit 733. The output terminal Di(1) of the A/D conversion circuit 732 is connected to a data input terminal Di of the flip-flop circuit 734. The output terminal Di(2) of the A/D conversion circuit 732 is connected to a data input terminal Di of the flip-flop circuit 735. Data output terminals Dt of the flip-flop circuits 733 to 735 are connected to data output terminals Dt(0) to Dt(2) of the digital conversion circuit 730, respectively.

A scan input terminal DSi of the digital conversion circuit 730 is connected to a scan input terminal Sin of the flip-flop circuit 735 in the first stage. A scan output terminal Sout of the flip-flop circuit 735 in the first stage is connected to a scan input terminal Sin of the flip-flop circuit 734 in the second stage. A scan output terminal Sout of the flip-flop circuit 734 in the second stage is connected to a scan input terminal Sin of the flip-flop circuit 733 in the third stage. A scan output terminal Sout of the flip-flop circuit 733 in the third stage is connected to a scan output terminal DSt of the digital conversion circuit 730.

Data clock terminals Dc of the flip-flop circuits 733 to 735 are connected to a data clock terminal Dc of the digital conversion circuit 730. In addition, scan clock terminals Sc of the flip-flop circuits 733 to 735 are connected to a scan clock terminal DSc of the digital conversion circuit 730.

Figure 32:
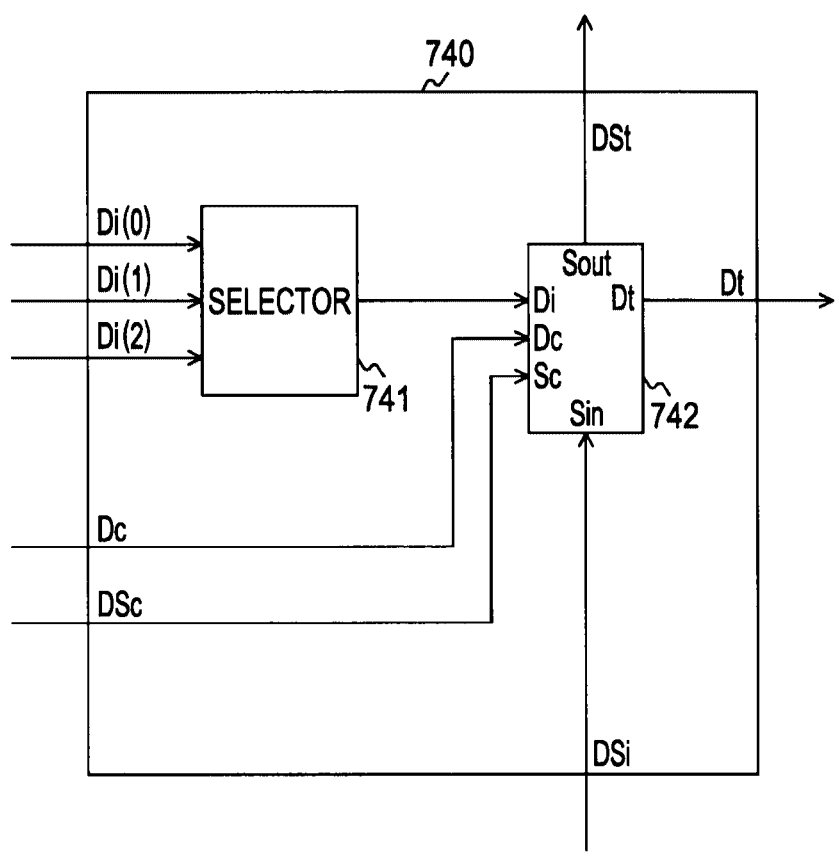
FIG. 32 is a diagram illustrating an example configuration of a selection circuit 740 in the embodiment of the present invention.

FIG. 32 is a diagram illustrating an example configuration of the selection circuit 740 in the embodiment of the present invention. This selection circuit 740 includes a selector 741 and a flip-flop circuit 742.

The selector 741 is designed to select the signals input from data input terminals Di(0) to Di(2) of the selection circuit 740 in sequence. With this selector 741, the signals input from the data input terminals Di(0) to Di(2) are supplied to the flip-flop circuit 742 clock by clock.

The flip-flop circuit 742 is a circuit that holds and outputs an input digital signal, and is designed to include a configuration similar to that of the flip-flop circuit 711 explained with reference to FIG. 28.

An output terminal of the selector 741 is connected to a data input terminal Di of the flip-flop circuit 742. A data output terminal Dt of the flip-flop circuit 742 is connected to a data output terminal Dt of the selection circuit 740. A scan input terminal DSi of the selection circuit 740 is connected to a scan input terminal Sin of the flip-flop circuit 742. A scan output terminal Sout of the flip-flop circuit 742 is connected to a scan output terminal DSt of the selection circuit 740. A data clock terminal Dc of the flip-flop circuit 742 is connected to a data clock terminal Dc of the selection circuit 740. In addition, a scan clock terminal Sc of the flip-flop circuit 742 is connected to a scan clock terminal DSc of the selection circuit 740.

Figure 33:
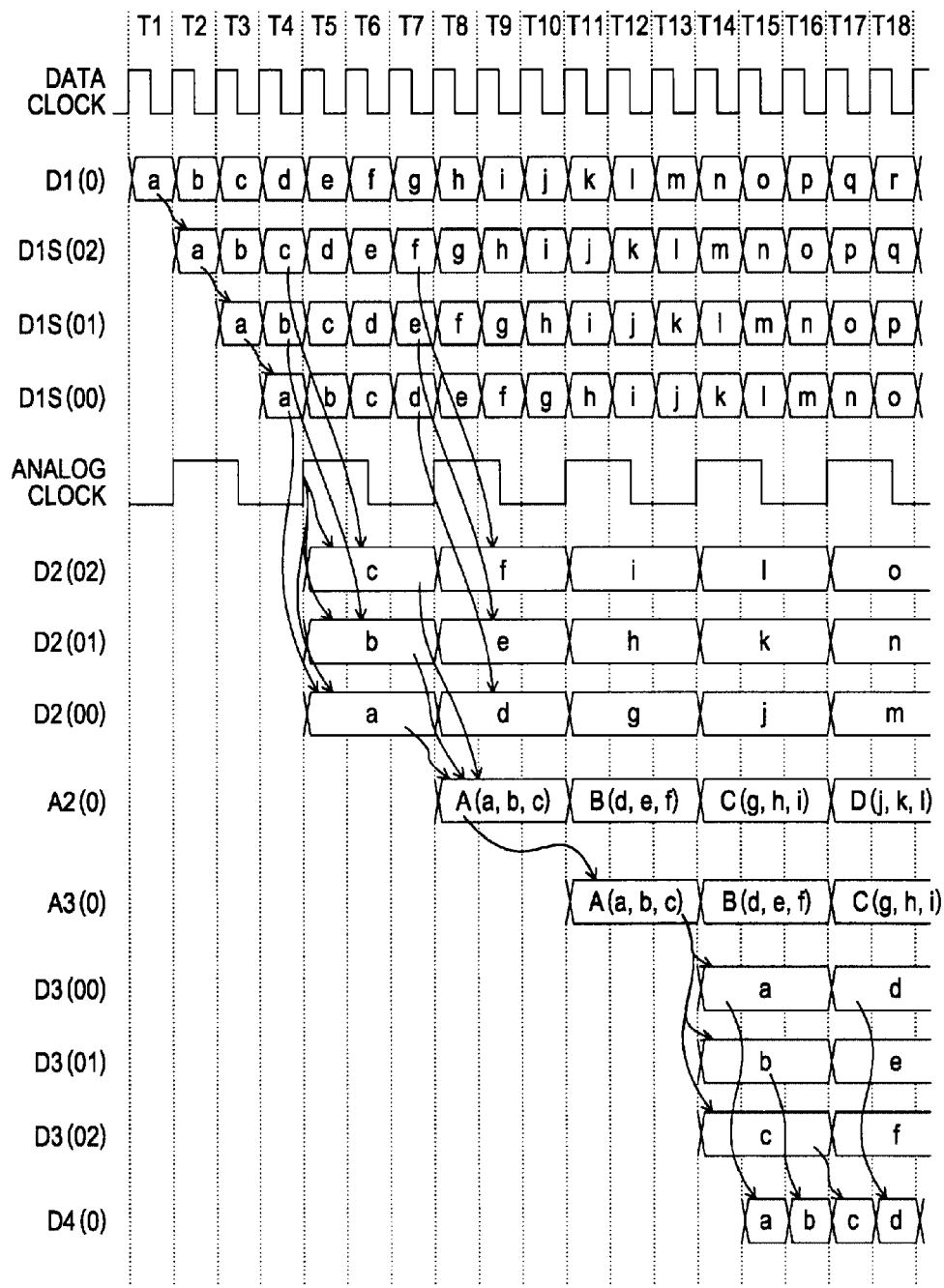
FIG. 33 is a diagram illustrating an example timing chart of inter-LSI transfer (FIG. 26) using an analog scan circuit in the embodiment of the present invention.

FIG. 33 is a diagram illustrating an example timing chart of inter-LSI transfer (FIG. 26) using an analog scan circuit in an embodiment of the present invention. In this example, an example is illustrated in which the ratio of the speed of an internal clock for handling digital signals to the speed of a clock for transferring analog signals is set to 3:1. That is, the speed of the clock for transferring analog signals is equal to one third the speed (three times the period) of the clock for handling digital signals.

Data signals are input to the data input terminal D1(0) of the shift circuit 710-0 on a data-clock-by-data-clock basis in such a way that a signal "a" is input at time T1, a signal "b" is input at time T2, and a signal "c" is input at time T3. Respective pieces of data are shifted by the flip-flop circuits 711 to 713 provided in the shift circuit 710-0 (see FIG. 27). For example, the signal "a" is sequentially output to the signal line D1S(02) at time T2, to the signal line D1S(01) at time T3, and to the signal line D1S(00) at time T4. Similarly, each of the signals "b" and "c" is also sequentially output with a delay of one data clock.

In the analog conversion circuit 720-0, an analog clock is applied to the data clock terminals Dc of the flip-flop circuits 721 to 723, thus allowing the signals "a" to "c" to be output at time T5 from the flip-flop circuits 721 to 723 (see FIG. 30). Note that since the same signal as that of the analog data clock terminal Ac is distributed to the data clock terminal Dc of the analog conversion circuit 720, these signals may be shared by one terminal and a signal from the same input terminal may be distributed inside it. The signals "a" to "c" (D2(00) to D2(02)) are converted into an analog signal "A" by the D/A conversion circuit 724 which is output using the signal line 709-0 from time T8. This signal line 709-0 has a data width that enables multi-valued representation because of the use of analog values, despite the signal line 709-0 being a single line. In this example, the 3-bit signals "a" to "c" are transmitted using a single analog signal line (A2(0)).

In the digital conversion circuit 730-0, an analog clock is applied to the analog flip-flop 731 (see FIG. 31), thus allowing the analog signal from the analog conversion circuit 720-0 to be held in the analog flip-flop 731 and output from time T11 (A3(0)). This analog signal "A" is converted into digital signals "a" to "c" by the A/D conversion circuit 732, which are held in the flip-flop circuits 733 to 735 and are output from time T14 (D3(00) to D3(02)). An analog clock is also applied to these flip-flop circuits 733 to 735. Here, since the same signal as that of the analog data clock terminal Ac is distributed to the data clock terminal Dc, also in the digital conversion circuit 730, similarly to the analog conversion circuit 720, these signals may be shared by one terminal and a signal from the same input terminal may be distributed inside it.

In the selection circuit 740-0, a data clock is applied to the flip-flop circuit 742 (see FIG. 32), thus allowing data signals to be output on a data-clock-by-data-clock basis (D4(0)). In this example, the signal "a" is output at time T15, the signal "b" is output at time T16, and the signal "c" is output at time T17.

In this example, the three digital signals D2(00) to D2(02) synchronous to an analog clock are transferred using the signal line 709-0 as a single analog signal A2(0) that is also synchronous to the analog clock. That is, according to an embodiment of the present invention, at the same clock speed, the number of signal lines necessary for data transfer can be reduced.

In addition, in this example, transfer is performed between the LSI-A 701 and the LSI-B 702 at a speed that is one third that of the clock of the internal data (D1(0) and D4(0)) of the LSI-A 701 and the LSI-B 702 (A2(0) and A3(0)). Taking a digital data clock as 1 T as a reference, here, transfer with a throughput of 3 T and a turnaround time of 3 T is performed. That is, according to an embodiment of the present invention, data transfer can be performed at a speed lower than the original clock speed. Thus, it is possible to increase the reliability of data transfer. In addition, since no flip-flops are required midway, it is possible to provide a flexible circuit arrangement and is also possible to reduce circuit size.

Note that, here, an example of simple transfer of analog values with a throughput of 3 T and a turnaround time of 3 T has been explained; however, another analog circuit can be provided between the analog conversion circuit 720 and the digital conversion circuit 730 within a range that is within 3 T and that is a range where the processing is possible. For example, as illustrated in FIG. 34(a), an analog circuit 751 may be provided between the LSI-A 701 and the LSI-B 702. In addition, as illustrated in FIG. 34(b), an analog circuit 752 may be provided inside the LSI-A 701. In addition, as illustrated in FIG. 34(c), an analog circuit 753 may be provided inside the LSI-B 702. These are secondary effects caused by no flip-flops being required midway due to low-speed data transfer as described above.

Next, an example of an implementation of analog and digital mixed scan paths using an analog scan circuit in an embodiment of the present invention will be explained.

Figure 35:
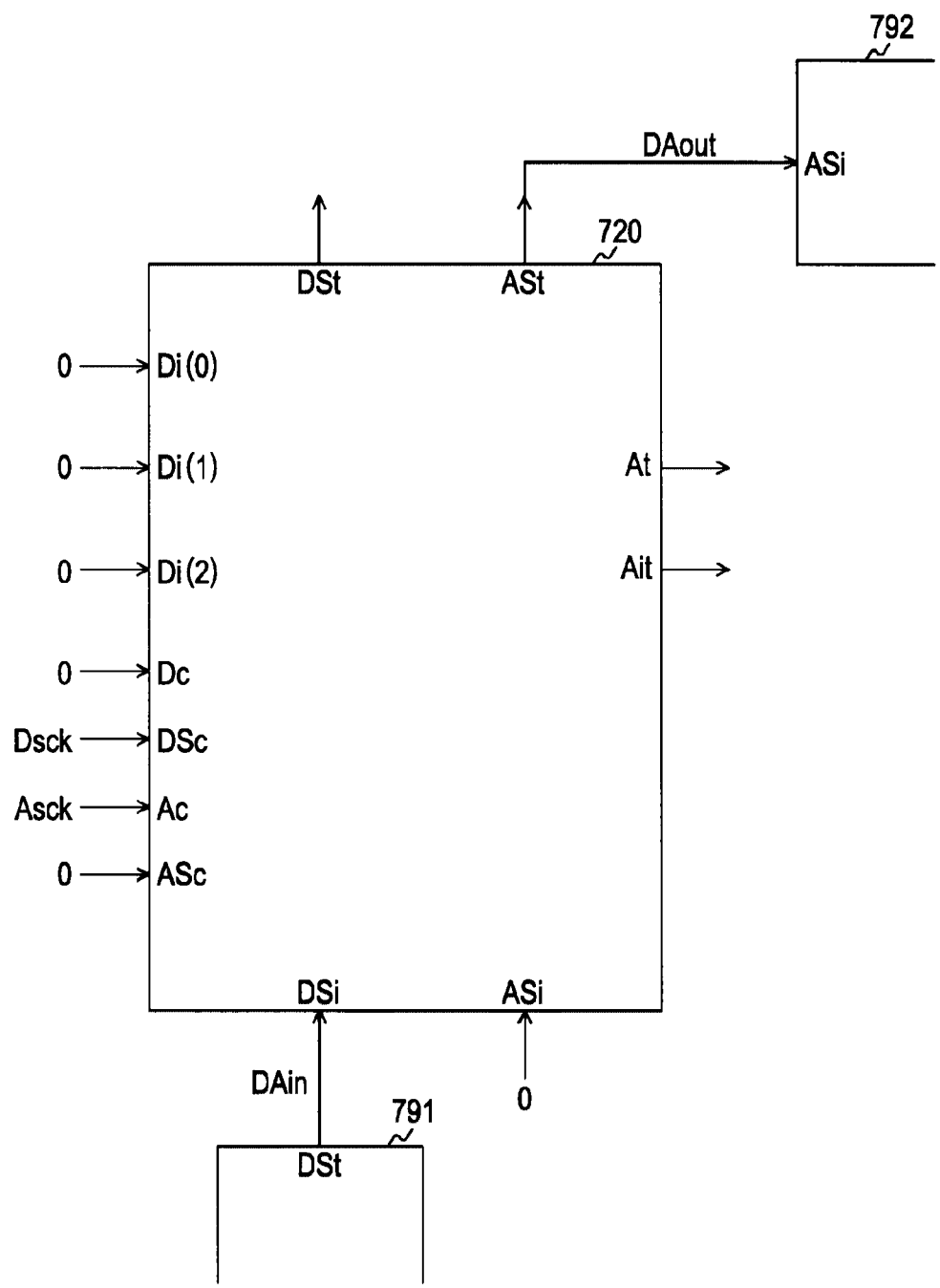
FIG. 35 is a diagram illustrating an example implementation of a scan-path D/A converter in the embodiment of the present invention.

FIG. 35 is a diagram illustrating an example implementation of a scan-path D/A converter in an embodiment of the present invention. Here, it is envisaged that a scan output terminal DSt of a digital circuit 791 is connected to a scan input terminal ASi of an analog circuit 792 using the analog conversion circuit 720 explained with reference to FIG. 30.

The scan output terminal DSt of the digital circuit 791 is connected to the scan input terminal DSi of the analog conversion circuit 720 via a signal line DAin. The scan input terminal ASi of the analog circuit 792 is connected to the scan output terminal ASt of the analog conversion circuit 720 via a signal line DAout. Since no other data input/output terminals and scan input/output terminals are used, the respective inputs are set to "0".

In addition, the data clock terminal Dc of the analog conversion circuit 720 is set to "0". An internal-data data clock Dsck is input to the scan clock terminal DSc of the analog conversion circuit 720. An analog-signal analog clock Asck is input to the analog clock terminal Ac of the analog conversion circuit 720. The analog scan clock terminal Asc of the analog conversion circuit 720 is set to "0".

Figure 36:
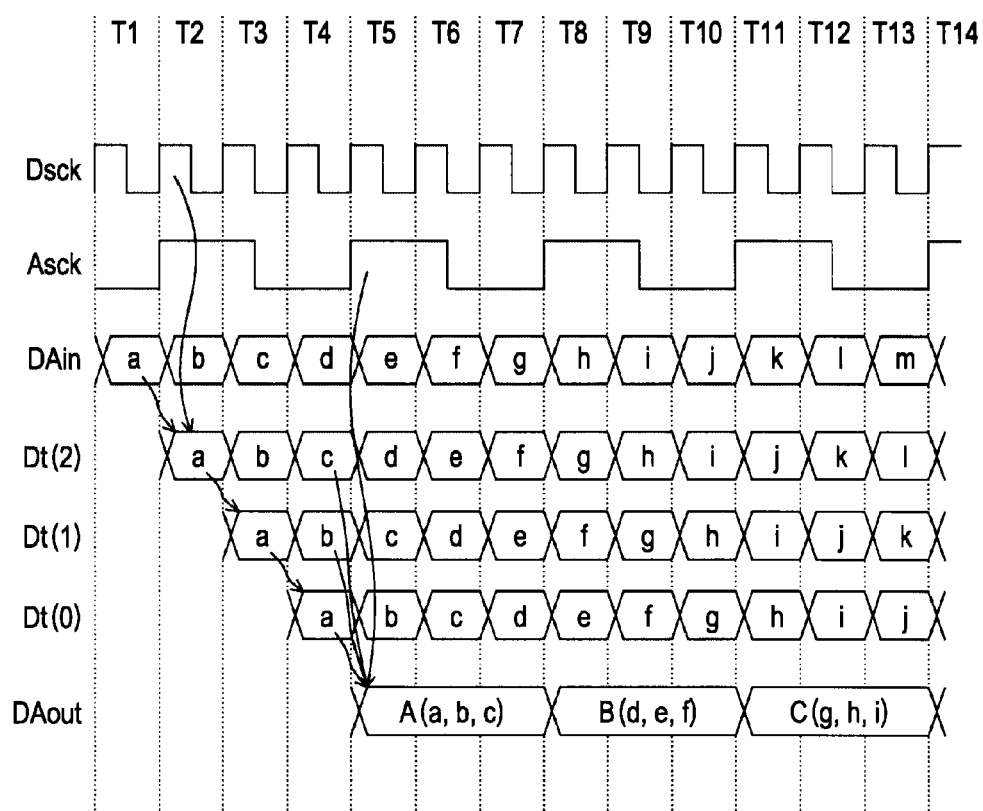
FIG. 36 is a diagram illustrating an example timing chart of the scan-path D/A converter in the embodiment of the present invention.

FIG. 36 is a diagram illustrating an example timing chart of a scan-path D/A converter in an embodiment of the present invention.

A signal "a" input from the digital circuit 791 via the signal line DAin at time T1 is held in the flip-flop circuit 723 of the analog conversion circuit 720 in synchronization with a data clock Dsck. The signal "a" is output from the flip-flop circuit 723 at time T2, and is held in the flip-flop circuit 722. Then, the signal "a" is output from the flip-flop circuit 722 at time T3, held in the flip-flop circuit 721, and output from the flip-flop circuit 721 at time T4. Similarly, each of the signals "b" and "c" is also sequentially output with a delay of one data clock.

At time T4, the signals "a" to "c" are converted into an analog signal "A" in the D/A conversion circuit 724. Then, at time T5, the analog signal "A" is output from the analog flip-flop 725 in synchronization with an analog clock Asck.

In this manner, with the use of the analog conversion circuit 720, it is possible to convert a scan signal of a digital signal into a scan signal of an analog signal. Thus, it is possible to mix a digital signal and an analog signal in a single scan path.

Note that in this example, an example in which the scan output terminal ASt of the analog conversion circuit 720 is connected to the scan input terminal ASi of the analog circuit 792 has been explained; however, similar results can also be obtained by connecting the data output terminal At of the analog conversion circuit 720. In addition, as illustrated below, similar results can also be obtained by connecting the analog signal observation terminal Ait of the analog conversion circuit 720 to the scan input terminal ASi of the analog conversion circuit 720.

Figure 37:
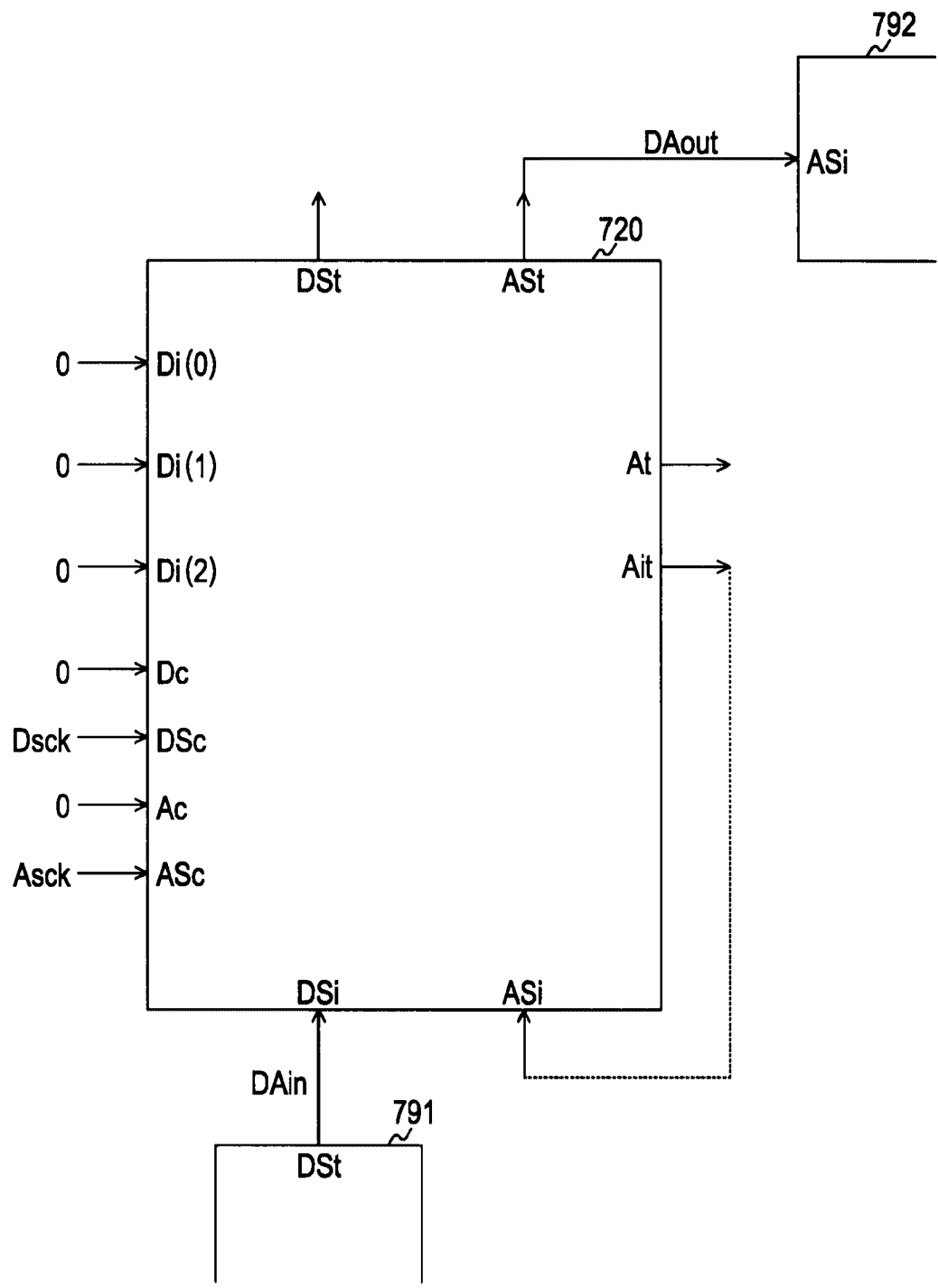
FIG. 37 is a diagram illustrating another example implementation of the scan-path D/A converter in the embodiment of the present invention.

FIG. 37 is a diagram illustrating another example implementation of a scan-path D/A converter in an embodiment of the present invention. In this example, unlike FIG. 35, the analog signal observation terminal Ait is connected to the scan input terminal ASi of the analog conversion circuit 720. In addition, the analog clock terminal Ac of the analog conversion circuit 720 is set to "0", and the analog-signal analog clock Asck is input to the analog scan clock terminal ASc. In this manner, a feedback of the output of the analog signal observation terminal Ait enables direct input to the scan path of the analog flip-flop 725 of the analog conversion circuit 720.

Figure 38:
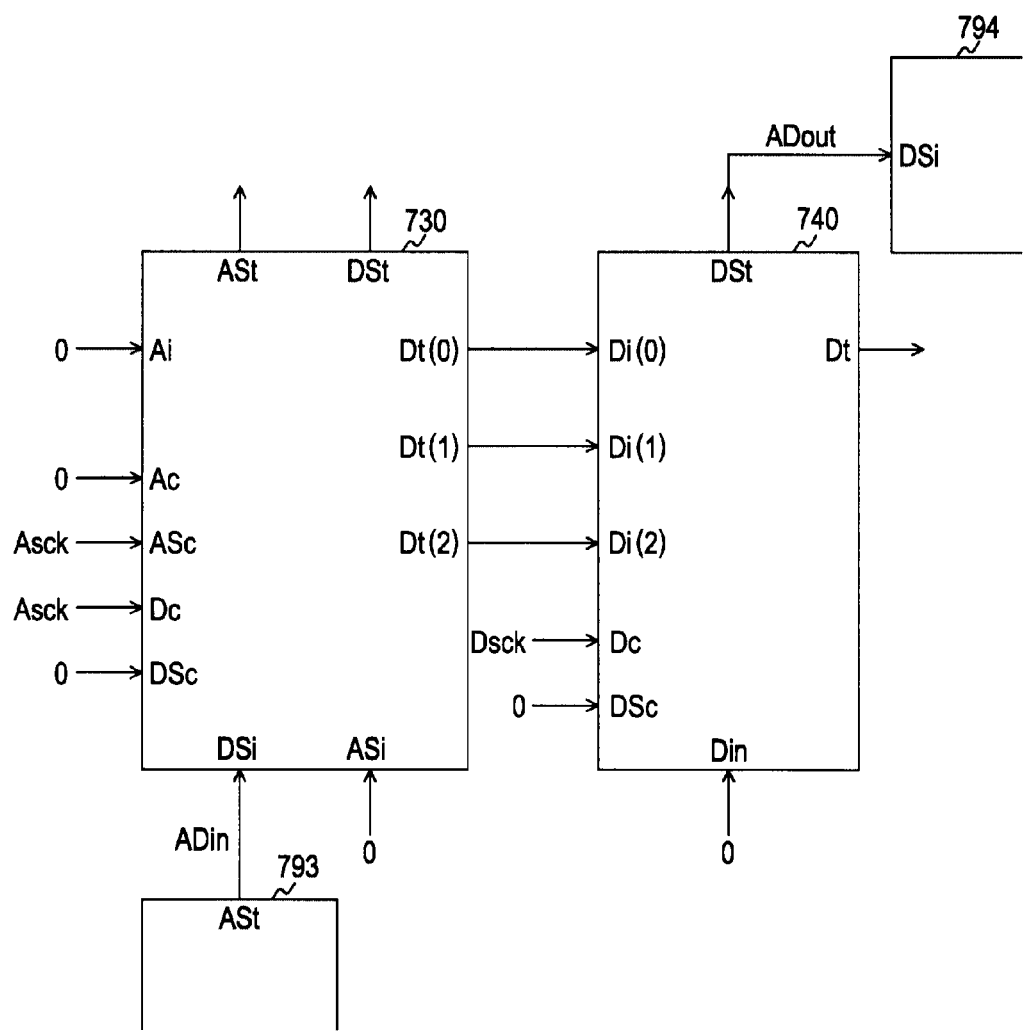
FIG. 38 is a diagram illustrating an example implementation of the scan-path A/D converter in the embodiment of the present invention.

FIG. 38 is a diagram illustrating an example implementation of a scan-path A/D converter in an embodiment of the present invention. Here, it is envisaged that a scan output terminal ASt of an analog circuit 793 is connected to a scan input terminal DSi of a digital circuit 794 using the digital conversion circuit 730 explained with reference to FIG. 31 and the selection circuit 740 explained with reference to FIG. 32.

The scan output terminal ASt of the analog circuit 793 is connected to the scan input terminal DSi of the digital conversion circuit 730 via a signal line ADin. The scan input terminal DSi of the digital circuit 794 is connected to the scan output terminal DSt of the selection circuit 740 via a signal line ADout. The data output terminals Dt(0) to Dt(2) of the digital conversion circuit 730 are connected to the data input terminals Di(0) to Di(2) of the selection circuit 740. Since no other data input/output terminals and scan input/output terminals are used, the respective inputs are set to "0".

In addition, the analog clock terminal Ac and scan clock terminal DSc of the digital conversion circuit 730 are set to "0". An analog-signal analog clock Asck is input to the analog scan clock terminal ASc and data clock terminal Dc of the digital conversion circuit 730. An internal-data data clock Dsck is input to the data clock terminal Dc of the selection circuit 740. The scan clock terminal DSc of the selection circuit 740 is set to "0".

Figure 39:
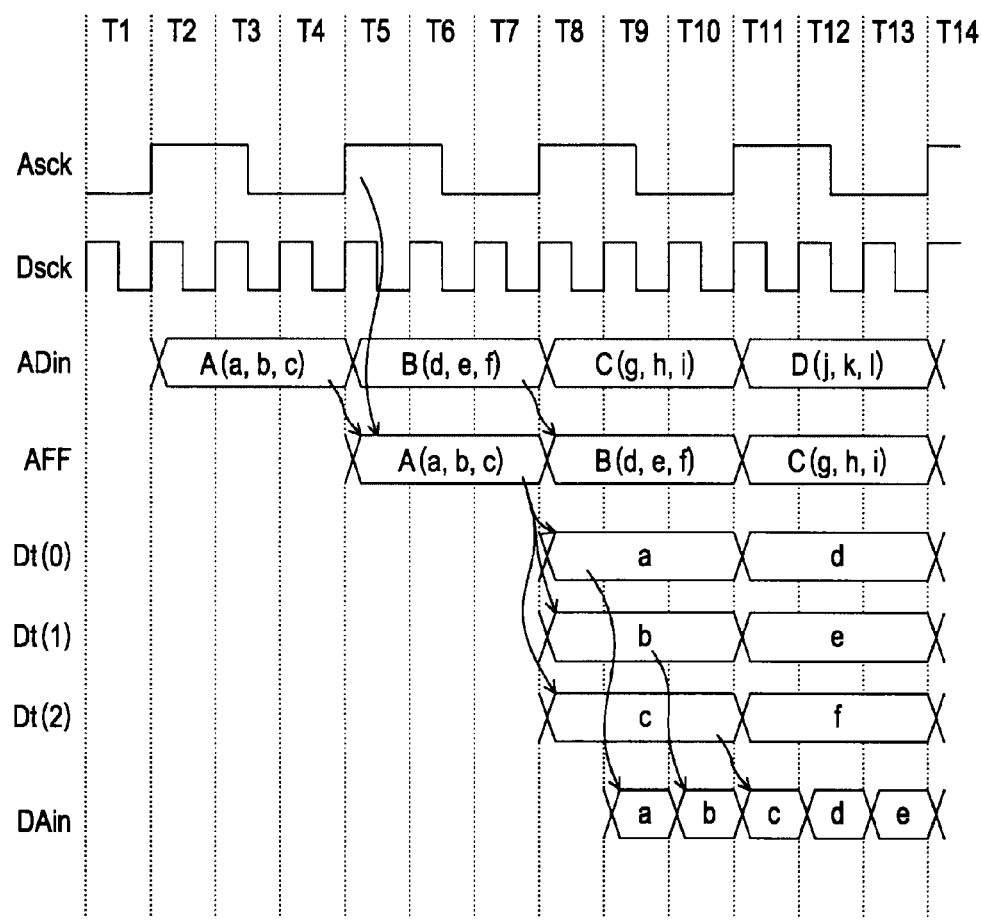
FIG. 39 is a diagram illustrating an example timing chart of the scan-path A/D converter in the embodiment of the present invention.

FIG. 39 is a diagram illustrating an example timing chart of a scan-path A/D converter in an embodiment of the present invention.

An analog signal "A" input from the analog circuit 793 via the signal line ADin at time T1 is held in the analog flip-flop 731 of the digital conversion circuit 730 in synchronization with an analog clock Asck. This analog signal "A" represents an analog value of a signal formed of digital signals "a" to "c". The analog flip-flop 731 outputs the analog signal "A" from time T5.

The analog signal "A" is converted into digital signals "a" to "c" using the A/D conversion circuit 732 of the digital conversion circuit 730, which are held in the flip-flop circuits 733 to 735. The flip-flop circuits 733 to 735 output the digital signals "a" to "c", respectively, from time T8 in synchronization with an analog clock Asck.

The flip-flop circuit 742 of the selection circuit 740 sequentially holds the signals "a" to "c" in synchronization with the data clock Dsck. Thus, the signals "a" to "c" are sequentially output from time T9.

In this manner, with the use of the digital conversion circuit 730 and the selection circuit 740, it is possible to convert a scan signal of an analog signal into a scan signal of a digital signal. Thus, it is possible to mix a digital signal and an analog signal in a single scan path.

Note that the embodiments of the present invention illustrate examples for embodying the present invention and, as described above, have correspondence relationships with the inventive subject matter defined in the claims. In this regard, the present invention is not to be limited to the embodiments, and a variety of modifications can be made without departing from the scope of the present invention.

In addition, the process procedure explained in the embodiments of the present invention may also be regarded as a method having the above series of procedures, or may be regarded as a program for causing a computer to execute the series of procedures or as a recording medium storing this program. As this recording medium, for example, a CD (Compact Disc), an MD (MiniDisc), a DVD (Digital Versatile Disk), a memory card, a Blu-ray Disc (registered trademark), or the like can be used.

The invention claimed is:

1. An analog scan circuit comprising:
    a plurality of analog value holding means each for holding an analog value;
    input means for inputting the analog values to cause at least one of the plurality of analog value holding means to hold the analog value;
    transfer means for transferring the analog values held in the plurality of analog value holding means between the plurality of analog value holding means; and
    output means for reading and outputting at least one of the analog values held in the plurality of analog value holding means, wherein the output means simultaneously reads the analog values from the plurality of analog value holding means in accordance with a common output control signal.

2. The analog scan circuit according to claim 1, wherein the transfer means performs the transfer in accordance with a shift synchronization signal.

3. The analog scan circuit according to claim 2, wherein the input means causes at least one of the plurality of analog value holding means to hold the analog value in accordance with the shift synchronization signal.

4. The analog scan circuit according to claim 2, wherein the output means reads the analog values from the plurality of analog value holding means in accordance with the shift synchronization signal.

5. The analog scan circuit according to claim 1, wherein the input means causes a plurality of analog values to be simultaneously held in corresponding analog value holding means among the plurality of analog value holding means in accordance with a common input control signal.

6. The analog scan circuit according to claim 1, wherein the input means causes a plurality of analog values to be held in corresponding analog value holding means among the plurality of analog value holding means in accordance with individual input control signals each corresponding to one of the plurality of analog values.

7. The analog scan circuit according to claim 1, wherein the output means reads, in accordance with individual output control signals each corresponding to one of a plurality of analog values, the analog values from the plurality of analog value holding means.

8. The analog scan circuit according to claim 1, wherein the plurality of analog value holding means hold the analog values by accumulating electric charge in a diffusion layer region formed on a semiconductor substrate.

9. The analog scan circuit according to claim 1, wherein the plurality of analog value holding means hold the analog values by accumulating electric charge in a depletion layer region generated on a semiconductor substrate.

10. A data processing apparatus comprising an output circuit that outputs analog data, and an analog scan circuit that receives the analog data,
the analog scan circuit including
a plurality of analog value holding means each for holding an analog value,
input means for inputting an instantaneous value of the analog data to cause at least one of the plurality of analog value holding means to hold the instantaneous value as the analog value;
transfer means for transferring the analog values held in the plurality of analog value holding means between the plurality of analog value holding means, and
output means for reading and outputting at least one of the analog values held in the plurality of analog value holding means, wherein the output means simultaneously reads the analog values from the plurality of analog value holding means in accordance with a common output control signal.

11. A data processing apparatus comprising an analog scan circuit that supplies analog data, and an input circuit that receives and inputs the analog data,
the analog scan circuit including
a plurality of analog value holding means each for holding an analog value,
input means for inputting the analog values to cause at least one of the plurality of analog value holding means to hold the analog value,
transfer means for transferring the analog values held in the plurality of analog value holding means between the plurality of analog value holding means, and
output means for reading at least one of the analog values held in the plurality of analog value holding means, and outputting the read at least one of the analog values as the analog data, wherein the output means simultaneously reads the analog values from the plurality of analog value holding means in accordance with a common output control signal.

12. A data processing apparatus comprising an output circuit that outputs first analog data, an analog scan circuit that receives the first analog data and that supplies second analog data, and an input circuit that receives and inputs the second analog data,
the analog scan circuit including
a plurality of analog value holding means each for holding an analog value,
input means for inputting an instantaneous value of the first analog data to cause at least one of the plurality of analog value holding means to hold the instantaneous value as the analog value,
transfer means for transferring the analog values held in the plurality of analog value holding means between the plurality of analog value holding means, and
output means for reading at least one of the analog values held in the plurality of analog value holding means, and outputting the read at least one of the analog values as the second analog data, wherein the output means simultaneously reads the analog values from the plurality of analog value holding means in accordance with a common output control signal.

13. An analog flip-flop comprising:
input analog value holding means for holding an input analog value, the input analog value holding means includes input means for inputting the input analog value on the basis of an input trigger signal; and
output analog value holding means for transferring the input analog value held in the input analog value holding means on the basis of a transfer trigger signal, and holding the input analog value as an output analog value.

14. The analog flip-flop according to claim 13, wherein the input analog value indicates a value among m values (where m is an integer of n or more) including n discrete values (where n is an integer of 3 or more).

15. The analog flip-flop according to claim 13, wherein the input means includes
first input means for inputting a first analog value as the input analog value on the basis of a first trigger signal, and
second input means for inputting a second analog value as the input analog value on the basis of a second trigger signal.

16. The analog flip-flop according to claim 15, wherein one of the first and second trigger signals is an input trigger signal for instructing a scan operation.

17. The analog flip-flop according to claim 13, further comprising output means for outputting the output analog value held in the output analog value holding means on the basis of an output trigger signal.

18. The analog flip-flop according to claim 13, wherein at least one of the input analog value holding means and the output analog value holding means holds an analog value by accumulating electric charge in a diffusion layer region formed on a semiconductor substrate.

19. The analog flip-flop according to claim 13, wherein at least one of the input analog value holding means and the output analog value holding means holds an analog value by accumulating electric charge in a depletion layer region generated on a semiconductor substrate.

20. A data processing apparatus comprising a plurality of analog flip-flops each capable of receiving, holding, and outputting arbitrary analog data indicating an arbitrary analog value, and control means for controlling an operation timing of the plurality of analog flip-flops, each of the plurality of analog flip-flops including input analog value holding means for holding an input analog value, the input analog value holding means includes input means for inputting the input analog value on the basis of an input trigger signal, and output analog value holding means for receiving the input analog value held by the input analog value holding means on the basis of a transfer trigger signal, and holding the input analog value as an output analog value, the control means including transfer trigger signal supply means for supplying the same transfer trigger signal to the plurality of analog flip-flops.

21. An analog scan circuit comprising:

a plurality of analog value holding means each for holding an analog value;

a plurality of input means for inputting the analog values to cause at least one of the plurality of analog value holding means to hold the analog value;

transfer means for transferring the analog values held in the plurality of analog value holding means between the plurality of analog value holding means;

a plurality of controlled clock signal inputs, each connected to alternate analog value holding means and transferring the analog values between the analog value holding means;

an equalization initial voltage supplied to a single analog value holding means and transferred to other analog value holding means in response to a first value of the controlled clock signals; and a plurality of output means for reading and outputting at least one of the analog values held in the plurality of analog value holding means, wherein the output means simultaneously reads the analog values from the plurality of analog value holding means in accordance with a common output control signal.

* * * * *